(12) United States Patent
Tsai et al.

(10) Patent No.: US 11,004,730 B2
(45) Date of Patent: May 11, 2021

(54) METHODS OF FORMING CONDUCTIVE FEATURES USING A VACUUM ENVIRONMENT

(71) Applicant: Taiwan Semiconductor Manufacturing Company, Ltd., Hsinchu (TW)

(72) Inventors: Chia-Ching Tsai, Tainan (TW); Yi-Wei Chiu, Kaohsiung (TW); Hung Jui Chang, Shetou Shiang (TW); Li-Te Hsu, Shanhua Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/895,859

(22) Filed: Jun. 8, 2020

(65) Prior Publication Data

US 2020/0303245 A1   Sep. 24, 2020

Related U.S. Application Data

(63) Continuation of application No. 15/886,190, filed on Feb. 1, 2018, now Pat. No. 10,679,891.

(Continued)

(51) Int. Cl.
| | |
|---|---|
| *H01L 21/44* | (2006.01) |
| *H01L 21/768* | (2006.01) |
| *H01L 21/8238* | (2006.01) |
| *H01L 27/092* | (2006.01) |
| *H01L 29/78* | (2006.01) |

(Continued)

(52) U.S. Cl.
CPC .... *H01L 21/76807* (2013.01); *H01L 21/7684* (2013.01); *H01L 21/76811* (2013.01); *H01L 21/76813* (2013.01); *H01L 21/76816* (2013.01); *H01L 21/76832* (2013.01); *H01L 21/76843* (2013.01); *H01L 21/76873* (2013.01); *H01L 21/823821* (2013.01); *H01L 27/0924* (2013.01); *H01L 29/66545* (2013.01); *H01L 29/785* (2013.01); *H01L 29/7853* (2013.01); *H01L 21/76862* (2013.01); *H01L 23/5226* (2013.01);
(Continued)

(58) Field of Classification Search
CPC ............ H01L 21/76843; H01L 29/785; H01L 29/7853; H01L 29/66545; H01L 21/7684; H01L 21/76862; H01L 29/7848; H01L 23/5226; H01L 23/53238; H01L 21/44
See application file for complete search history.

(56) References Cited

U.S. PATENT DOCUMENTS

| | | | | |
|---|---|---|---|---|
| 5,081,064 A | * | 1/1992 | Inoue ................ | H01L 21/76855 438/625 |
| 5,716,869 A | * | 2/1998 | Hibino .............. | H01L 21/76804 257/E21.584 |

(Continued)

*Primary Examiner* — Caleb E Henry
(74) *Attorney, Agent, or Firm* — Slater Matsil, LLP

(57) ABSTRACT

An interconnect structure and a method of forming are provided. The method includes forming an opening in a dielectric layer and an etch stop layer, wherein the opening extends only partially through the etch stop layer. The method also includes creating a vacuum environment around the device. After creating the vacuum environment around the device, the method includes etching through the etch stop layer to extend the opening and expose a first conductive feature. The method also includes forming a second conductive feature in the opening.

20 Claims, 65 Drawing Sheets

Related U.S. Application Data

(60) Provisional application No. 62/527,557, filed on Jun. 30, 2017.

(51) Int. Cl.
*H01L 29/66* (2006.01)
*H01L 23/532* (2006.01)
*H01L 23/522* (2006.01)

(52) U.S. Cl.
CPC .... *H01L 23/53238* (2013.01); *H01L 29/7848* (2013.01)

(56) References Cited

U.S. PATENT DOCUMENTS

| | | | |
|---|---|---|---|
| 6,030,891 A * | 2/2000 | Tran | H01L 21/76814 438/623 |
| 6,200,735 B1 * | 3/2001 | Ikegami | H01L 21/31144 216/58 |
| 8,470,390 B2 | 6/2013 | Wang et al. | |
| 8,642,483 B2 * | 2/2014 | Honda | H01L 21/0337 438/737 |
| 2017/0133376 A1 * | 5/2017 | Glass | H01L 27/0886 |
| 2017/0278742 A1 * | 9/2017 | Chen | H01L 21/76816 |

\* cited by examiner

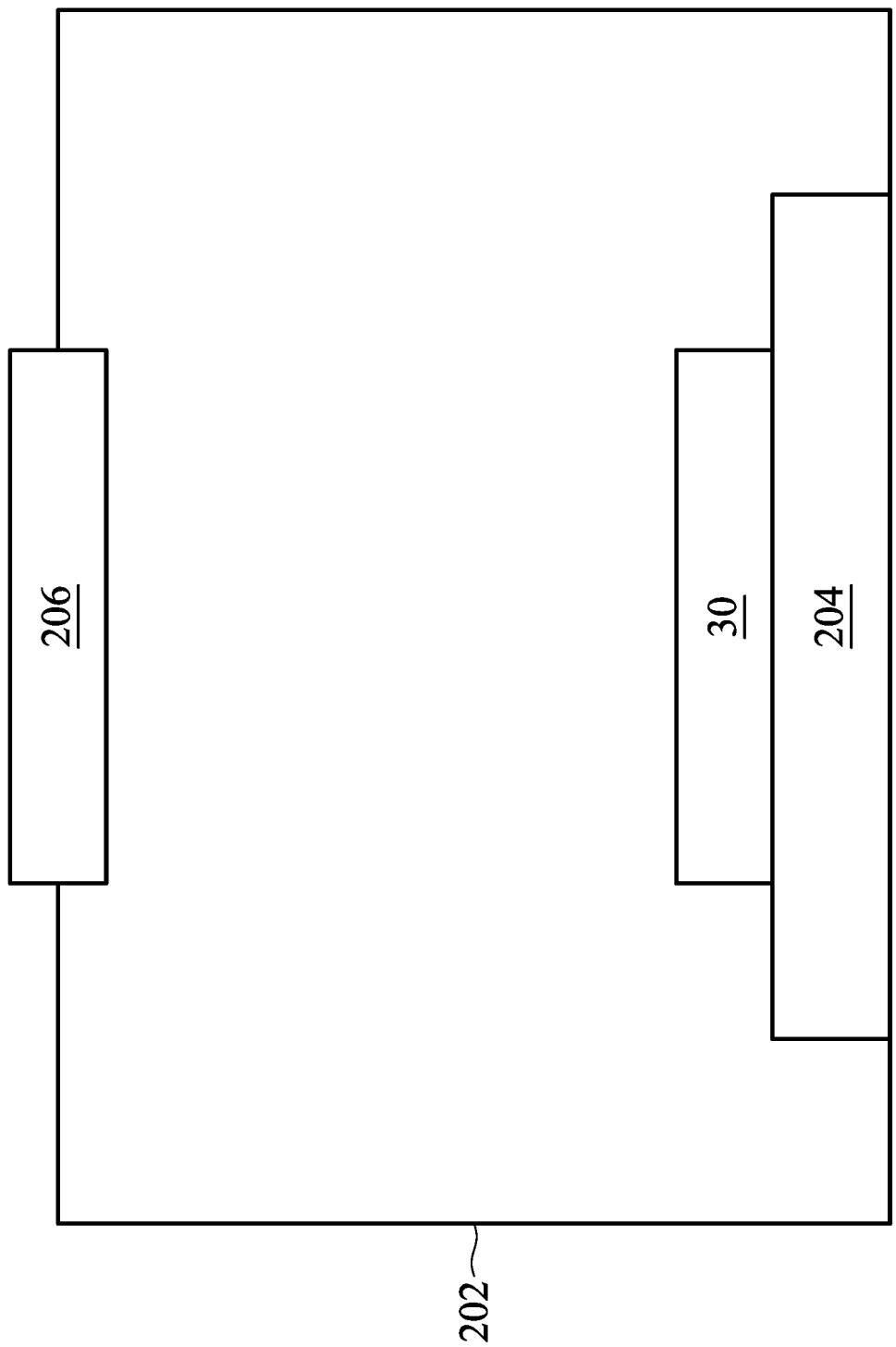

METHODS OF FORMING CONDUCTIVE FEATURES USING A VACUUM ENVIRONMENT

PRIORITY CLAIM AND CROSS REFERENCE

This application is a continuation of U.S. patent application Ser. No. 15/886,190, filed Feb. 1, 2018, which claims priority to U.S. Provisional Application No. 62/527,557, filed Jun. 30, 2017, the entirety of which is incorporated herein by reference.

BACKGROUND

In the current process of miniaturizing semiconductor devices, low-k dielectric materials are desired as the inter-metal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC).

However, the materials that are currently being considered or used as low-k dielectric materials are not ideal. In particular, in choosing a material based upon its k-value, and particularly based upon its low-k value, other characteristics, such as the hardness of the material or its strength, may not be ideal for use in a semiconductor manufacturing process. As such, improvements in processes that utilize low-k dielectric materials are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 32 is a cross-sectional view of a finFET device in a process chamber in accordance with some embodiments.

DETAILED DESCRIPTION

Figure 1:
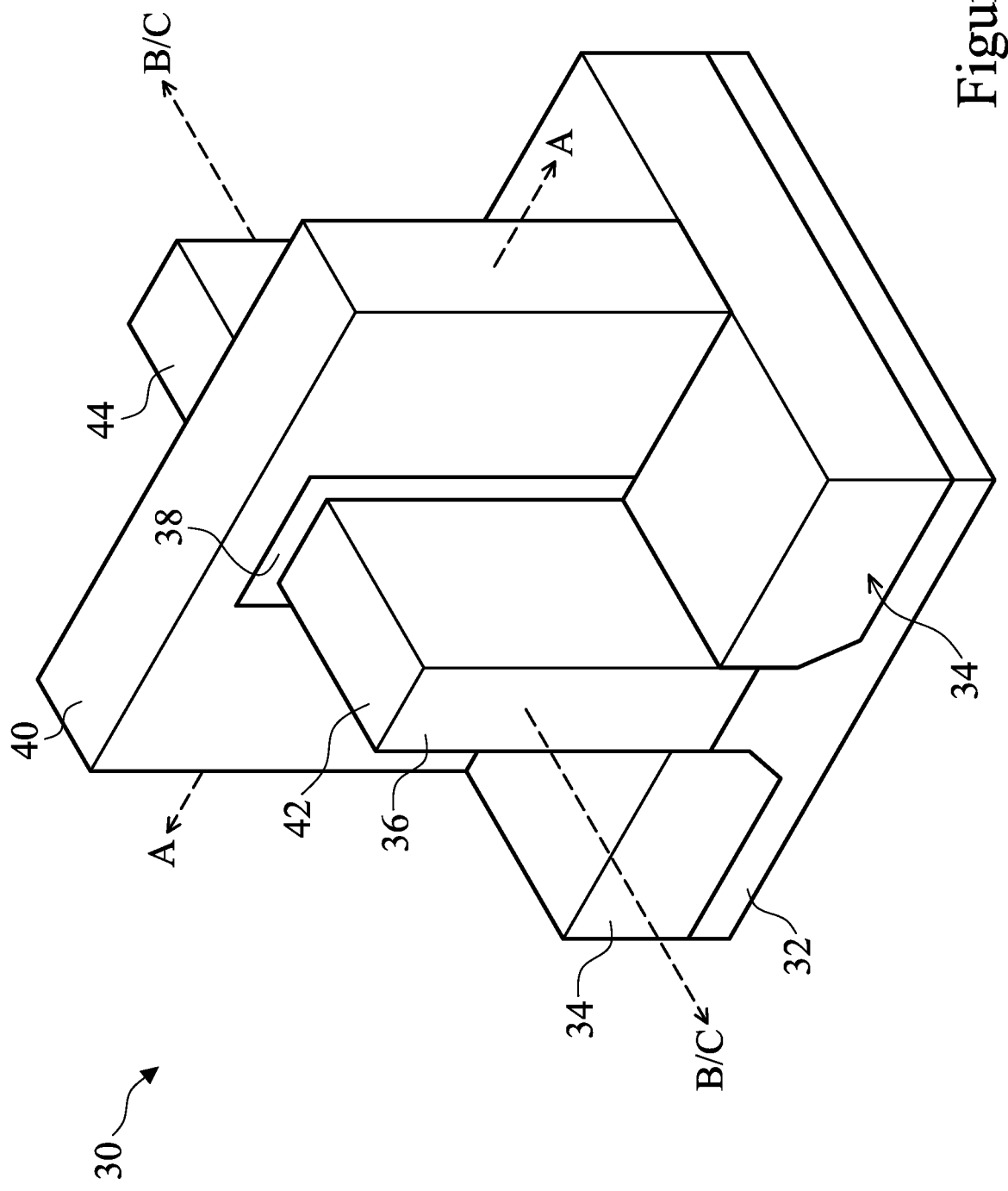
FIG. 1 is a perspective view of a fin field effect transistor ("finFET") in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures and methods of forming the same are provided in accordance with various embodiments. Intermediate stages of forming interconnect structures are illustrated. Some embodiments discussed herein are discussed in the context of interconnects formed using a dual damascene process. In other embodiments, a single damascene process may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a fin field-effect transistor (finFET) 30 in a three-dimensional view. FinFET 30 comprises fin 36 on substrate 32. Isolation regions 34 are over substrate 32, and fin 36 protrudes above and from between neighboring isolation regions 34. A gate dielectric 38 is along sidewalls and over a top surface of fin 36, and gate electrode 40 is over the gate dielectric 38. Source/drain regions 42 and 44 are disposed in opposite sides of fin 36 with respect to gate dielectric 38 and gate electrode 40. FIG. 1 further illustrates reference cross-sections that are used in later figures. Cross-section A-A is across a channel, gate dielectric 38, and gate electrode 40 of the finFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of finFETs formed using a gate-last process. In other embodiments, a gate-first process may be used. Also, some embodiments contemplate aspects used in planar devices, such as planar FETs.

FIGS. 2 through 31C, and 33A through 37C, are cross-sectional views of intermediate stages in the manufacturing of finFETs in accordance with some embodiments. FIGS. 2 through 6 illustrate reference cross-section A-A illustrated in FIG. 1, except for multiple finFETs. In FIGS. 7A through 31C, and 33A through 37C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 2:
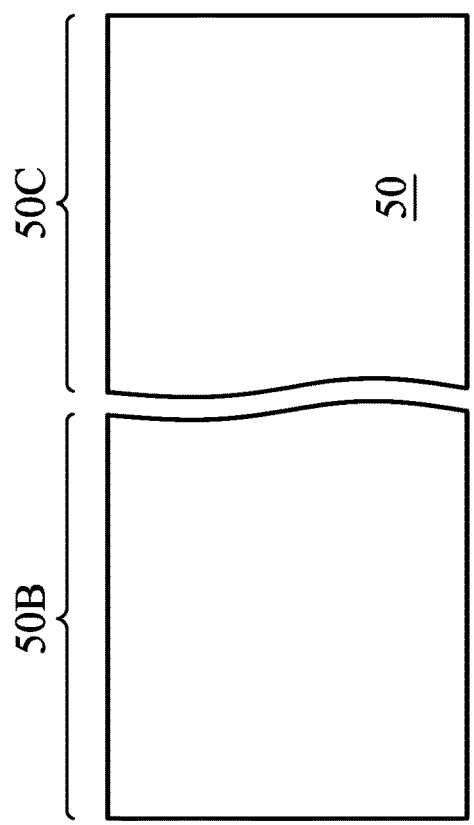

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Substrate 50 has a first region 50B and a second region 50C. The first region 50B (which corresponds to subsequent figures ending in "B") can be for forming n-type devices, such as NMOS transistors, such as n-type finFETs. The second region 50C (which corresponds to subsequent figures ending in "C") can be for forming p-type devices, such as PMOS transistors, such as p-type finFETs.

Figure 3:
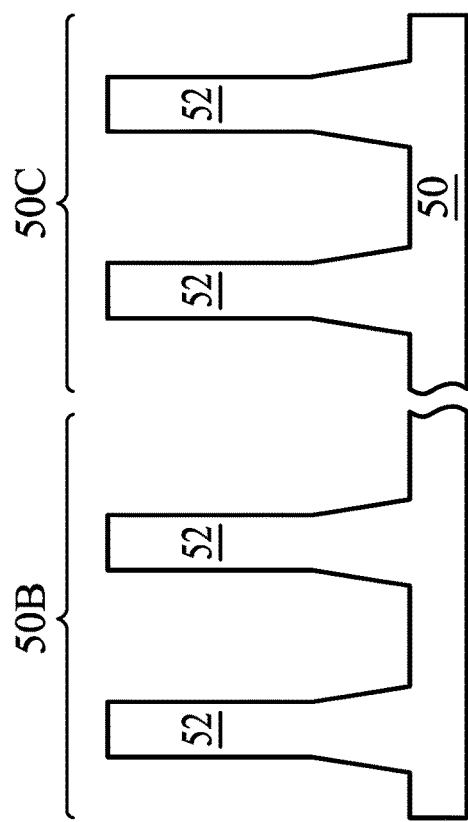
FIGS. 2-6 are cross-sectional views of intermediate stages in the manufacture of a finFET device in accordance with some embodiments.
Figure 4:
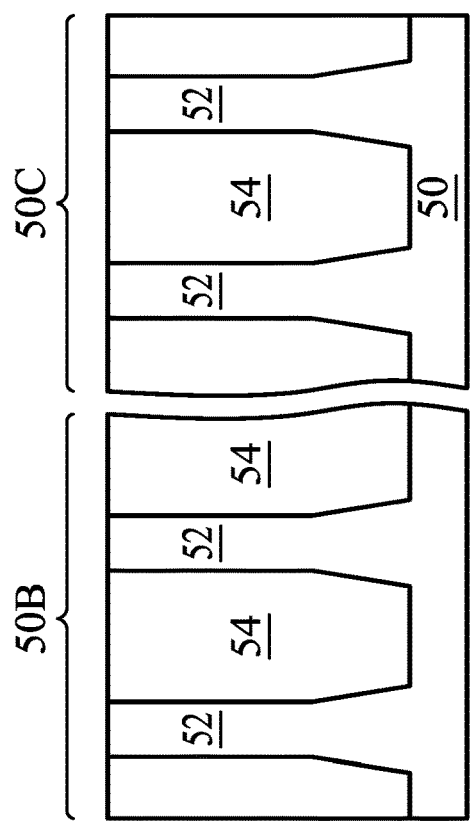

FIGS. 3 and 4 illustrate the formation of fins 52 and isolation regions 54 between neighboring fins 52. In FIG. 3, fins 52 are formed in the substrate 50. In some embodiments, fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 4, an insulation material 54 is formed between neighboring fins 52 to form isolation regions 54. Insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulation material is formed. In the illustrated embodiment, insulation material 54 is silicon oxide formed by a FCVD process. Insulating material 54 may be referred to as isolation regions 54.

Further in FIG. 4, a planarization process, such as a chemical mechanical polish (CMP), may remove any excess insulation material 54 and form top surfaces of the isolation regions 54 and top surfaces of fins 52 that are coplanar.

Figure 5:
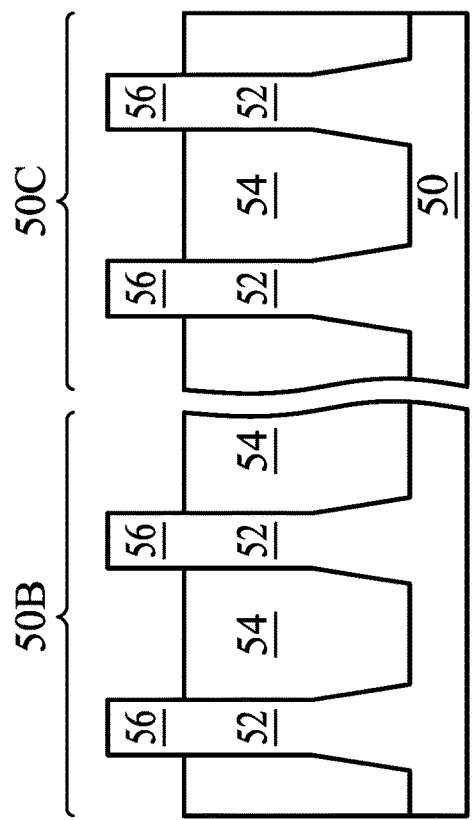

FIG. 5 illustrates the recessing of isolation regions 54 to form Shallow Trench Isolation (STI) regions 54. Isolation regions 54 are recessed such that fins 56 in the first region 50B and in the second region 50C protrude from between neighboring isolation regions 54. Further, the top surfaces of isolation regions 54 may have a flat surface as illustrated, a convex surface, a concave surface (such as dishing), or a combination thereof. The top surfaces of isolation regions 54 may be formed flat, convex, and/or concave by an appropriate etch. Isolation regions 54 may be recessed using an acceptable etching process, such as one that is selective to the material of isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, semiconductor strips 52 in FIG. 4 can be recessed, and a material different from semiconductor strips 52 may be epitaxially grown in their place. In an even further embodiment, a dielectric layer can be formed over a top surface of substrate 50; trenches can be etched through the dielectric layer; heteroepitaxial structures can be epitaxially grown in the trenches using a material different from substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 5, appropriate wells may be formed in fins 56, fins 52, and/or substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over fins 56 and isolation regions 54 in the first region 50B. The photoresist is patterned to expose second region 50C of the substrate 50, such as a PMOS region. The photoresist can be formed by using a spin-on technique and can be patterned using acceptable photolithography techniques. Once the photoresist is patterned, an n-type impurity implant is performed in second region 50C, and the photoresist may act as a mask to substantially prevent n-type impurities from being implanted into first region 50B, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of second region 50C, a photoresist is formed over fins 56 and isolation regions 54 in the second region 50C. The photoresist is patterned to expose first region 50B of substrate 50, such as the NMOS region. The photoresist can be formed by using a spin-on technique and can be patterned using acceptable photolithography techniques. Once the photoresist is patterned, a p-type impurity implant may be performed in first region 50B, and the photoresist may act as a mask to substantially prevent p-type impurities from being implanted into the second region, such as the PMOS region. The p-type impurities may be boron, $BF_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of first region 50B and second region 50C, an anneal process may be performed to activate the p-type and n-type impurities that were implanted. The implantations may form a p-well in first region 50B, e.g., the NMOS region, and an n-well in second region 50C, e.g., the PMOS region. In some embodiments, the grown materials of epitaxial fins may be in situ doped during growth, which may obviate the implantations, although in situ and implantation doping may be used together.

Figure 6:
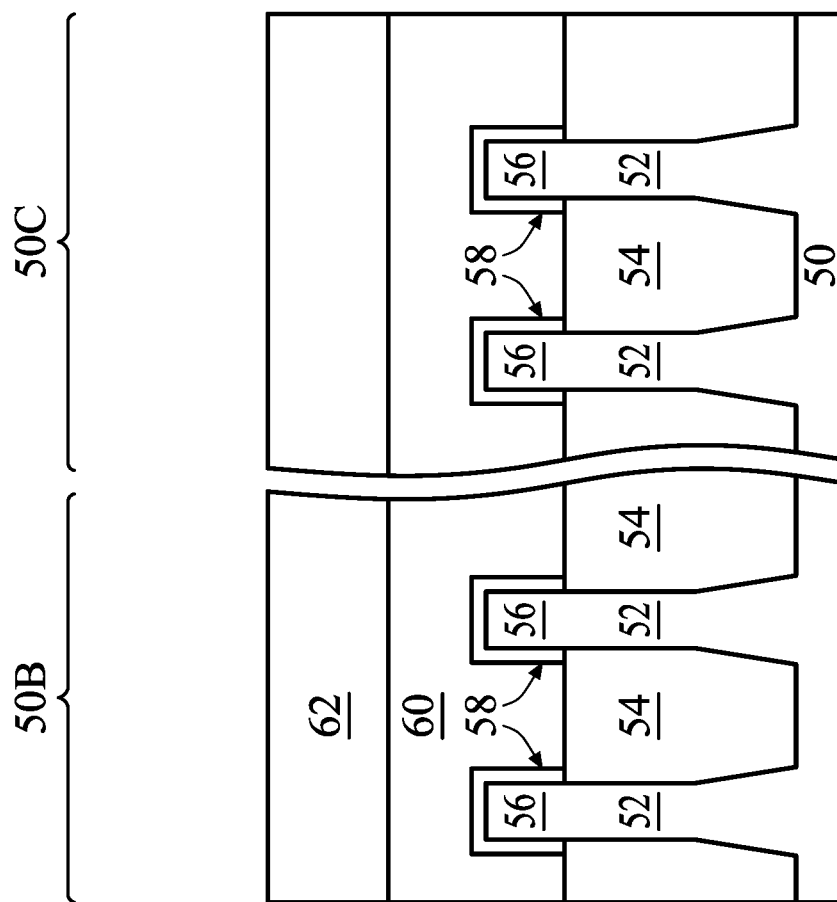

In FIG. 6, dummy dielectric layer 58 is formed on the fins 56. Dummy dielectric layer 58 may be, for example, silicon oxide, silicon nitride, a combination thereof, or the like, and may be deposited or thermally grown according to acceptable techniques. Dummy gate layer 60 is formed over dummy dielectric layer 58, and mask layer 62 is formed over dummy gate layer 60. Dummy gate layer 60 may be deposited over dummy dielectric layer 58 and then planarized, such as by a CMP. Mask layer 62 may be deposited over dummy gate layer 60. Dummy gate layer 60 may be made of, for example, polysilicon, although other materials that have a high etching selectivity from the etching of isolation regions 54 may also be used. Mask layer 62 may include, for example, silicon nitride or the like. In this example, a single dummy gate layer 60 and a single mask layer 62 are formed across first region 50B and second region 50C. In other embodiments, separate dummy gate layers may be formed in first region 50B and second region 50C, and separate mask layers may be formed in first region 50B and second region 50C.

Figure 7A:
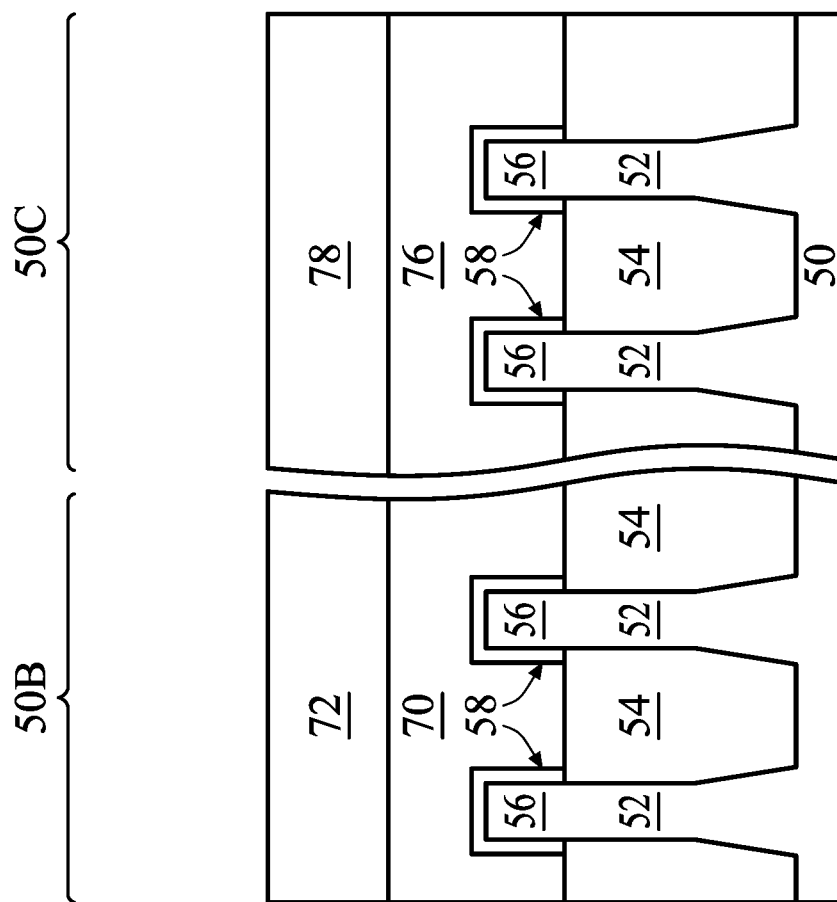
FIGS. 7A, 7B, and 7C are cross-sectional views of intermediate stages in the manufacture of a finFET device in accordance with some embodiments.
Figure 7C:
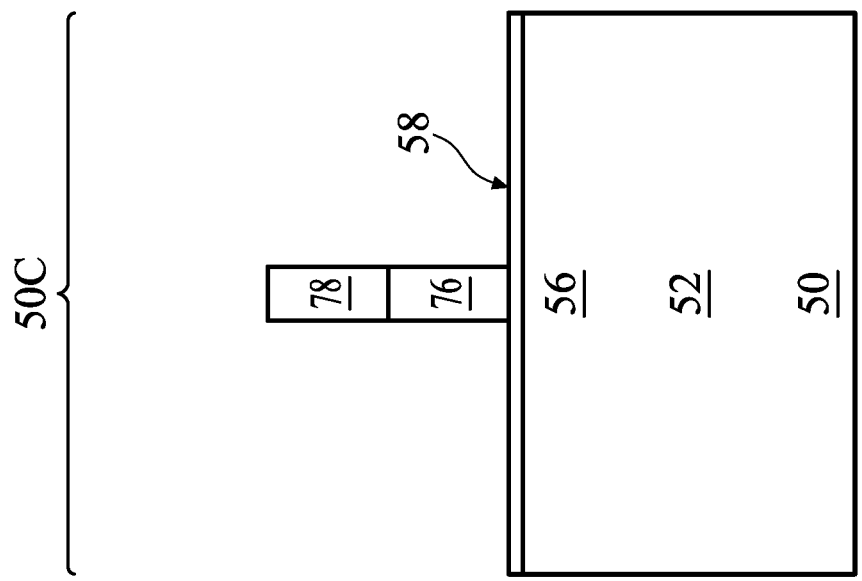
Figure 7B:
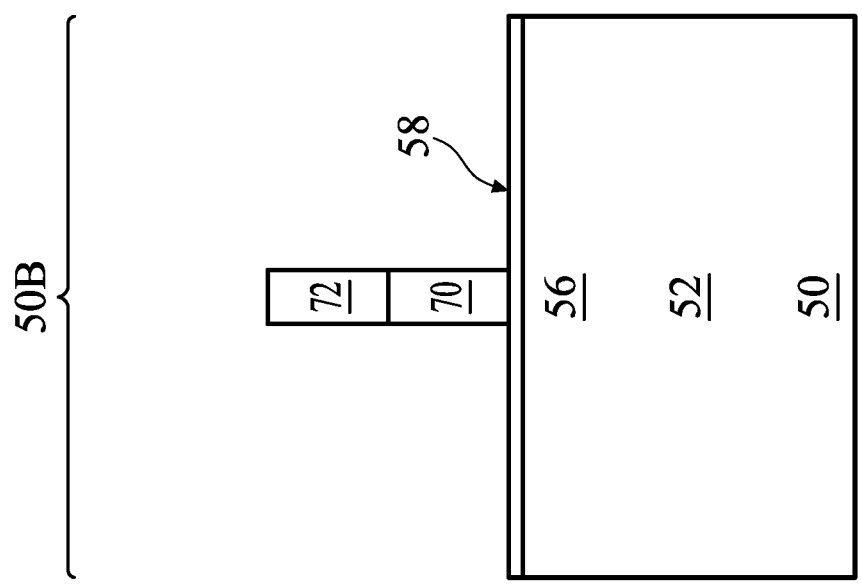

In FIGS. 7A, 7B, and 7C, mask layer 62 may be patterned using acceptable photolithography and etching techniques to form masks 72 in the first region 50B (as illustrated in FIG. 7B) and masks 78 in the second region 50C (as illustrated in FIG. 7C). The pattern of masks 72 and 78 then may be transferred to the dummy gate layer 60 and dummy dielectric layer 58 by an acceptable etching technique to form dummy gates 70 in first region 50B and dummy gates 76 in second region 50C. Dummy gates 70 and 76 cover respective channel regions of the fins 56. Dummy gates 70 and 76 may also have a lengthwise direction substantially perpendicular to the lengthwise direction of respective epitaxial fins.

Figure 8A:
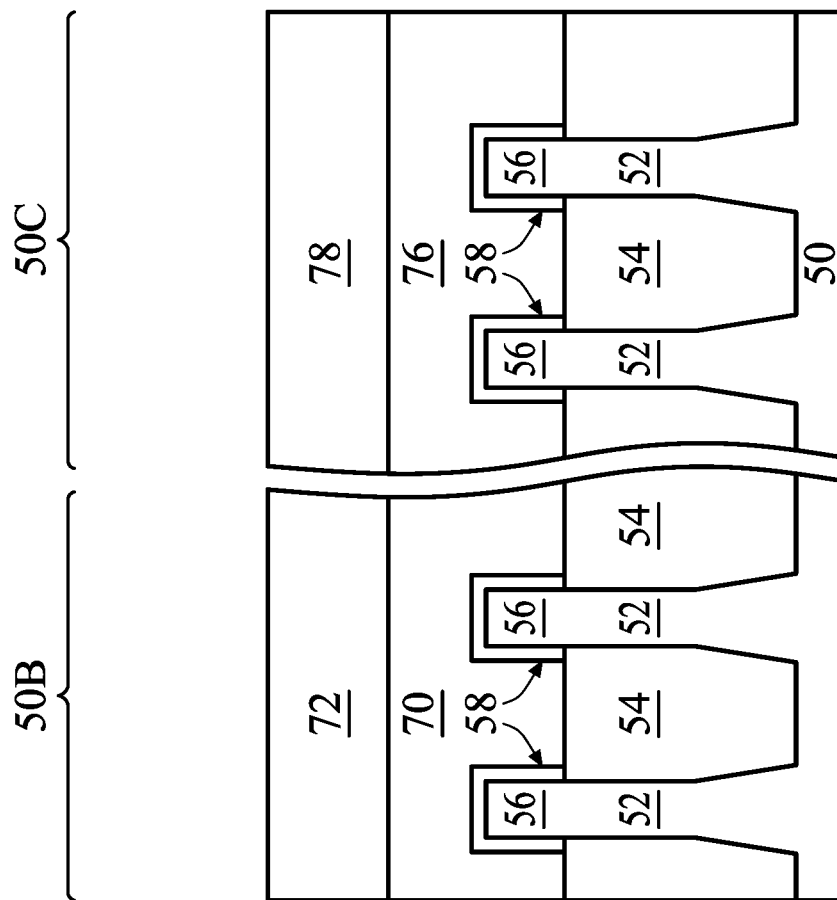
FIGS. 8A, 8B, and 8C are cross-sectional views of intermediate stages in the manufacture of a finFET device in accordance with some embodiments.
Figure 8C:
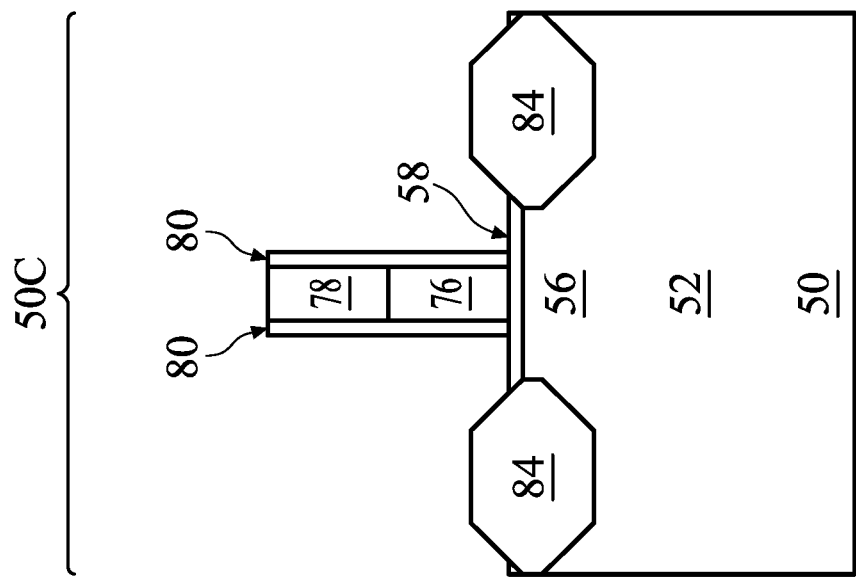
Figure 8B:
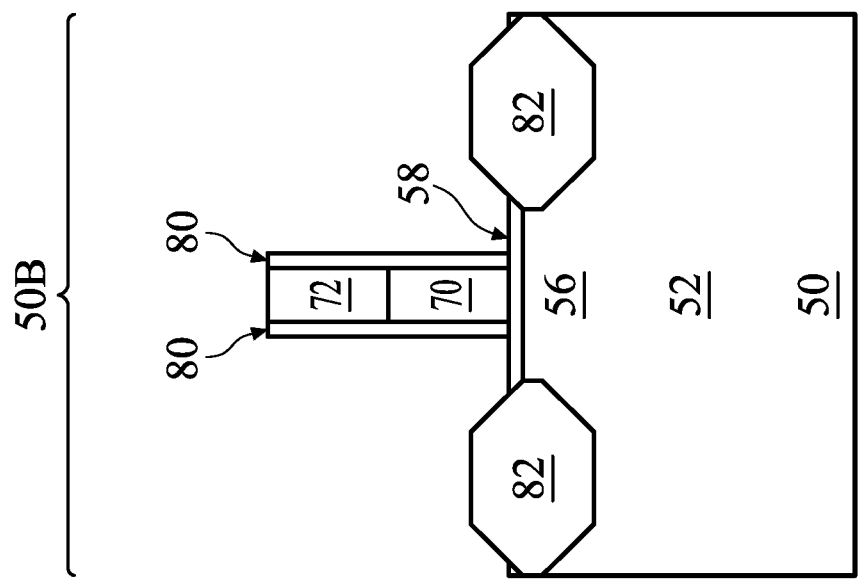

In FIGS. 8A, 8B, and 8C, gate seal spacers 80 can be formed on exposed surfaces of respective dummy gates 70 and 76 and/or fins 56. A thermal oxidation or a deposition followed by an anisotropic etch may form the gate seal spacers 80.

After the formation of the gate seal spacers 80, implants for lightly doped source/drain (LDD) regions may be performed. Similar to the implants discussed above in FIG. 5, a mask, such as a photoresist, may be formed over first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over second region 50C while exposing first region 50B, and n-type impurities may be implanted into the exposed fins 56 in first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further in FIGS. 8A, 8B, and 8C, epitaxial source/drain regions 82 and 84 are formed in fins 56. In first region 50B, epitaxial source/drain regions 82 are formed in fins 56 such that each dummy gate 70 is disposed between respective neighboring pairs of epitaxial source/drain regions 82. In some embodiments, epitaxial source/drain regions 82 may extend into fins 52. In second region 50C, epitaxial source/drain regions 84 are formed in fins 56 such that each dummy gate 76 is disposed between respective neighboring pairs of epitaxial source/drain regions 84. In some embodiments, epitaxial source/drain regions 84 may extend into the fins 52.

Epitaxial source/drain regions 82 in first region 50B, e.g., the NMOS region, may be formed by masking the second region 50C, e.g., the PMOS region, and conformally depositing a dummy spacer layer in first region 50B followed by an anisotropic etch to form dummy gate spacers (not shown) along sidewalls of the dummy gates 70 and/or gate seal spacers 80 in the first region 50B. Then, source/drain regions of the epitaxial fins in first region 50B are etched to form recesses. Epitaxial source/drain regions 82 in first region 50B are epitaxially grown in the recesses. Epitaxial source/drain regions 82 may include any acceptable material, such as appropriate for n-type finFETs. For example, if fin 56 is silicon, epitaxial source/drain regions 82 may include silicon, SiC, SiCP, SiP, or the like. Epitaxial source/drain regions 82 may have surfaces raised from respective surfaces of fins 56 and may have facets. Subsequently, the dummy gate spacers in first region 50B are removed, for example, by an etch, as is the mask on second region 50C.

Epitaxial source/drain regions 84 in the second region 50C, e.g., the PMOS region, may be formed by masking first region 50B, e.g., the NMOS region, and conformally depositing a dummy spacer layer in second region 50C followed by an anisotropic etch to form dummy gate spacers (not shown) along sidewalls of dummy gates 76 and/or gate seal spacers 80 in second region 50C. Then, source/drain regions of the epitaxial fins in second region 50C are etched to form recesses. Epitaxial source/drain regions 84 in second region 50C are epitaxially grown in the recesses. Epitaxial source/drain regions 84 may include any acceptable material, such as appropriate for p-type finFETs. For example, if fin 56 is silicon, epitaxial source/drain regions 84 may comprise SiGe, SiGeB, Ge, GeSn, or the like. Epitaxial source/drain regions 84 may have surfaces raised from respective surfaces of fins 56 and may have facets. Subsequently, the dummy gate spacers in second region 50C are removed, for example, by an etch, as is the mask on first region 50B.

Figure 9A:
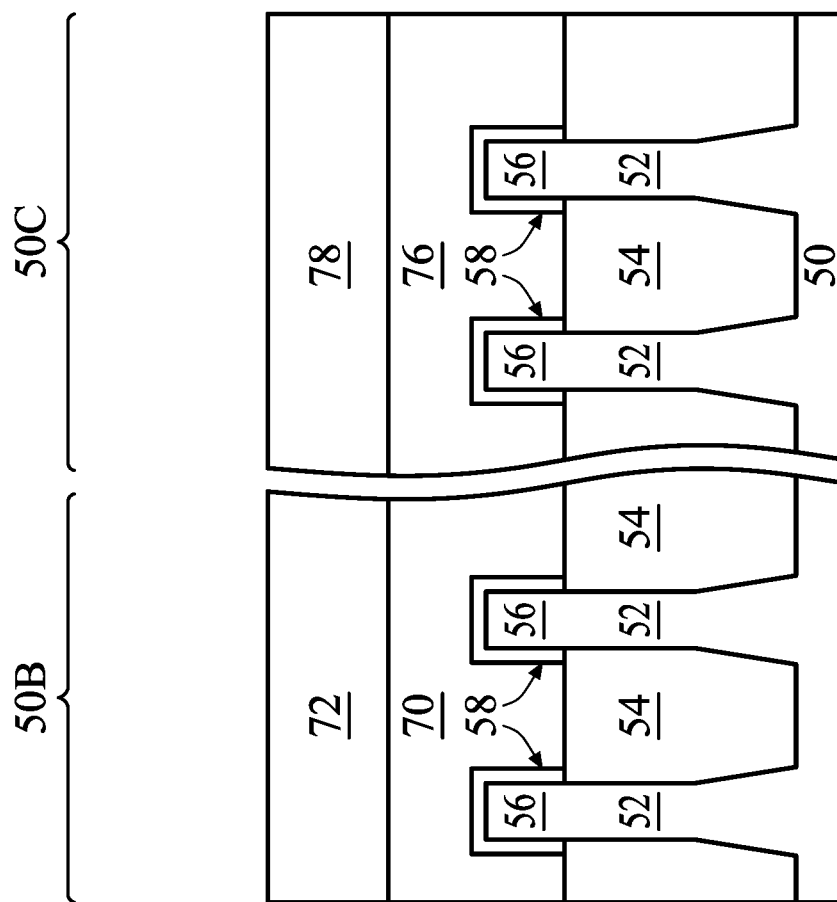
FIGS. 9A, 9B, and 9C are cross-sectional views of intermediate stages in the manufacture of a finFET device in accordance with some embodiments.
Figure 9C:
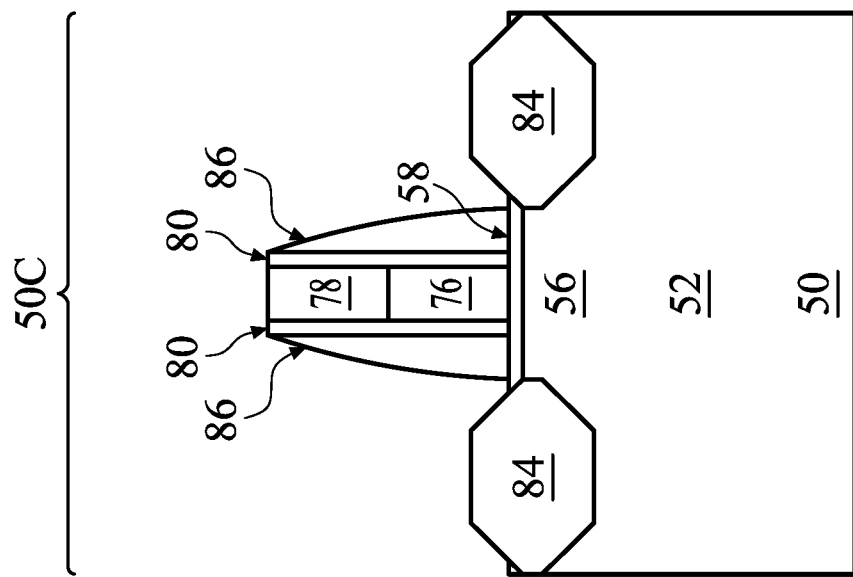
Figure 9B:
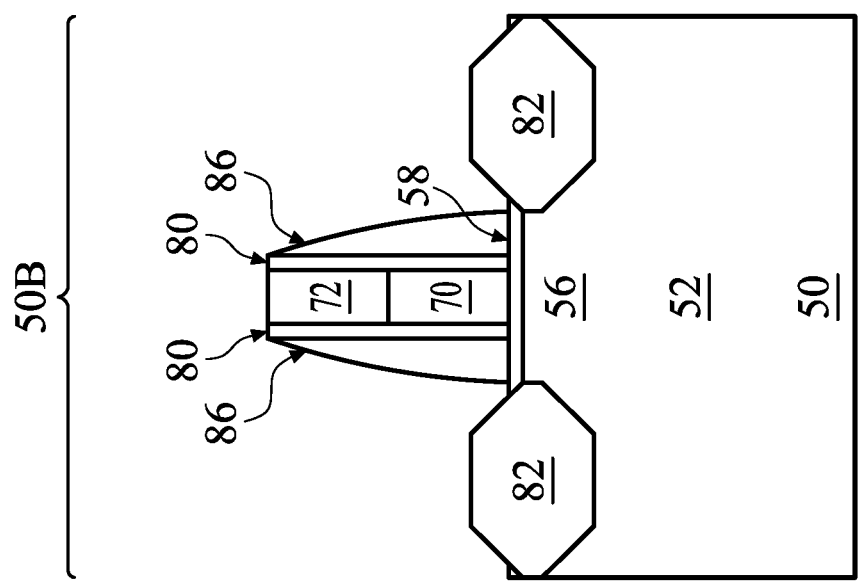

In FIGS. 9A, 9B, and 9C, gate spacers 86 are formed on gate seal spacers 80 along sidewalls of the dummy gates 70 and 76. Gate spacers 86 may be formed by conformally depositing a material and subsequently anisotropically etching the material. The material of gate spacers 86 may be silicon nitride, SiCN, a combination thereof, or the like.

Epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of in a range from about $10^{19}$ cm$^{-3}$ to about $10^{21}$ cm$^{-3}$. The n-type impurities for source/drain regions in first region 50B, e.g., the NMOS region, may be any of the n-type impurities previously discussed, and the p-type impurities for source/drain regions in second region 50C, e.g., the PMOS region, may be any of the p-type impurities previously discussed. In other embodiments, epitaxial source/drain regions 82 and 84 may be in situ doped during growth.

Figure 10A:
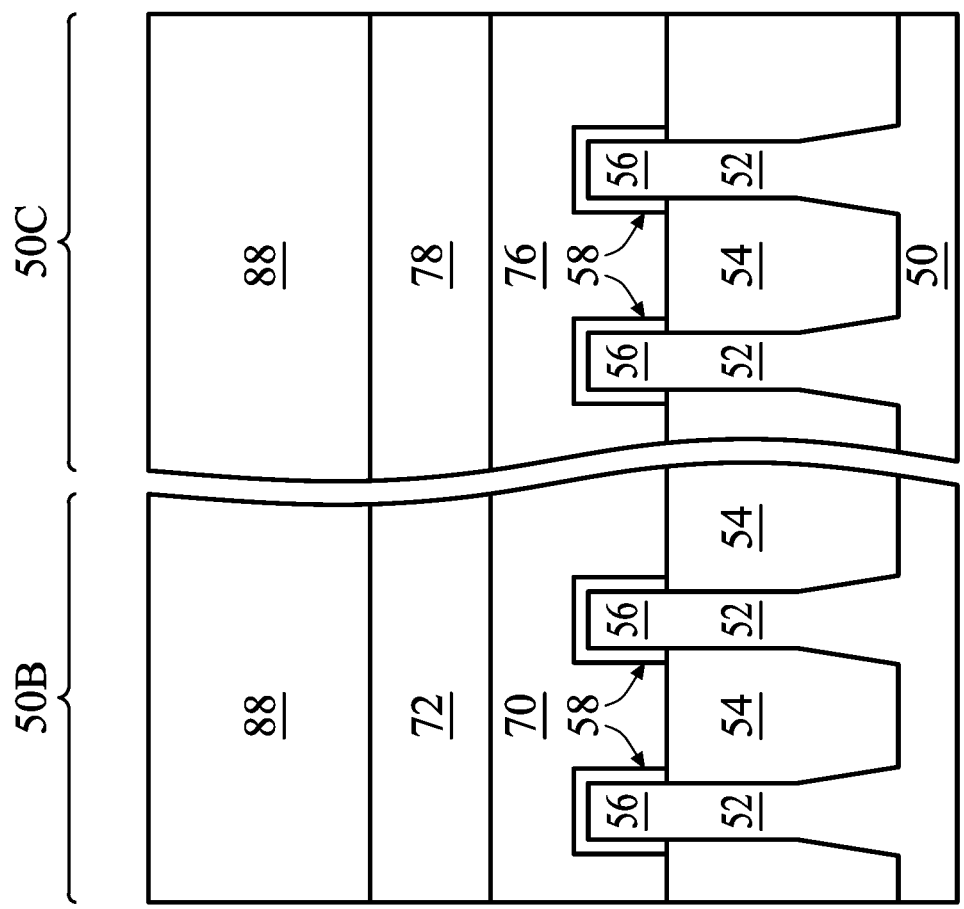
FIGS. 10A, 10B, and 10C are cross-sectional views of intermediate stages in the manufacture of a finFET device in accordance with some embodiments.
Figure 10C:
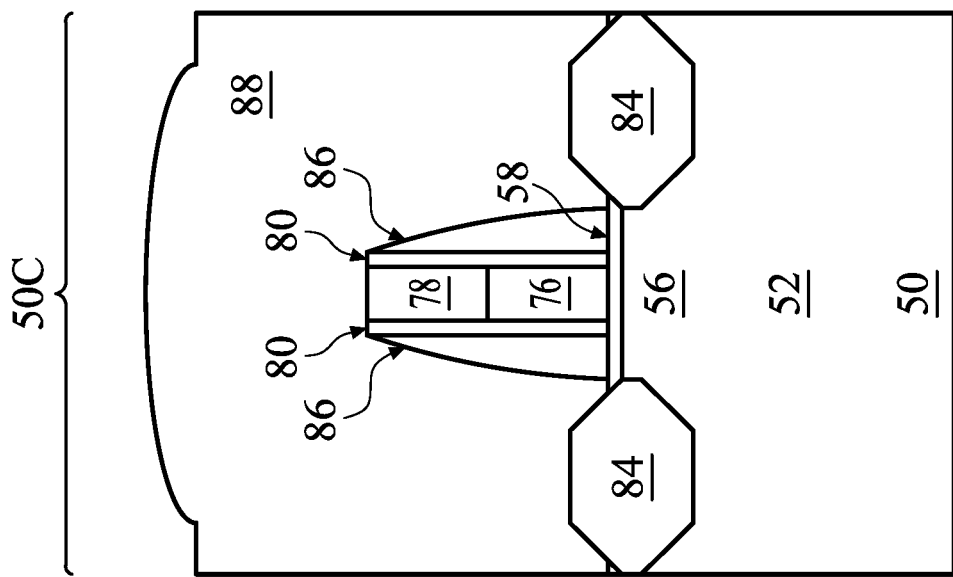
Figure 10B:
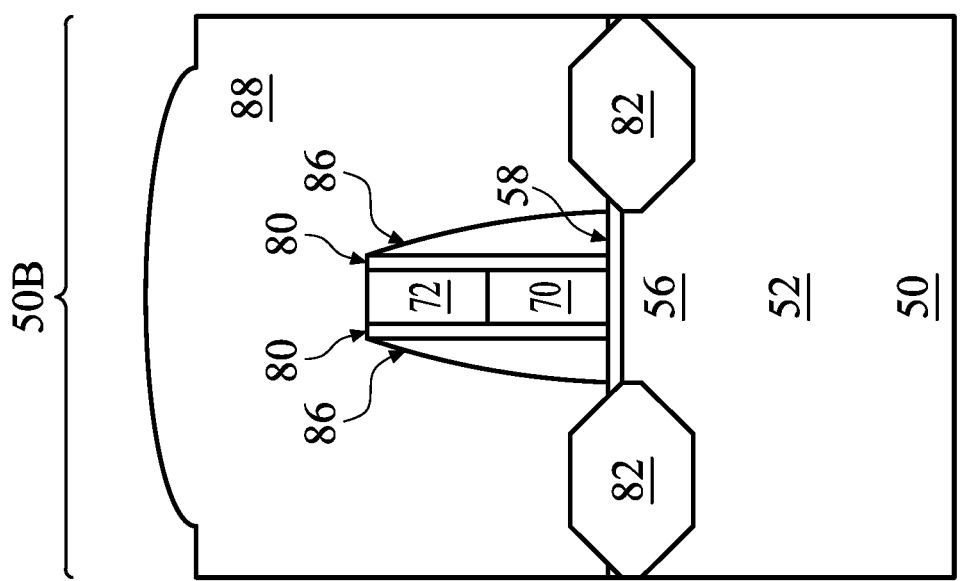

In FIGS. 10A, 10B, and 10C, ILD 88 is deposited over the structure illustrated in FIGS. 9A, 9B, and 9C. In an embodiment, ILD 88 is a flowable film formed by a flowable CVD. In some embodiments, ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 11A:
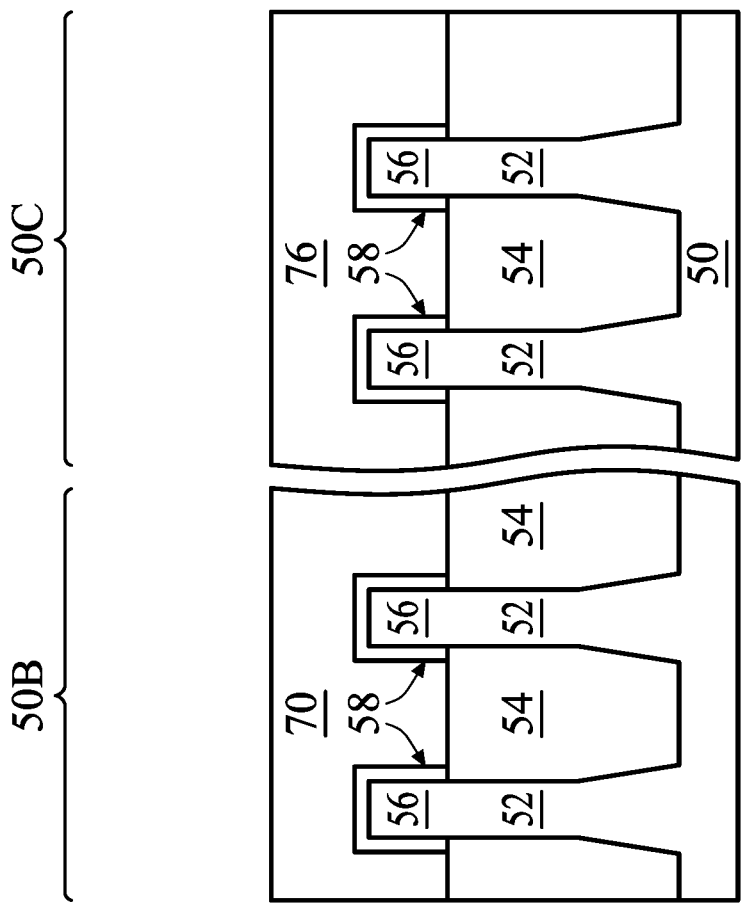
FIGS. 11A, 11B, and 11C are cross-sectional views of intermediate stages in the manufacture of a finFET device in accordance with some embodiments.
Figure 11C:
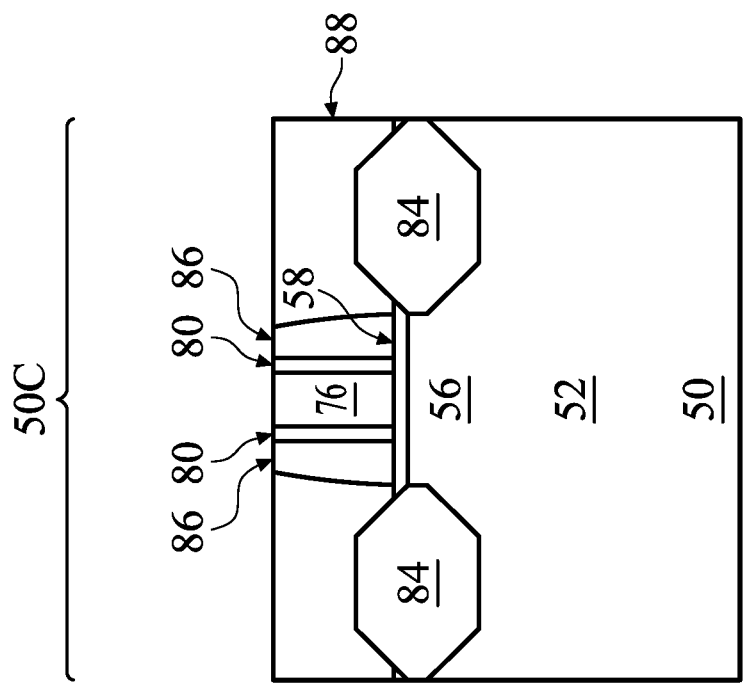
Figure 11B:
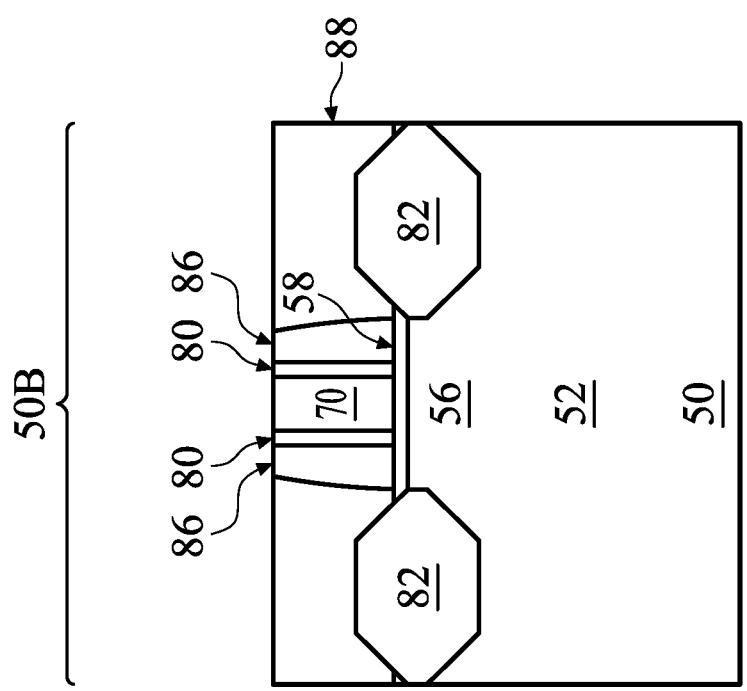

In FIGS. 11A, 11B, and 11C, a planarization process, such as a CMP, may be performed to level the top surface of ILD 88 with the top surfaces of the dummy gates 70 and 76. The CMP may also remove masks 72 and 78 on dummy gates 70 and 76. Accordingly, top surfaces of dummy gates 70 and 76 are exposed through ILD 88.

Figure 12A:
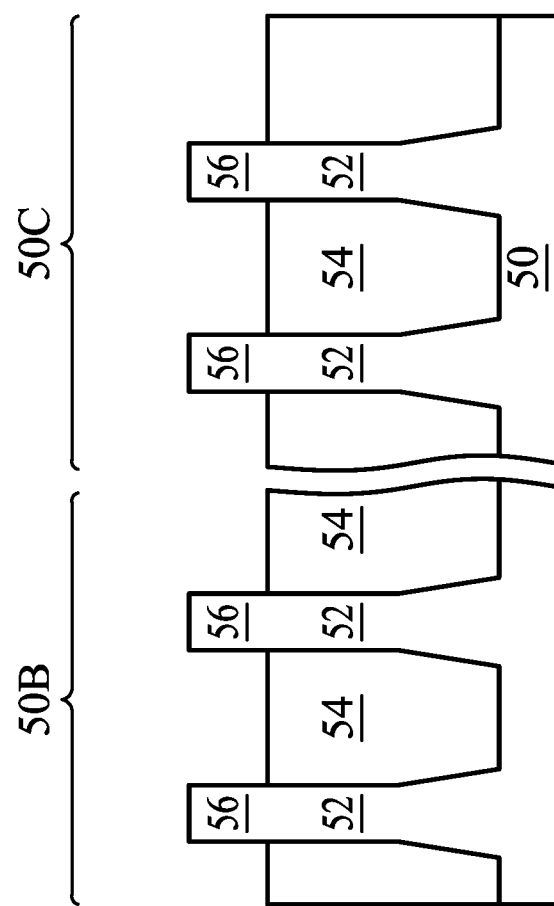
FIGS. 12A, 12B, and 12C are cross-sectional views of intermediate stages in the manufacture of a finFET device in accordance with some embodiments.
Figure 12C:
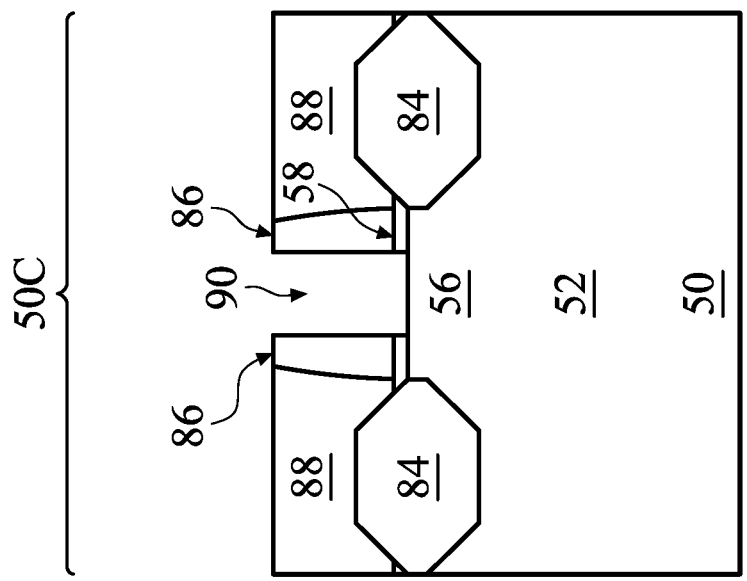
Figure 12B:
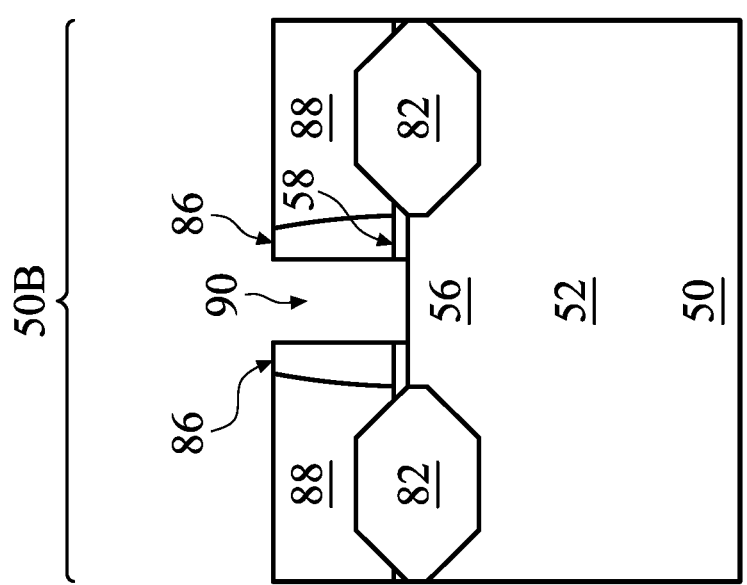

In FIGS. 12A, 12B, and 12C, dummy gates 70 and 76, gate seal spacers 80, and portions of dummy dielectric layer 58 directly underlying dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, dummy dielectric layer 58 may be used as an etch stop layer when dummy gates 70 and 76 are etched. Dummy dielectric layer 58 and gate seal spacers 80 may then be removed after the removal of dummy gates 70 and 76.

Figure 13A:
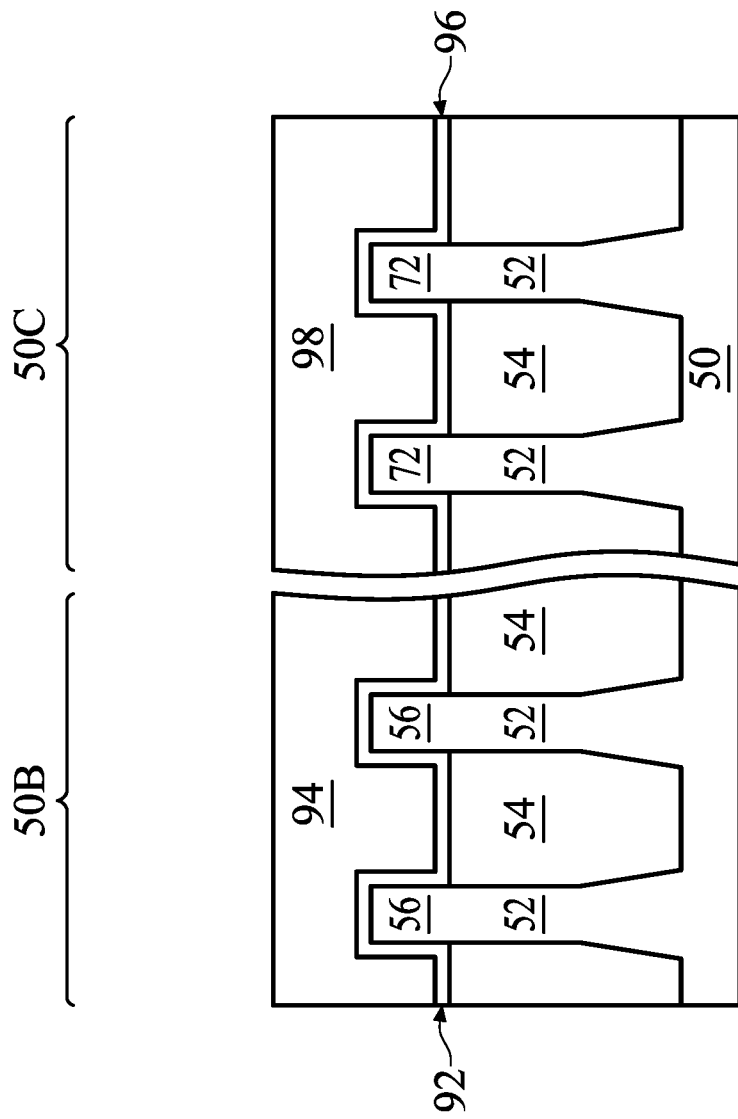
FIGS. 13A, 13B, and 13C are cross-sectional views of intermediate stages in the manufacture of a finFET device in accordance with some embodiments.
Figure 13C:
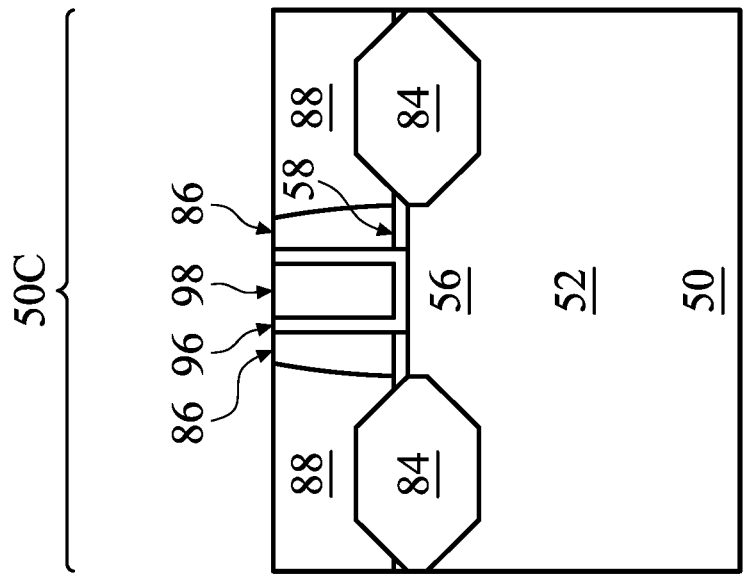
Figure 13B:
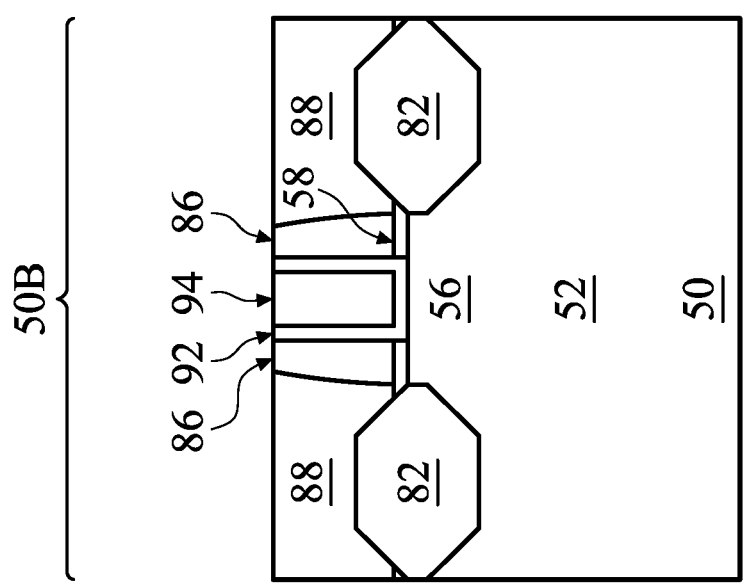

In FIGS. 13A, 13B, and 13C, gate dielectric layers 92 and 96 and gate electrodes 94 and 98 are formed for replacement gates. Gate dielectric layers 92 and 96 are deposited conformally in recesses 90, such as on the top surfaces and the sidewalls of fins 56 and on sidewalls of gate spacers 86, and on a top surface of ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, W, combinations thereof, or multi-layers thereof. The multi-layers, if present, may include one or more work function layers, one or more tuning layers, and/or one or more barrier layers, a combination thereof, or the like. After the filling of gate electrodes 94 and 98, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting finFETs.

The formation of gate dielectric layers 92 and 96 may occur simultaneously such that gate dielectric layers 92 and 96 are made of the same materials, and the formation of gate electrodes 94 and 98 may occur simultaneously such that gate electrodes 94 and 98 are made of the same materials. However, in other embodiments, gate dielectric layers 92 and 96 may be formed by distinct processes, such that gate dielectric layers 92 and 96 may be made of different materials, and gate electrodes 94 and 98 may be formed by distinct processes, such that gate electrodes 94 and 98 may be made of different materials. Various masking steps may be used to mask and expose appropriate regions when using distinct processes.

Figure 14A:
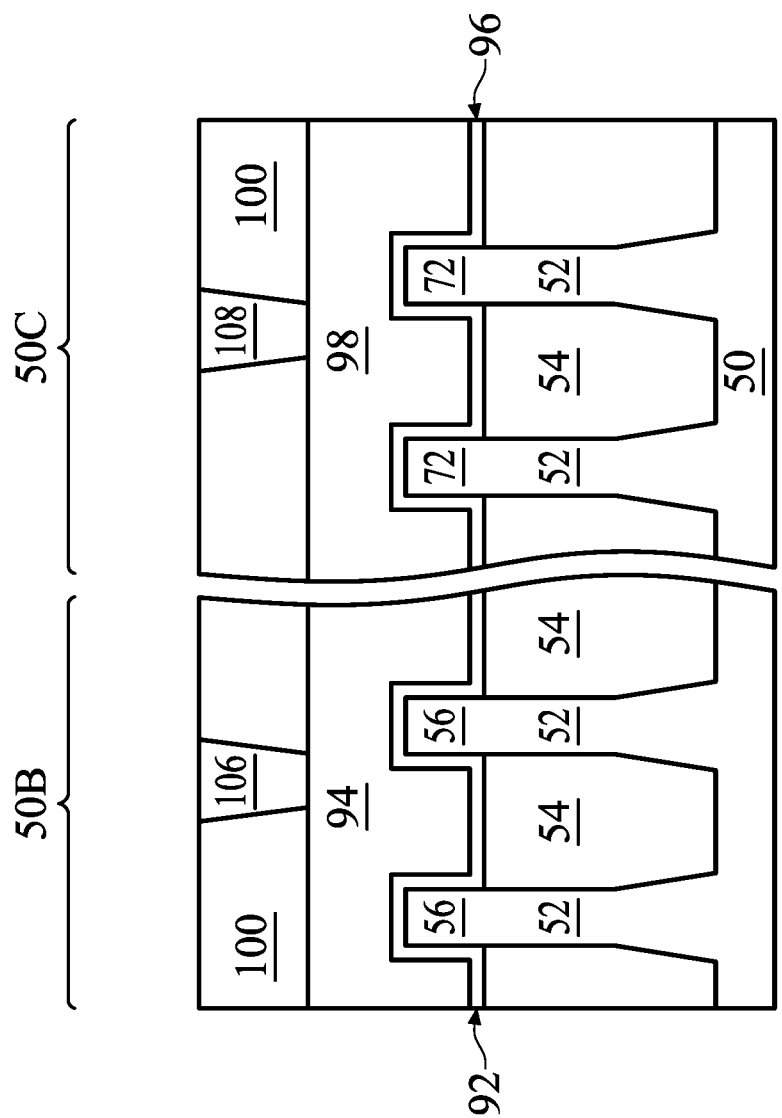
FIGS. 14A, 14B, and 14C are cross-sectional views of intermediate stages in the manufacture of a finFET device in accordance with some embodiments.
Figure 14C:
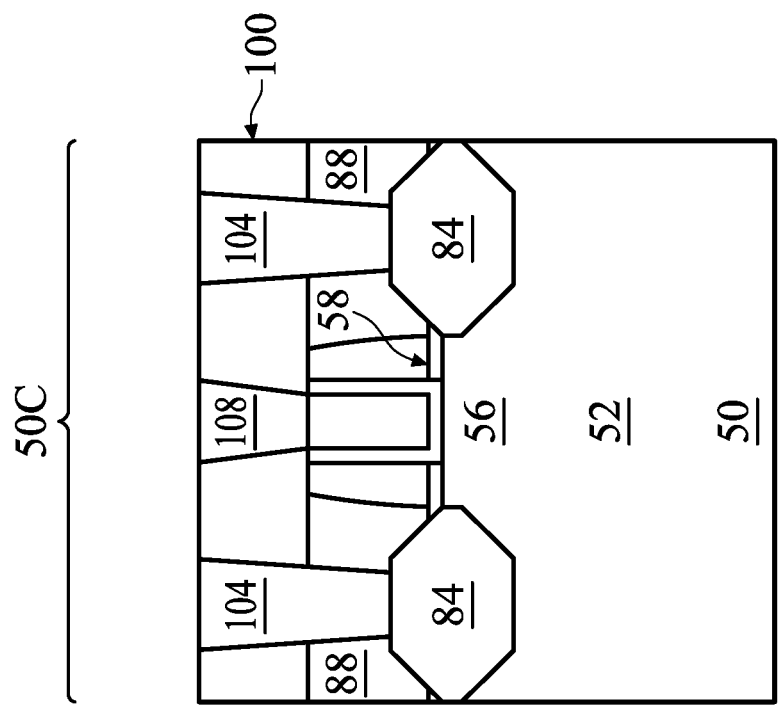
Figure 14B:
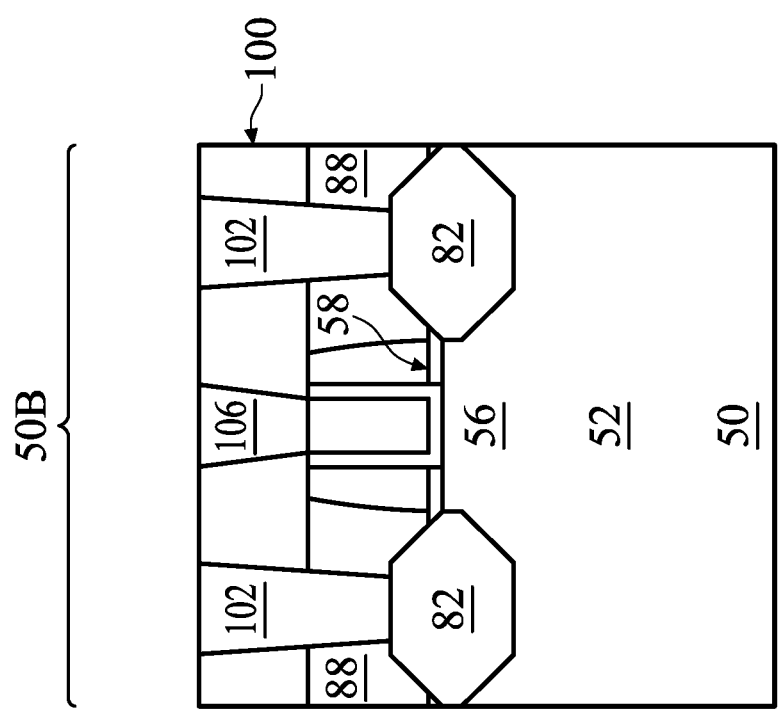

In FIGS. 14A, 14B, and 14C, ILD 100 is deposited over ILD 88. Further illustrated in FIGS. 14A, 14B, and 14C, contacts 102 and 104 are formed through ILD 100 and ILD 88 and contacts 106 and 108 are formed through ILD 100. In an embodiment, ILD 100 is a flowable film formed by a flowable CVD method. In some embodiments, ILD 100 is formed of a dielectric material such as PSG, BSG, BPSG, USG, or the like, and may be deposited by any suitable method, such as CVD and PECVD. Openings for contacts 102 and 104 are formed through ILDs 88 and 100. Openings for contacts 106 and 108 are formed through ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of ILD 100. The remaining liner and conductive material form contacts 102 and 104 in the openings. An anneal process may be performed to form a silicide at the interface between the epitaxial source/drain regions 82 and 84 and the contacts 102 and 104, respectively. Contacts 102 are physically and electrically coupled to the epitaxial source/drain regions 82, contacts 104 are physically and electrically coupled to the epitaxial source/drain regions 84, contact 106 is physically and electrically coupled to gate electrode 94, and contact 108 is physically and electrically coupled to gate electrode 98.

Figure 15A:
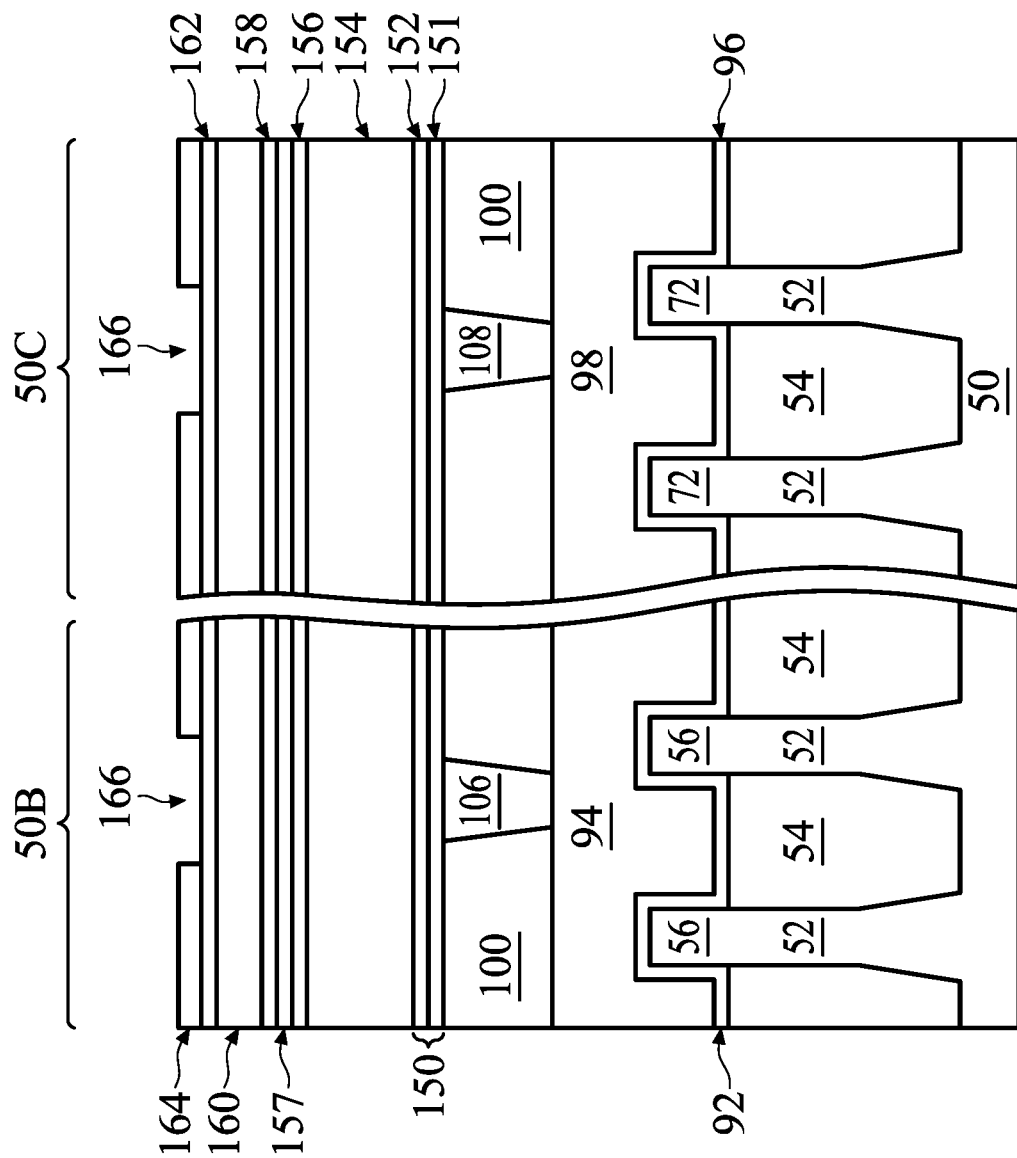
FIGS. 15A, 15B, and 15C are cross-sectional views of intermediate stages in the manufacture of a finFET device in accordance with some embodiments.
Figure 15C:
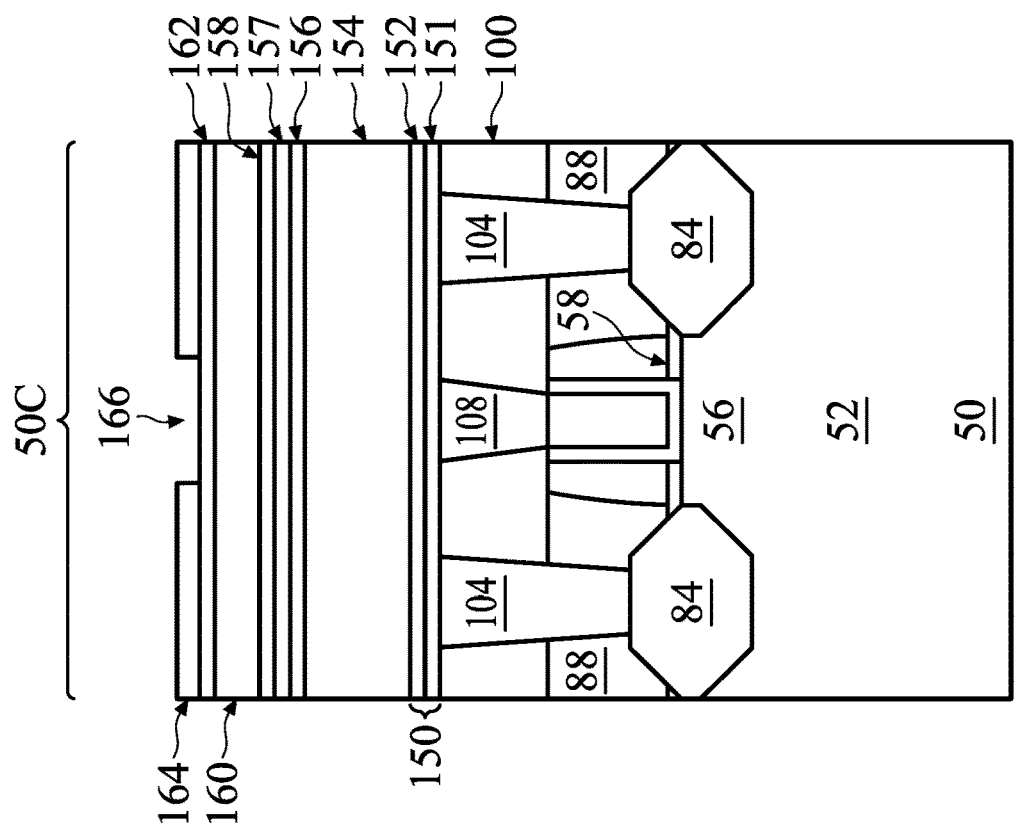
Figure 15B:
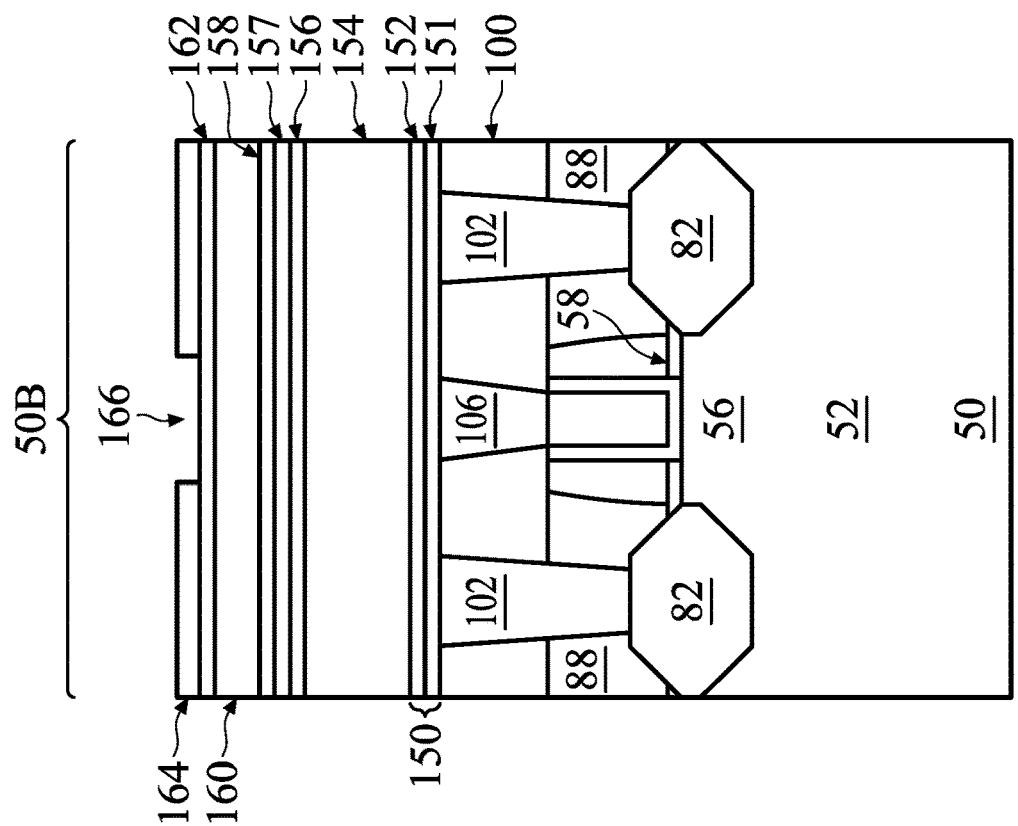

In FIGS. 15A, 15B, and 15C, etch stop layer 150 may be formed over ILD 100 and contacts 102/104/106/108. Dielectric layer 154 may be formed over etch stop layer 150. Anti-Reflective coating Layer (ARL) 156, mask layer 157, and ARL 158 are formed over dielectric layer 154. A tri-layer is formed over layer ARL 158, which includes bottom layer 160, middle layer 162, and upper layer 164. Each of these layers is discussed in greater detail below.

Etch stop layer 150 may include a nitride, a silicon-carbon based material, a carbon-doped oxide, Carbon-Doped Oxide (CDO), silicon Oxy-Carbide (SiOC), Oxygen-doped Silicon Carbide (ODC), or a Nitrogen-Doped Silicon Carbide (NDC). Etch stop layer 150 may be a single layer formed of a homogeneous material, or a composite layer including a plurality of sub-layers. In accordance with some embodiments of the present disclosure, etch stop layer 150 includes bottom layer 151 and upper layer 152 over bottom layer 151. In some embodiments, bottom layer 151 may comprise aluminum nitride (A1N) and upper layer 152 may comprise ODC. Etch stop layer 150 may be deposited by CVD, PVD, ALD, a spin-on-dielectric process, the like, or a combination thereof.

Dielectric layer 154 is formed over etch stop layer 150. Dielectric layer 154 may be formed in order to help isolate contacts 102/104/106/108 from each other and from other adjacent electrical routing lines that will be formed in and over dielectric layer 154. In some embodiments, dielectric layer 154 may be a porous material such as SiOCN, SiCN, SiOC, SiOCH, or the like and may be formed by initially forming a precursor layer over etch stop layer 150. The precursor layer may comprise both a matrix material and a porogen interspersed within the matrix material, or may alternatively comprise the matrix material without the porogen. In an embodiment the precursor layer may be formed, e.g., by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto etch stop layer 150, may also be utilized.

The matrix material, or base dielectric material, may be formed using a process such as PECVD, although any suitable process, such as a CVD, PVD, or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the dielectric layer 154. The porogen may be a material that is big enough to form the pores while also remaining small enough such that the size of the individual pores does not overly displace the matrix material. As such, the porogen may comprise an organic molecule such as alpha-terpinene (ATRP) (1-Isopropyl-4-Methyl-1,3-Cyclohexadiene) or Cyclooctane (boat shape) or 1,2-bis(triethoxysilyl) ethane Silicon.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the first dielectric layer 16. For example, an anneal of in a range from about 200° C. and about 500° C., such as about 400° C., for in a range from about 10 seconds to about 600 seconds, such as about 200 seconds, may be utilized.

However, as one of ordinary skill in the art will recognize, the thermal process described above is not the only method that may be utilized to remove the porogen from the matrix material to form dielectric layer 154. Other suitable processes, such as irradiating the porogen with UV radiation to decompose the porogen or utilizing microwaves to decompose the porogen, may alternatively be utilized. These and any other suitable processes to remove all or a portion of the porogen are all fully intended to be included within the scope of the embodiments.

Anti-Reflective coating Layer (ARL) 156, mask layer 157, and ARL 158 are formed over dielectric layer 154. ARL 156 may be a Nitrogen-Free ARL (NFARL), which may be formed of an oxide (free from nitrogen) in accordance with some embodiments. For example, ARL 156 may be a silicon oxide layer formed using any suitable deposition method, such as ALD, CVD, PECVD, a combination, or the like.

Mask layer 157 is formed over ARL 156. Mask layer 157 may also referred to as hard mask layer 157 hereinafter. In accordance with some embodiments, hard mask layer 157 includes a metal(s), which may be in the form of a metal nitride, for example, titanium nitride. Hard mask layer 157 may also be formed of a non-metal nitride such as silicon nitride, an oxynitride such as silicon oxynitride, or the like. Mask layer 157 may be formed using any suitable deposition method, such as ALD, CVD, PECVD, a combination, or the like.

ARL 158 may be further formed over hard mask layer 157. ARL 158 may also be an NFARL, which may be formed of an oxide, such as silicon oxide, and may be formed using PECVD. In some embodiments, ARL 158 is not formed.

FIGS. 15A-C through 22A-C illustrate the cross-sectional views of intermediate stages in the patterning of ARL 156, ARL 158, and mask layer 157 in accordance with some embodiments. The patterning of ARL 156, ARL 158, and mask layer 157 may be achieved through a two-patterning-two-etching (2P2E) process, wherein neighboring trenches are formed using different lithography processes, so that neighboring trenches may be located close to each other without incurring optical proximity effect. In other embodiments, more or less patterning and/or etching steps may be used.

For purposes of illustration, FIGS. 15A-C through 22A-C depict a 2P2E process in which ARL 156, ARL 158, and mask layer 157 overlying contacts 106/108 are patterned first, and ARL 156, ARL 158 and mask layer 157 overlying contacts 102/104 are patterned second. In other embodiments a different order of patterning may be used, or different combinations of contacts may be patterned together, or contacts may be individually patterned.

FIGS. 15A-C through 18A-C illustrate the intermediate stages in a first-photo-first-etching process for forming first trenches. In accordance with some embodiments, in FIGS. 15A-C a tri-layer is formed over layer ARL 158, which tri-layer includes bottom layer (also sometimes referred to as under layer) 160, middle layer 162 over bottom layer 160, and upper layer 164 over middle layer 162. In accordance with some embodiments, bottom layer 160 and upper layer 164 may be formed of photo resists. Middle layer 162 may be formed of an inorganic material, which may be a nitride (such as silicon nitride), an oxynitride (such as silicon oxynitride), an oxide (such as silicon oxide), or the like. Middle layer 162 may have a high etching selectivity relative to upper layer 164 and bottom layer 160. Therefore, upper layer 164 may be used as an etching mask for patterning middle layer 162, and middle layer 162 may be used as an etching mask for patterning bottom layer 160. As shown in FIGS. 15A-C, upper layer 164 is patterned to form openings 166 overlying contacts 106/108, which have the patterns of metal lines that are to be formed in dielectric layer 154.

Figure 16A:
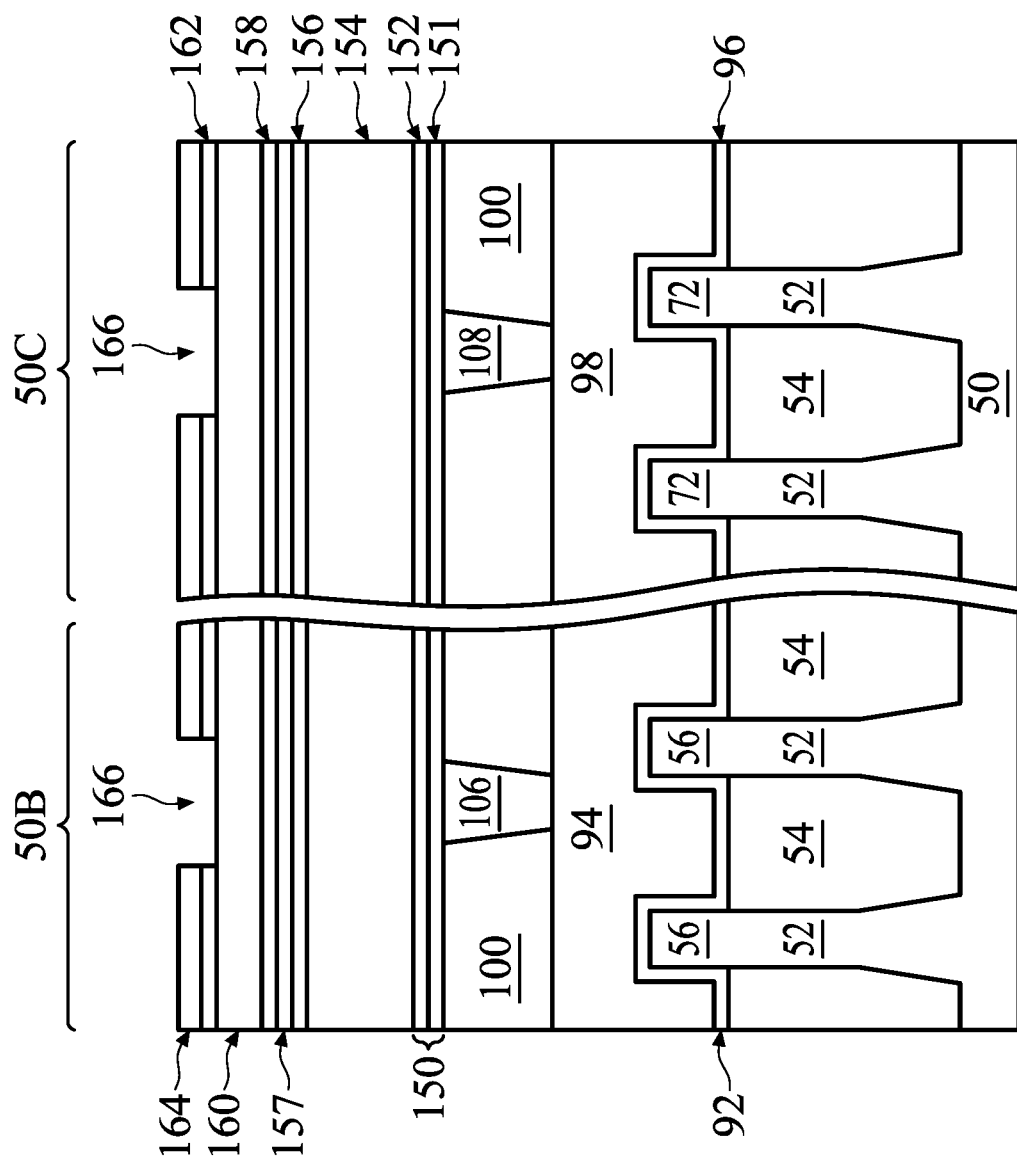
FIGS. 16A, 16B, and 16C are cross-sectional views of intermediate stages in the manufacture of a finFET device in accordance with some embodiments.
Figure 16C:
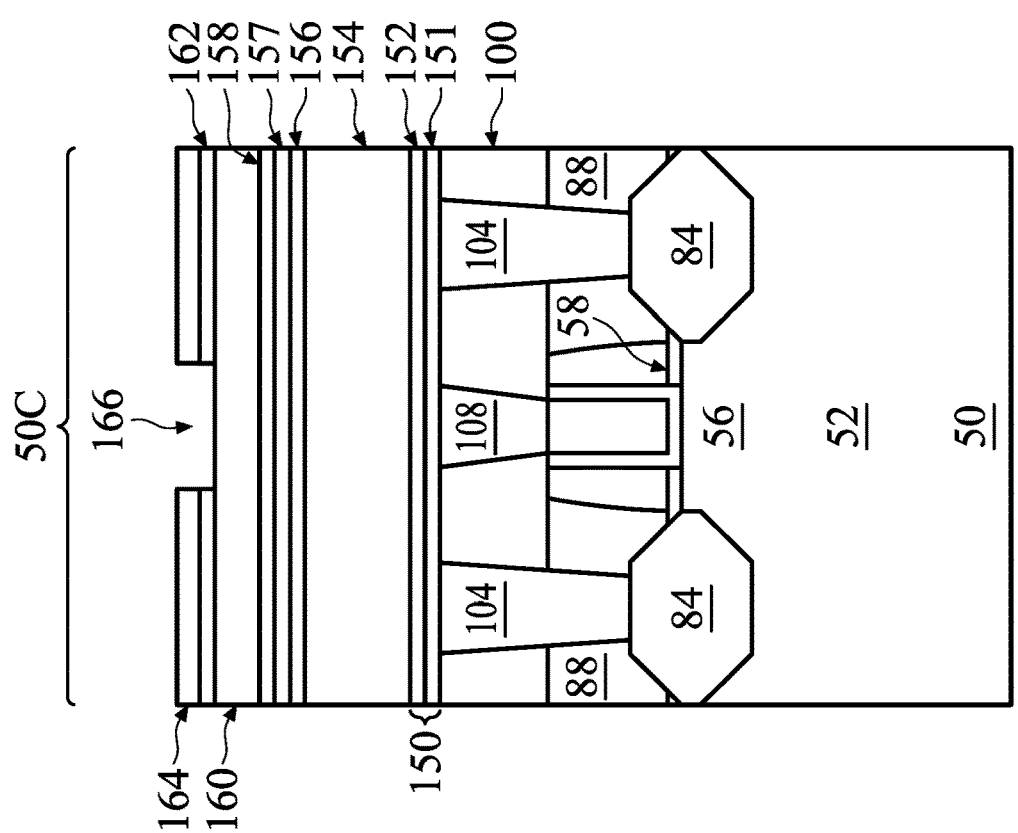
Figure 16B:
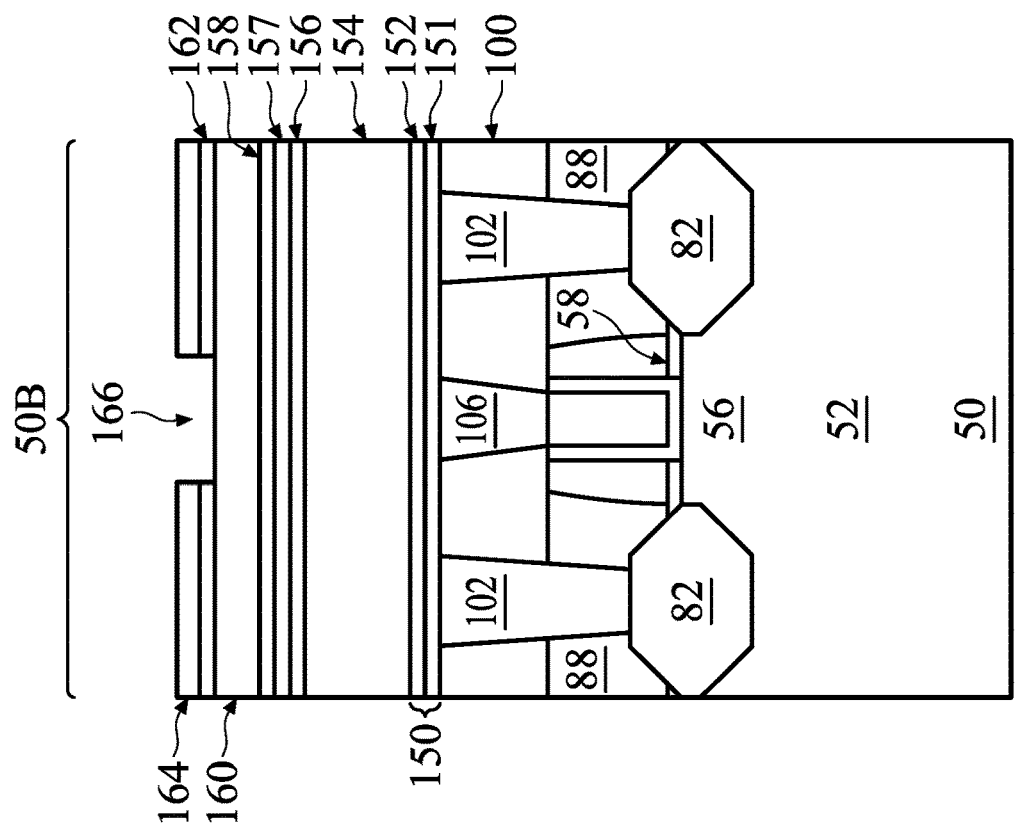
Figure 17A:
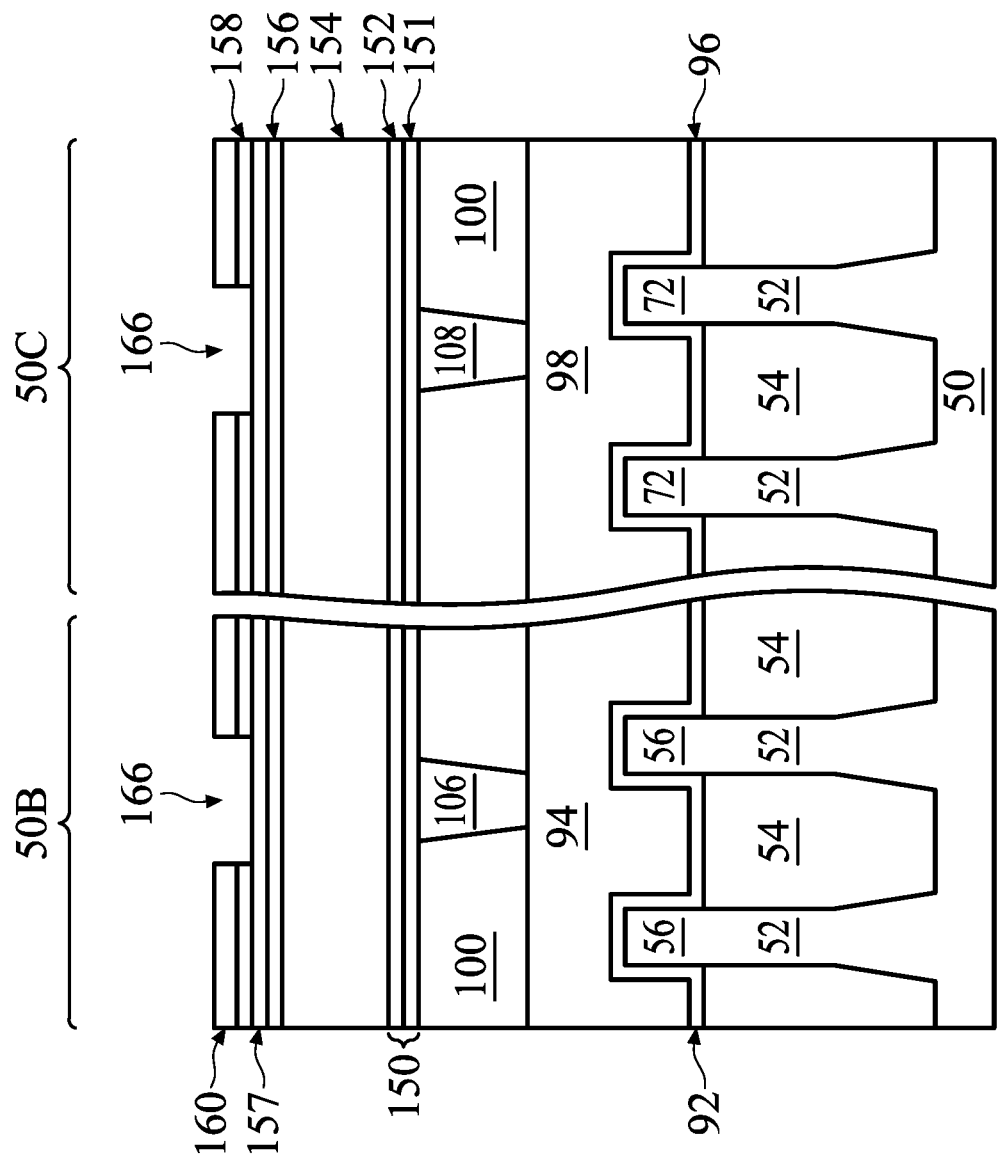
FIGS. 17A, 17B, and 17C are cross-sectional views of intermediate stages in the manufacture of a finFET device in accordance with some embodiments.
Figure 17C:
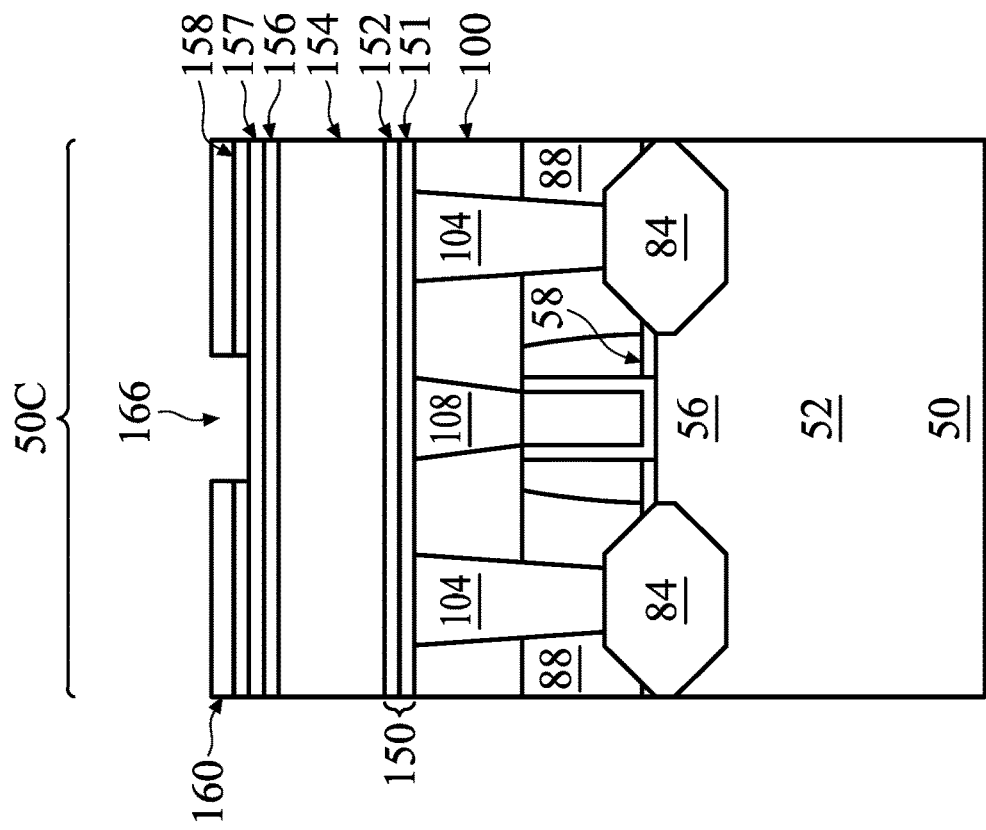
Figure 17B:
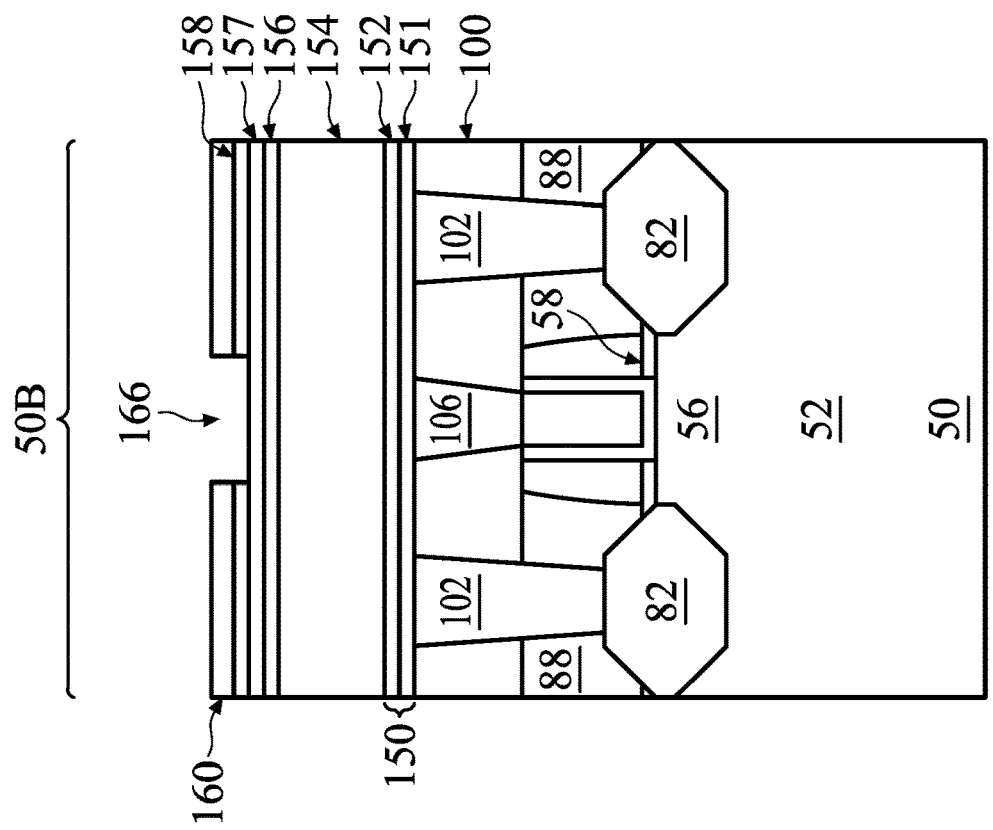

Next, referring to FIGS. 16A-C, middle layer 162 is etched using the patterned upper layer 164 as an etching mask, so that the pattern of upper layer 164 is transferred to middle layer 162. After middle layer 162 is etched through, bottom layer 160 is patterned as shown in FIGS. 17A-C, where middle layer 162 is used as an etching mask. During the patterning of bottom layer 160, upper layer 164 may be consumed. Middle layer 162 may be consumed also. Middle layer 162 may be removed if it has not been fully consumed during the patterning of bottom layer 160.

Bottom layer 160 is then used as an etching mask to etch underlying ARL 158. Opening 166 therefore extends into ARL 158, with the top surface of mask layer 157 exposed to opening 166 after the etching of ARL 158. During the patterning of ARL 158, bottom layer 160 is also consumed, although at a lower etching rate than middle layer 162 (FIGS. 16A-C) and ARL 158. Hence, at the time the patterning of ARL 158 is finished, the thickness of bottom layer 160 is reduced. The resulting structure is shown in FIGS. 17A-C.

Figure 18A:
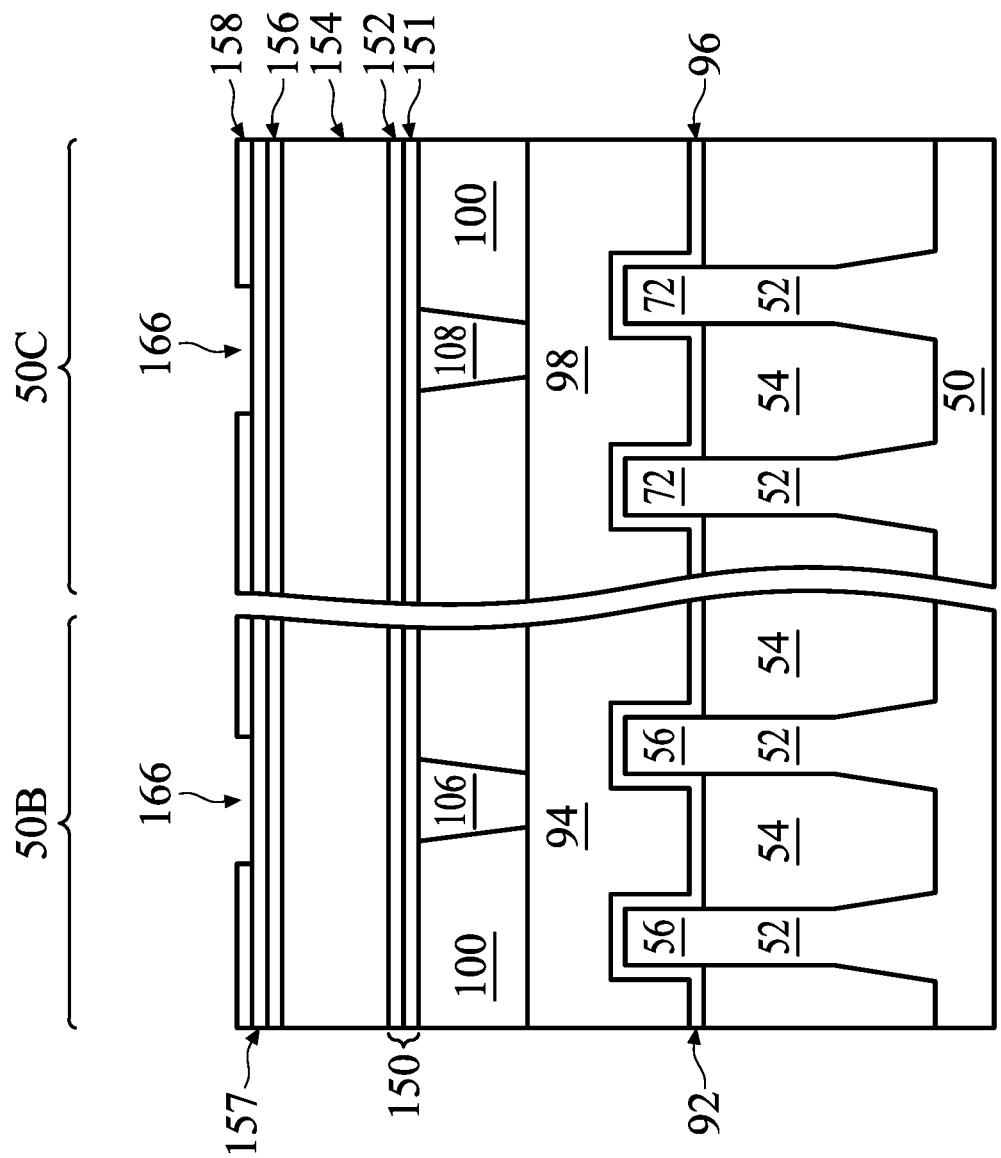
FIGS. 18A, 18B, and 18C are cross-sectional views of intermediate stages in the manufacture of a finFET device in accordance with some embodiments.
Figure 18C:
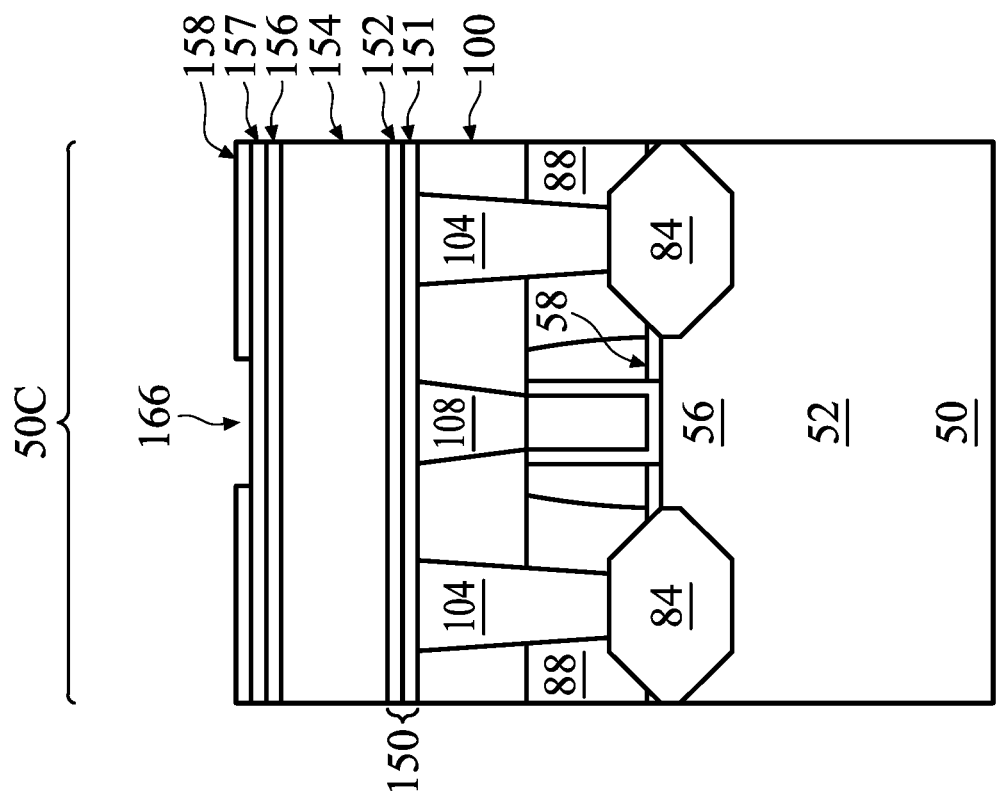
Figure 18B:
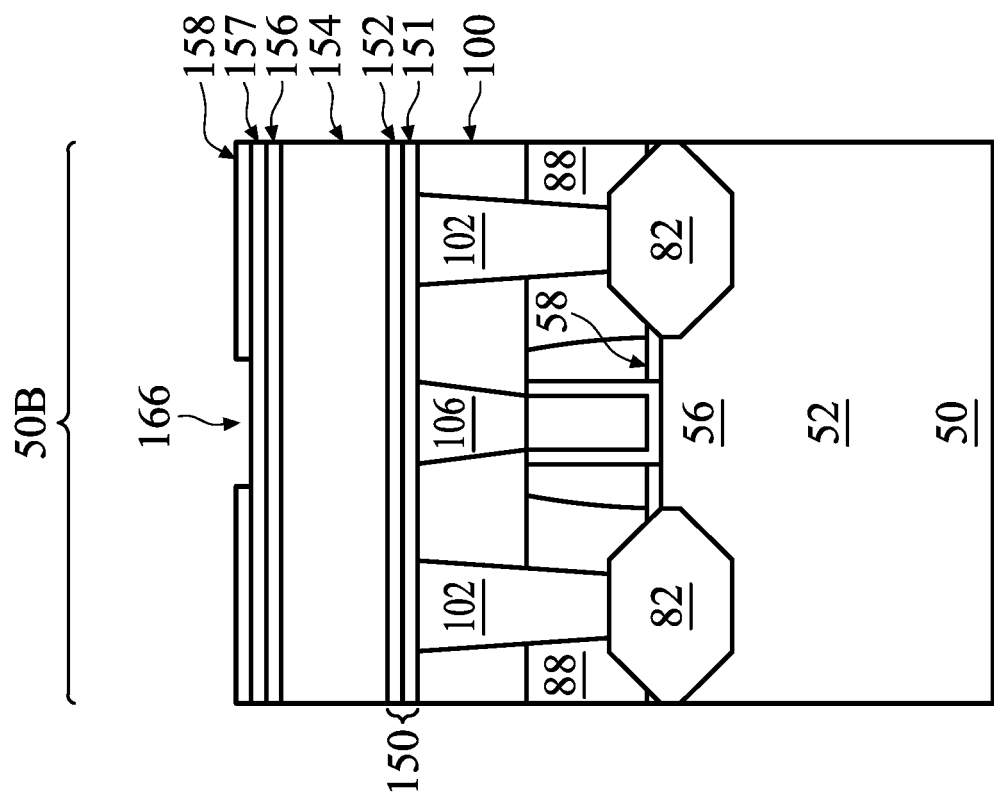

After the etching, the remaining bottom layer 160, which may comprise photo resist, is removed. For example, bottom layer 160 may be removed in an ashing process, where oxygen is used to remove bottom layer 160 in accordance with some embodiments. The resulting structure is shown in FIGS. 18A-C.

Figure 19A:
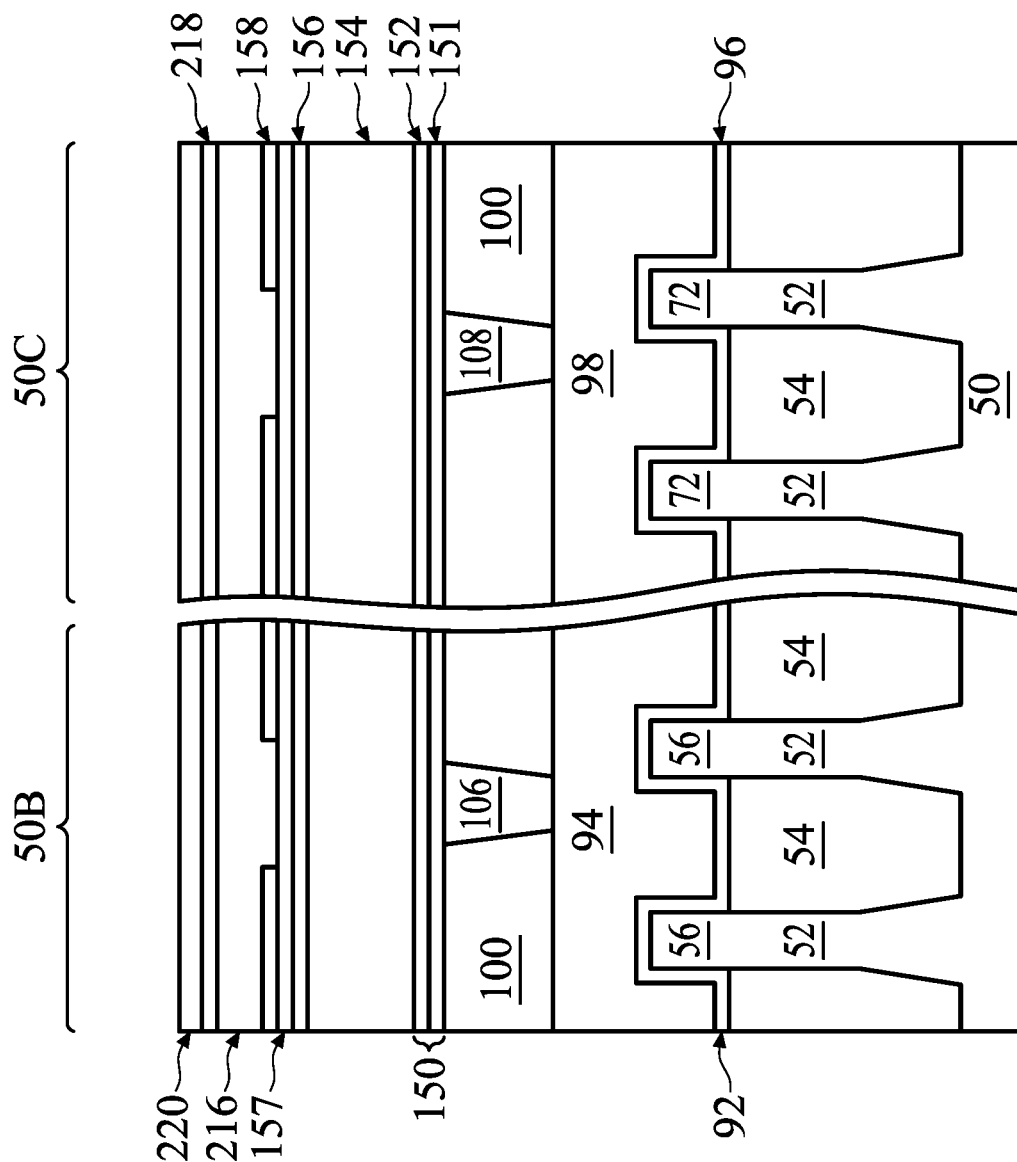
FIGS. 19A, 19B, and 19C are cross-sectional views of intermediate stages in the manufacture of a finFET device in accordance with some embodiments.
Figure 19C:
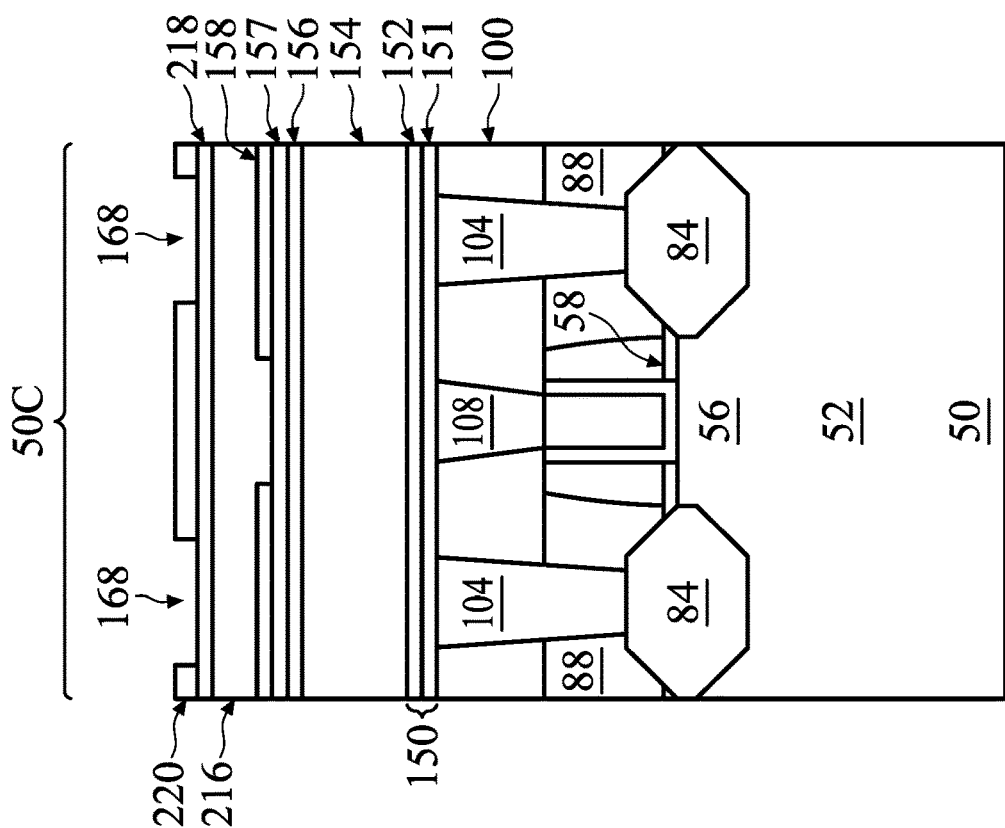
Figure 19B:
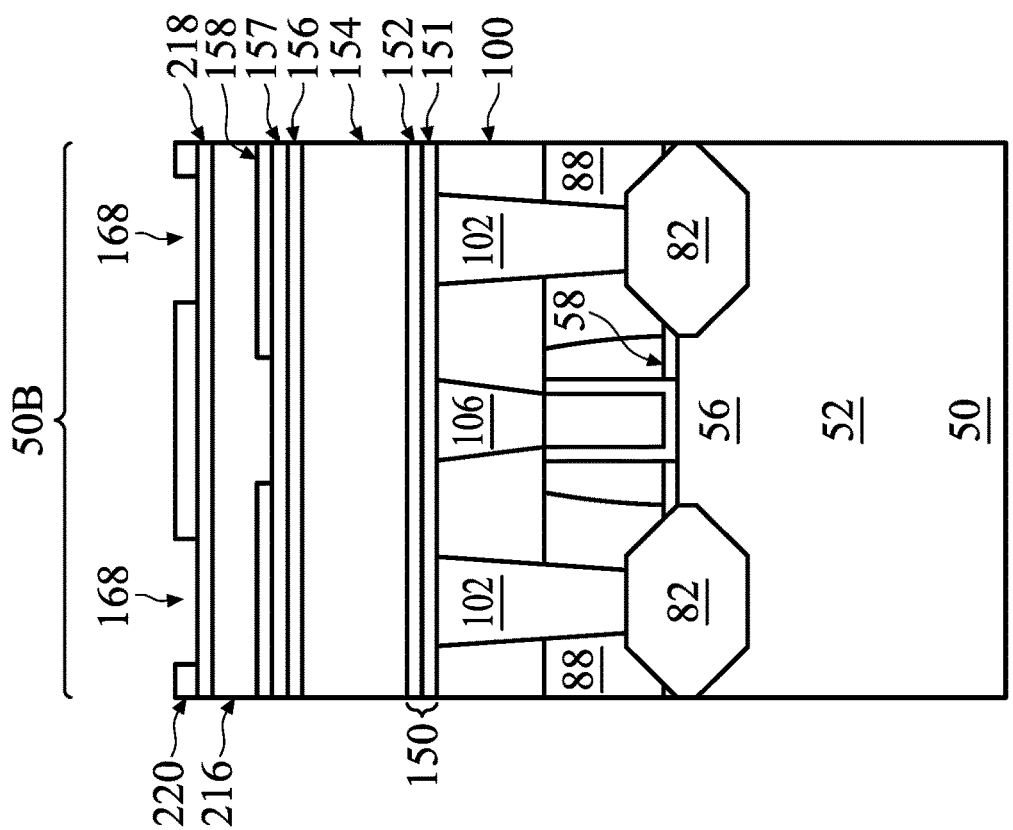

FIGS. 19A-C through 21A-C illustrate a second-photo-second-etching process in the patterning of ARL 158 to form a second trench. In accordance with some embodiments, a second tri-layer is formed over ARL 158, as shown in FIGS. 19A-C. The second tri-layer includes bottom layer 216, middle layer 218 over bottom layer 216, and upper layer 220 over middle layer 218. As described above, in accordance with some embodiments, bottom layer 216 and upper layer 220 may be formed of photo resists. Middle layer 218 may be formed of an inorganic material, which may be a nitride (such as silicon nitride), an oxynitride (such as silicon oxynitride), an oxide (such as silicon oxide), or the like. Middle layer 218 may have a high etching selectivity with relative to upper layer 220 and bottom layer 216, and therefore upper layer 220 may be used as an etching mask for patterning middle layer 218, and middle layer 218 may be used as an etching mask for patterning bottom layer 216. Upper layer 220 is patterned to form openings 168, which have the pattern of metal lines that are to be formed in dielectric layer 154.

Figure 20A:
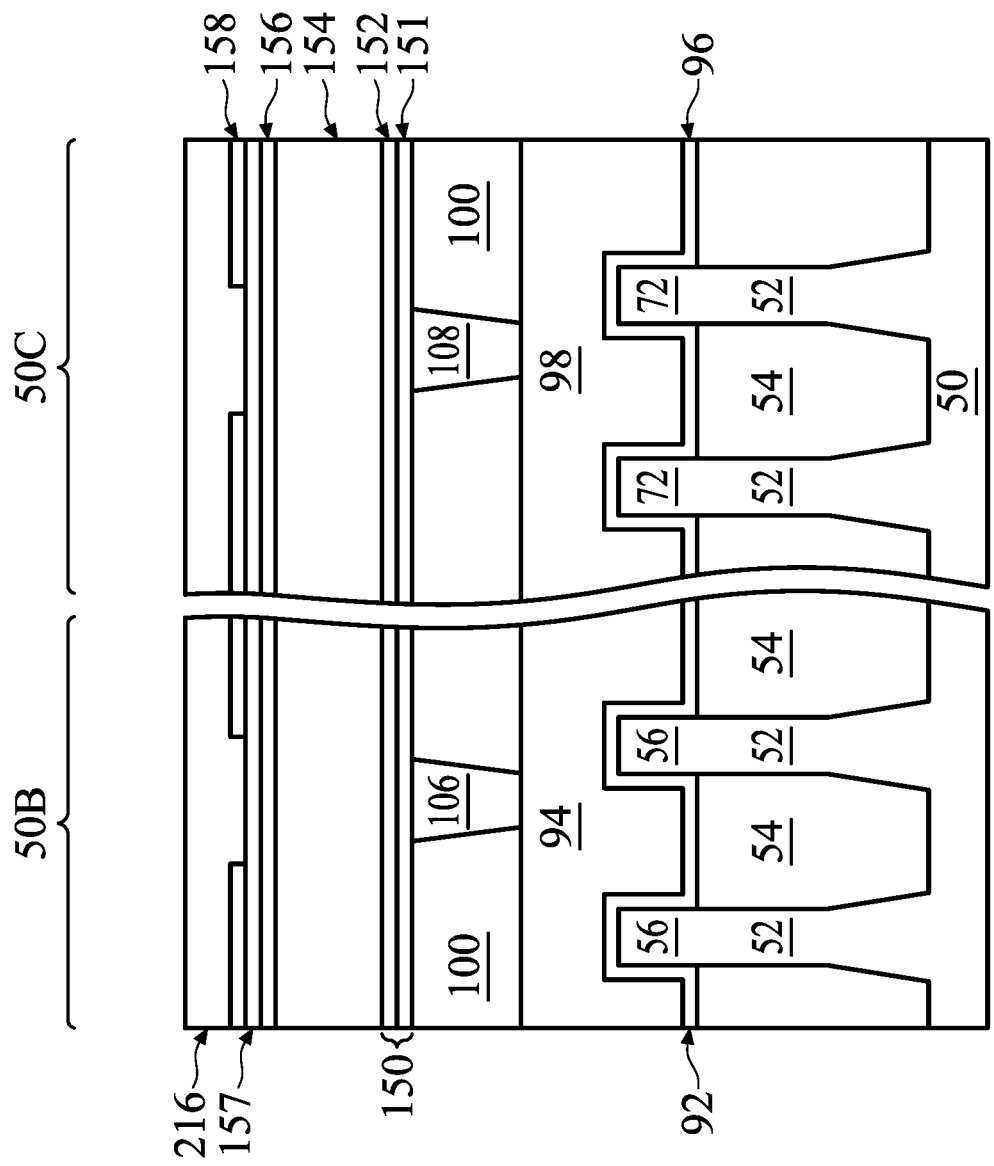
FIGS. 20A, 20B, and 20C are cross-sectional views of a finFET device in a process chamber in accordance with some embodiments.
Figure 20C:
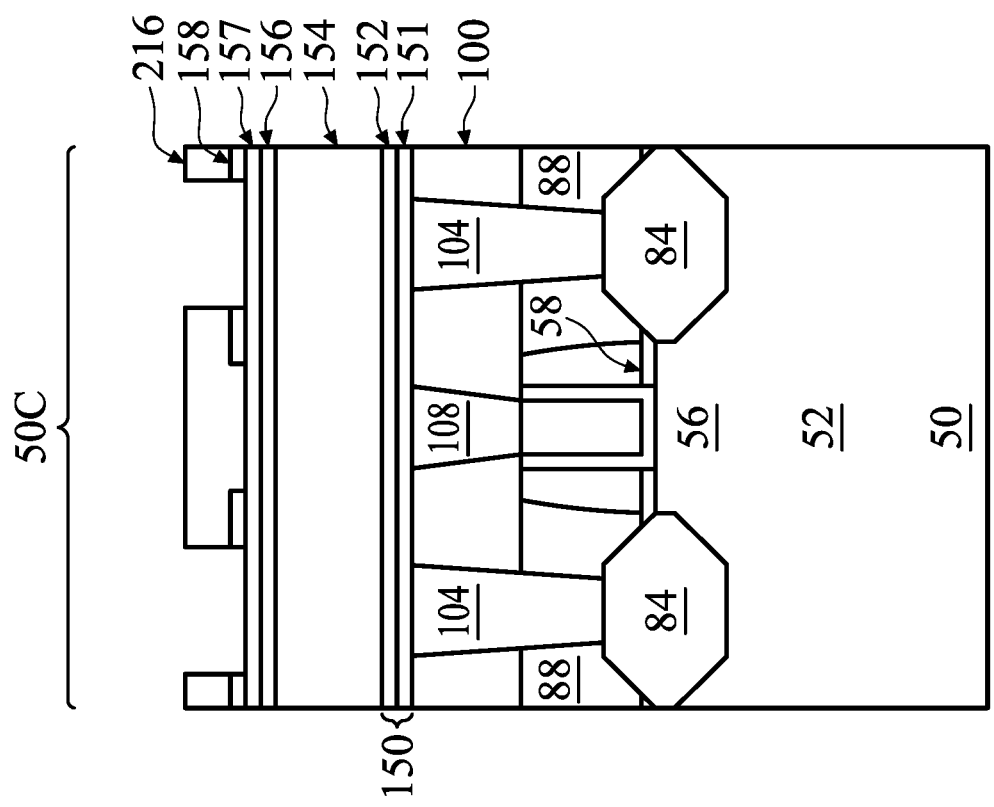
Figure 20B:
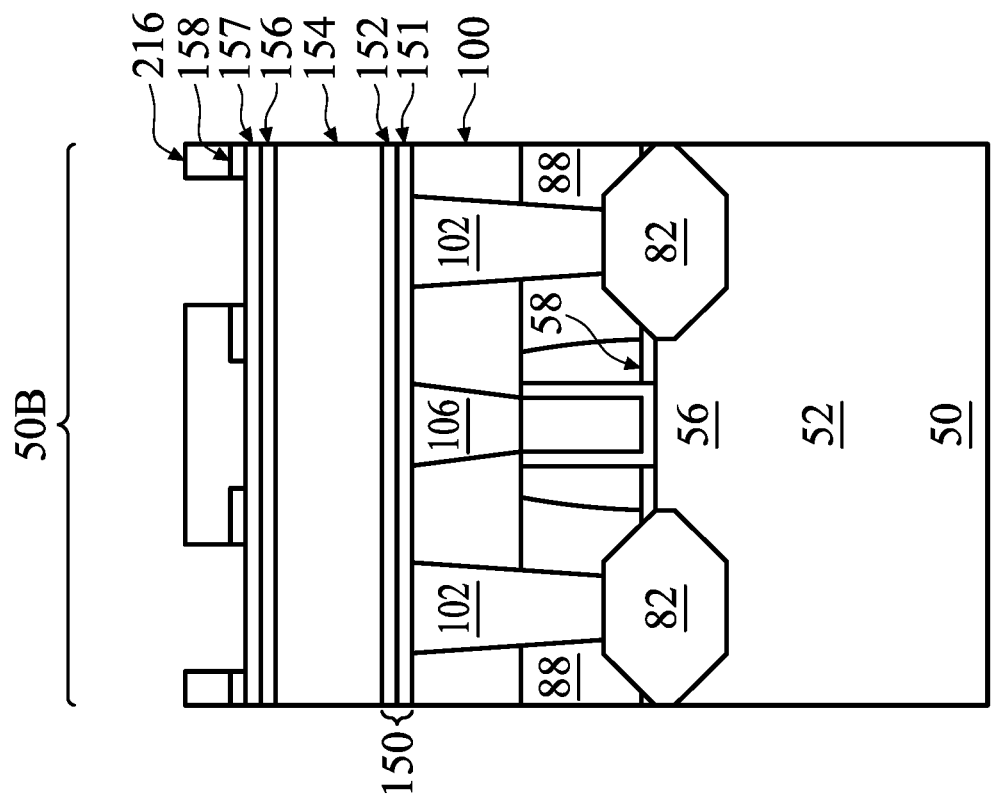
Figure 21A:
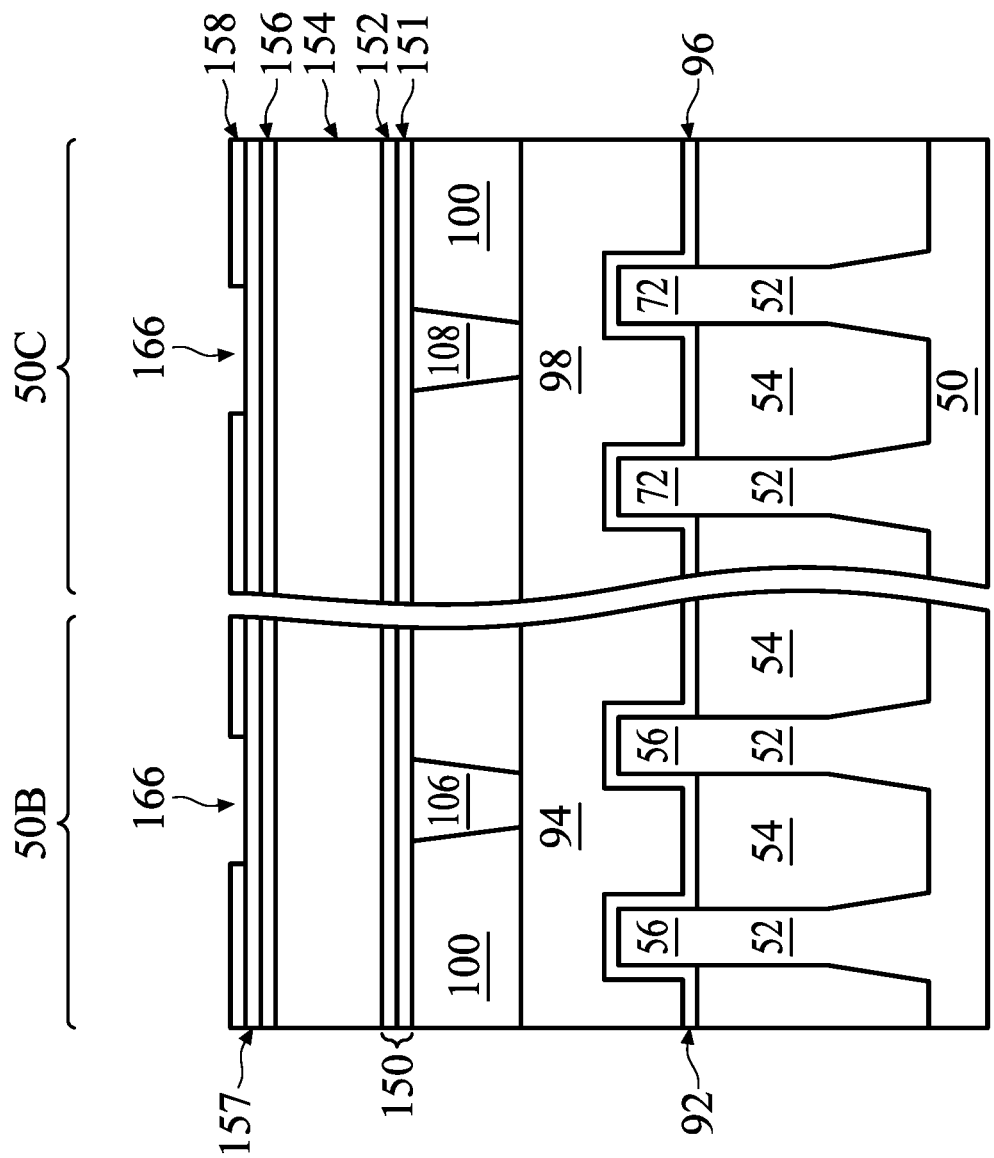
FIGS. 21A, 21B, and 21C are cross-sectional views of intermediate stages in the manufacture of a finFET device in accordance with some embodiments.
Figure 21C:
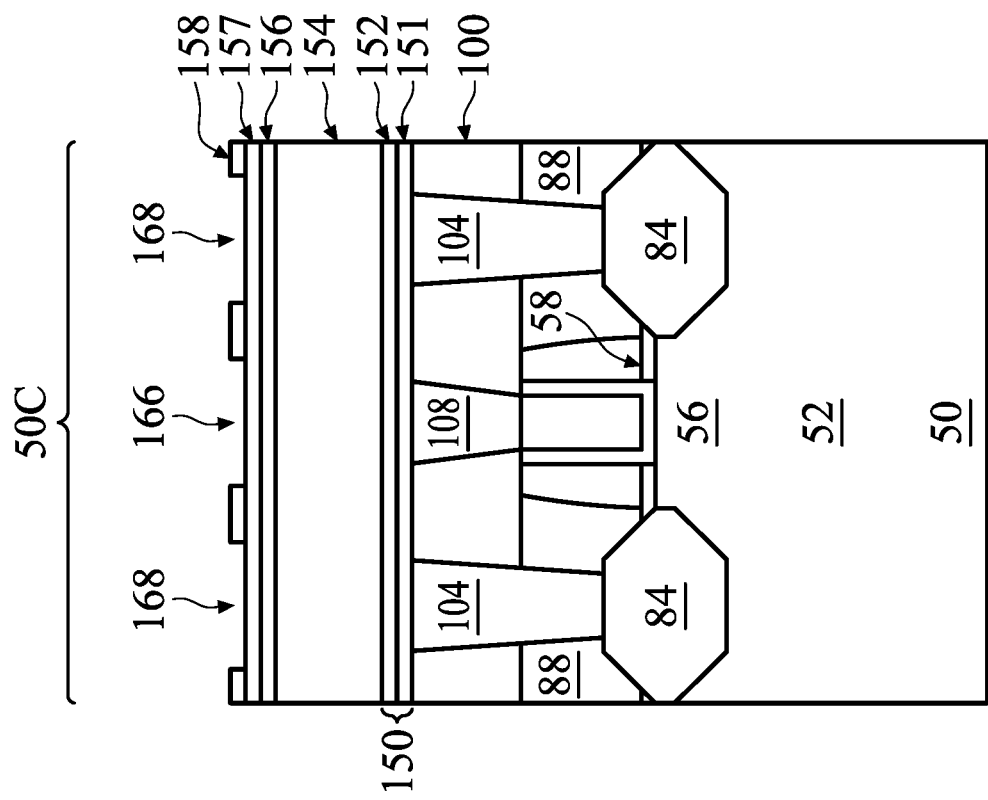
Figure 21B:
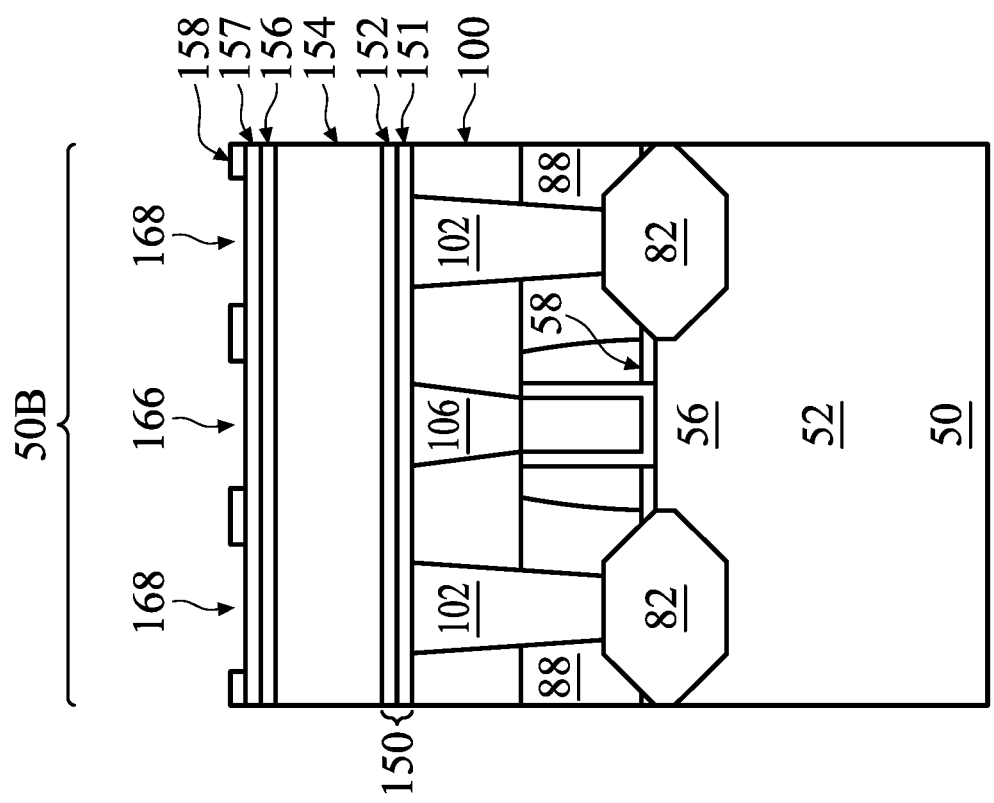

As described above, middle layer 218 may be etched using the patterned upper layer 164 as an etching mask, so that the pattern of upper layer 220 is transferred into middle layer 218, bottom layer 216, and then into ARL 158. The resulting structure is shown in FIGS. 20A-C. After the pattern transfer, remaining bottom layer 216, which may comprise a photo resist, may be removed. Bottom layer 216 may be removed in an ashing process using oxygen in some embodiments. ARL 158 thus includes both openings 166 and 168, as shown in FIGS. 21A-C.

Figure 22A:
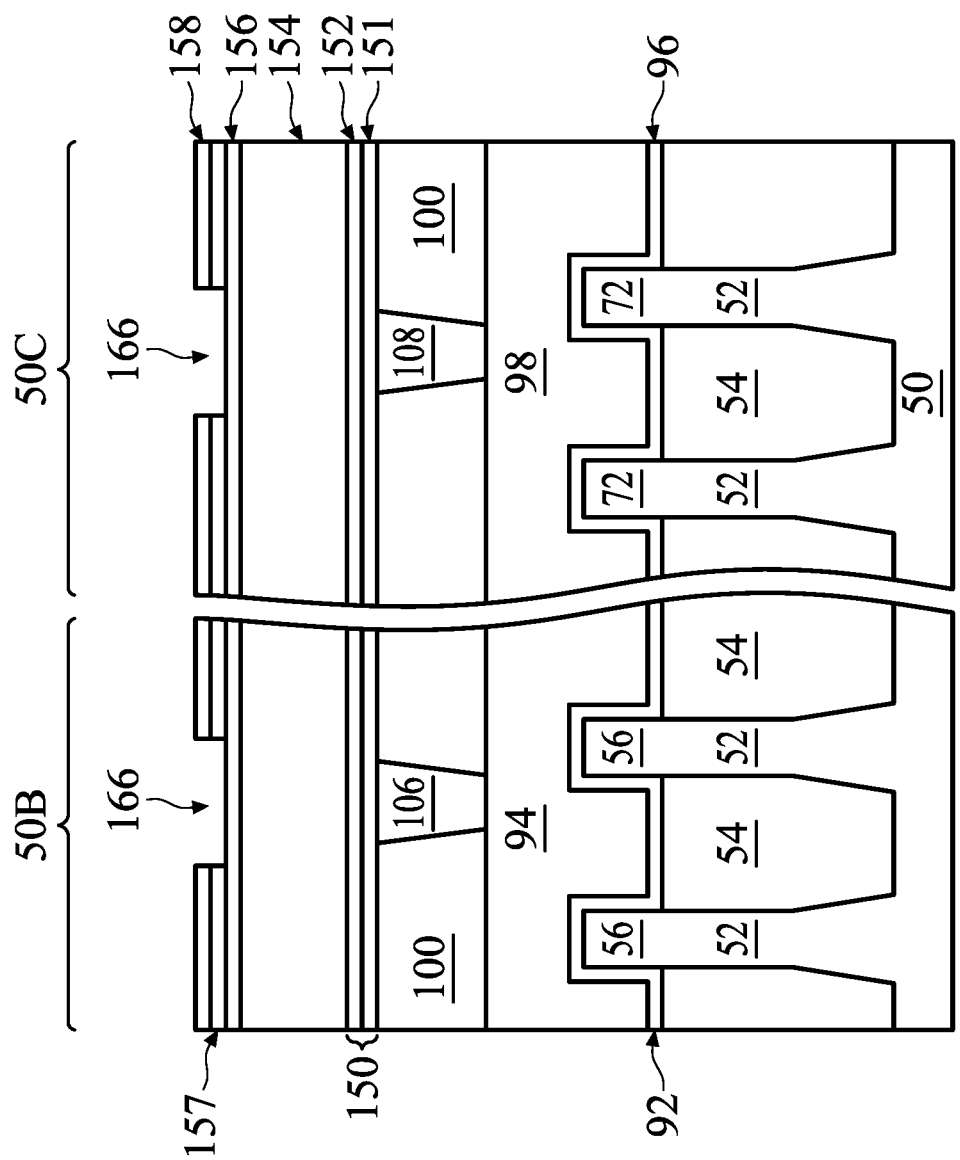
FIGS. 22A, 22B, and 22C are cross-sectional views of intermediate stages in the manufacture of a finFET device in accordance with some embodiments.
Figure 22C:
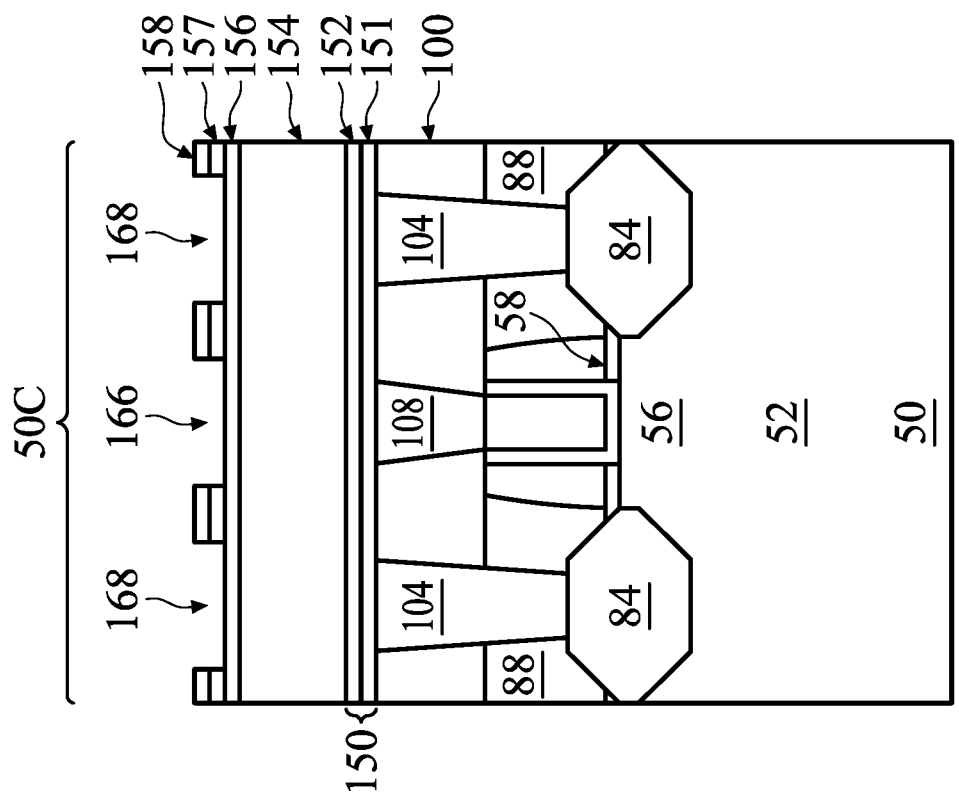
Figure 22B:
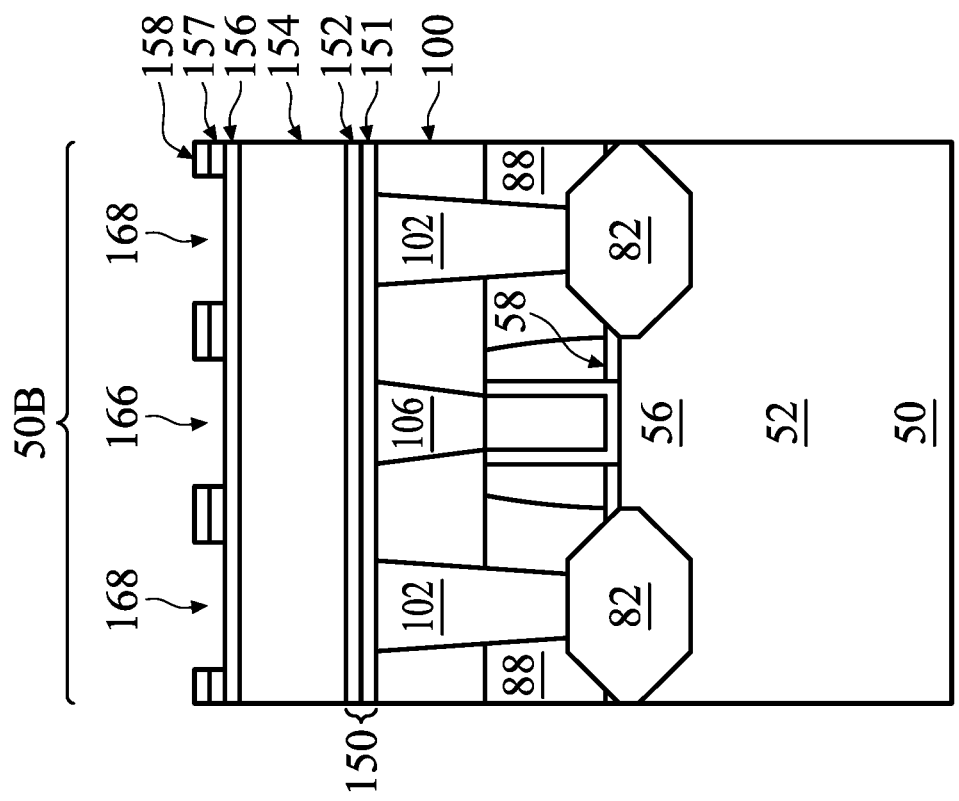

Next, as shown in FIGS. 22A-C, mask layer 157 is etched using the patterned ARL 158 as an etching mask, so that openings 166 and 168 extend into mask layer 157. ARL 156 is exposed by the etching process, and may be used as an etch stop layer in the etching of mask layer 157. Any suitable etching process may be used, such as wet etching or dry etching.

Figure 23A:
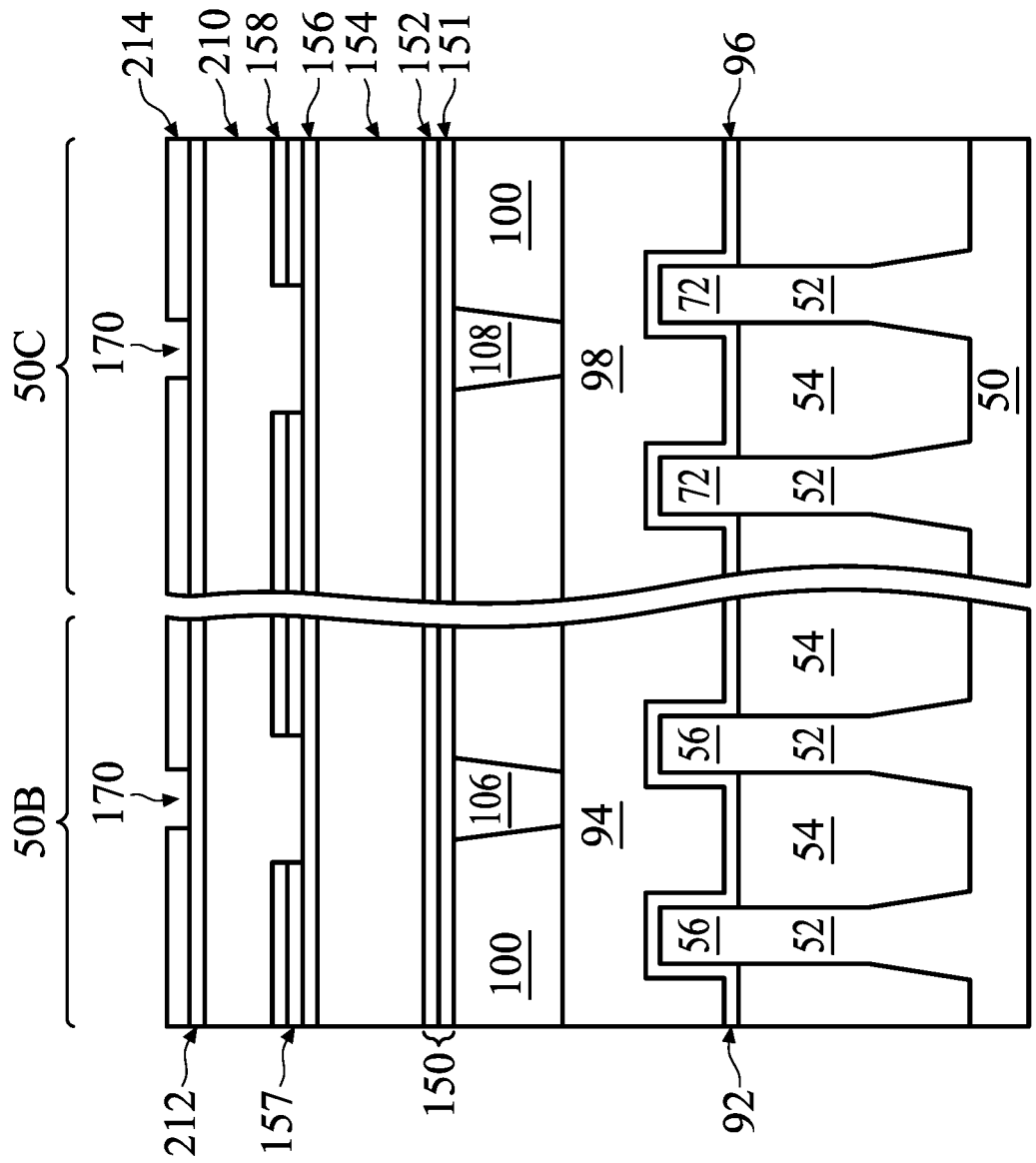
FIGS. 23A, 23B, and 23C are cross-sectional views of intermediate stages in the manufacture of a finFET device in accordance with some embodiments.
Figure 23C:
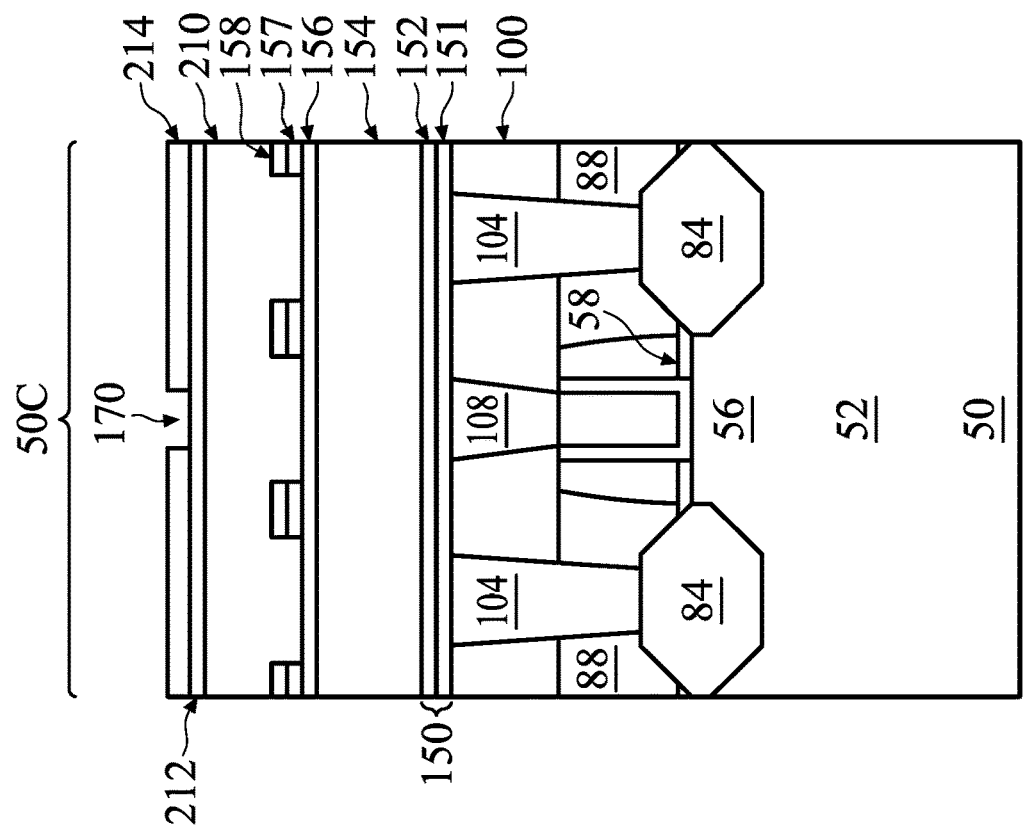
Figure 23B:
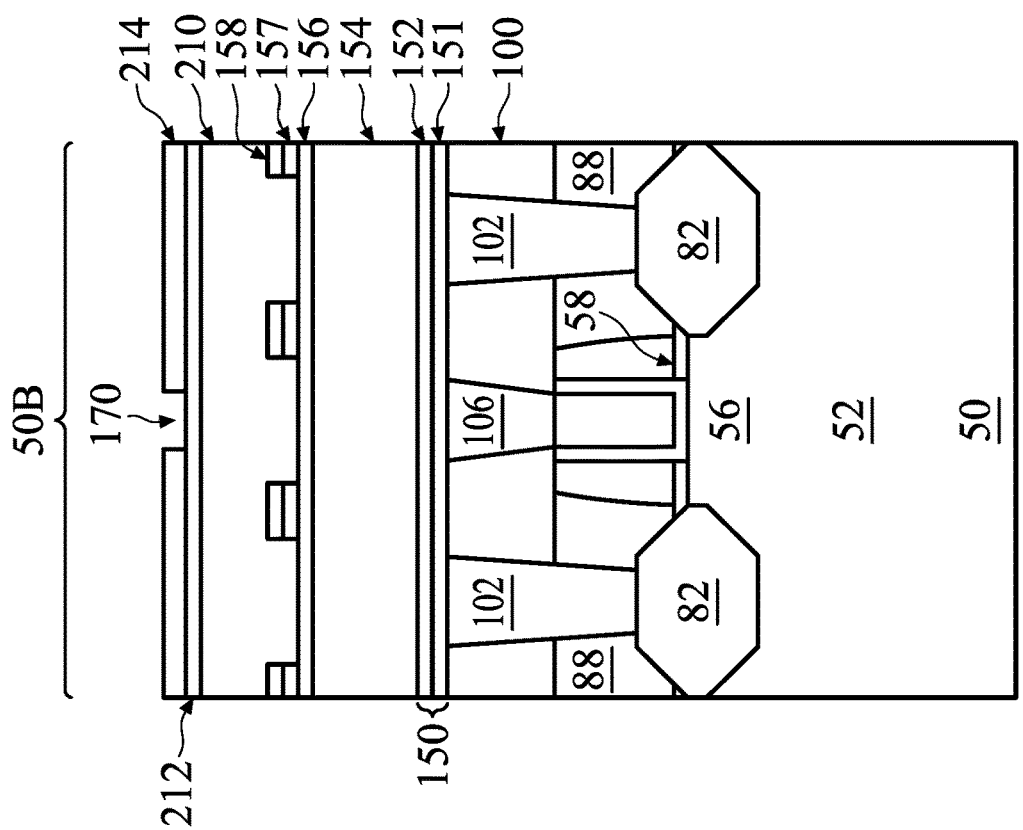
Figure 24A:
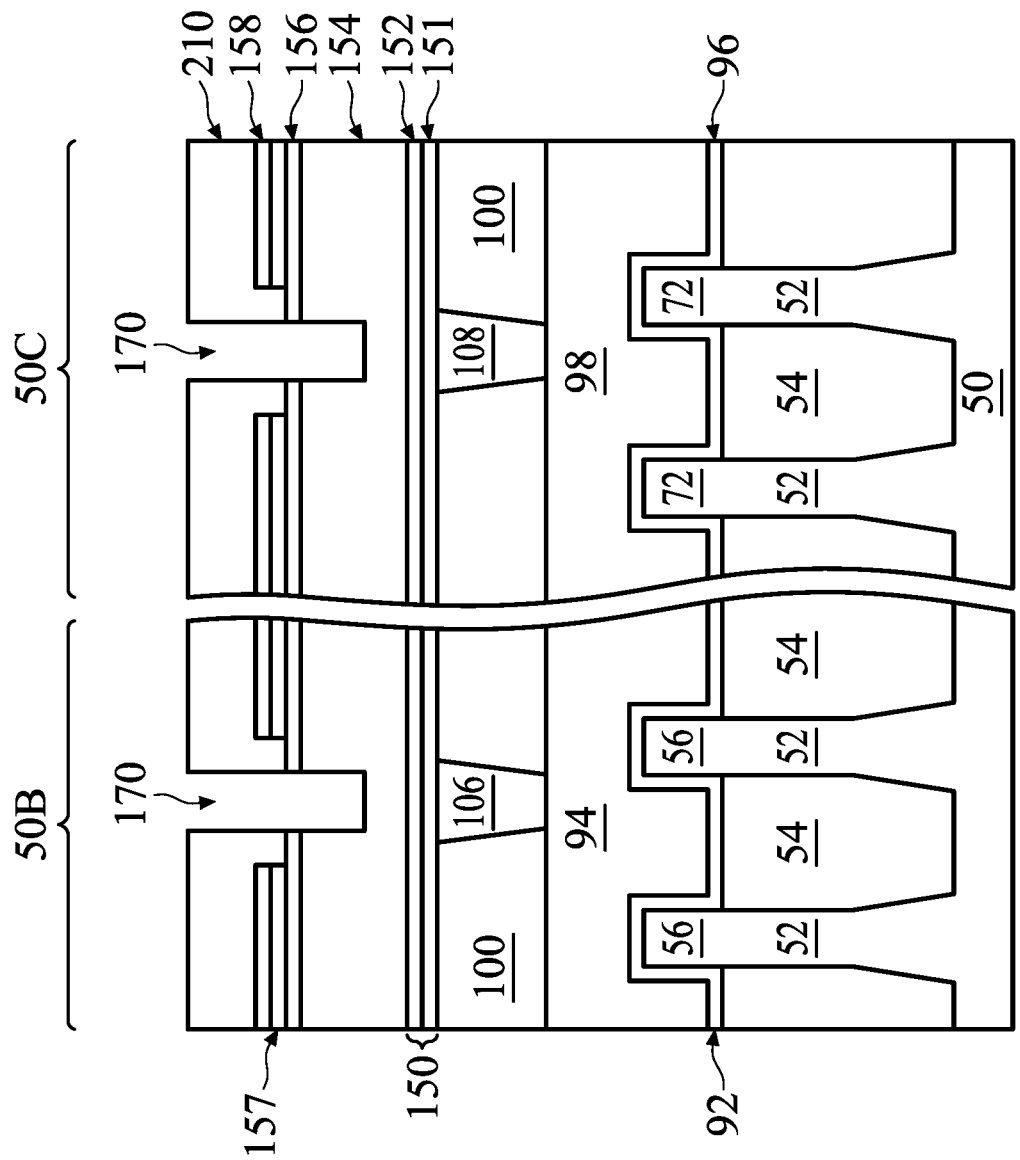
FIGS. 24A, 24B, and 24C are cross-sectional views of intermediate stages in the manufacture of a finFET device in accordance with some embodiments.
Figure 24C:
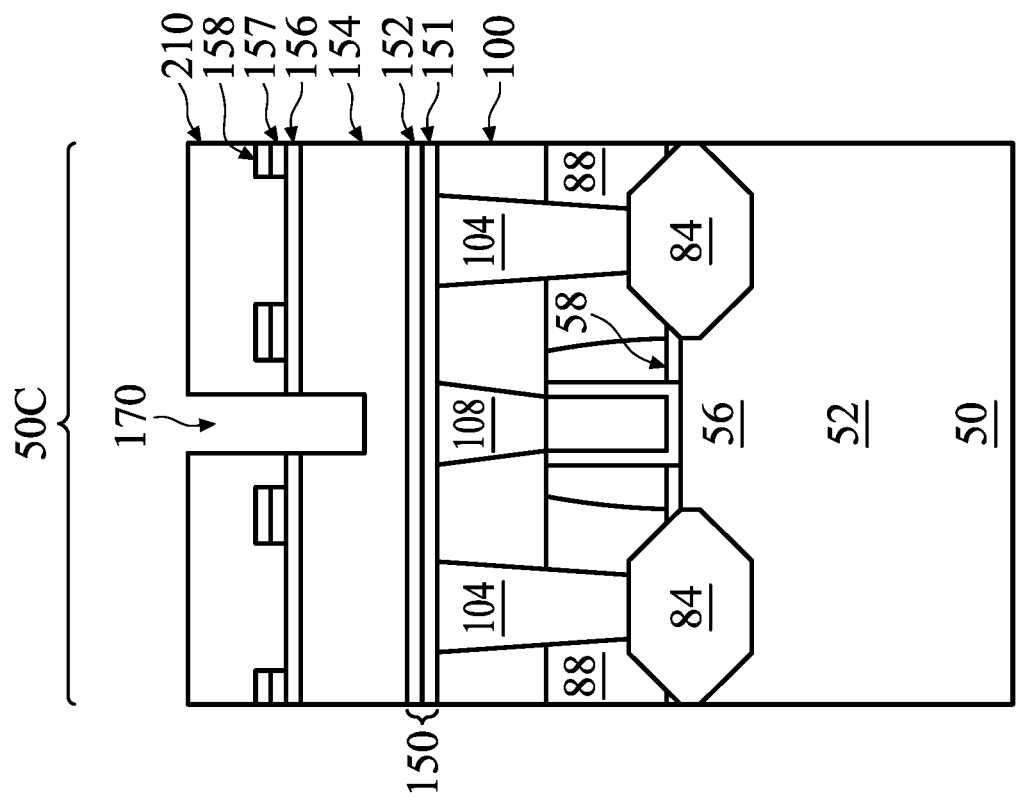
Figure 24B:
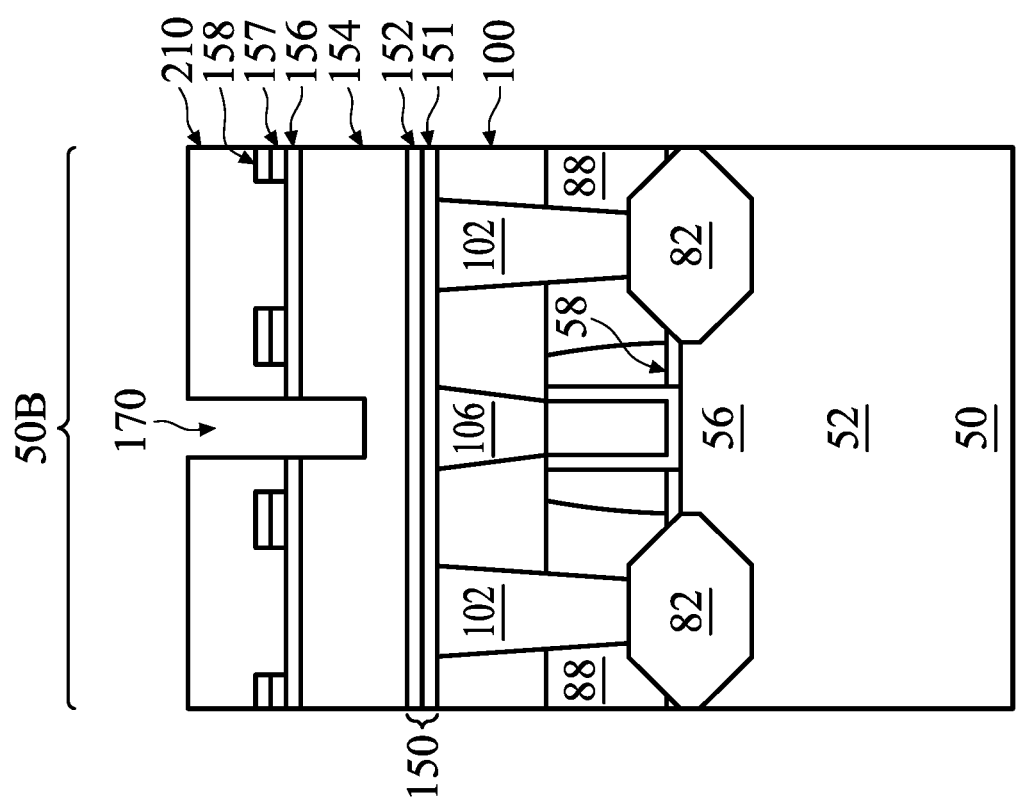
Figure 25A:
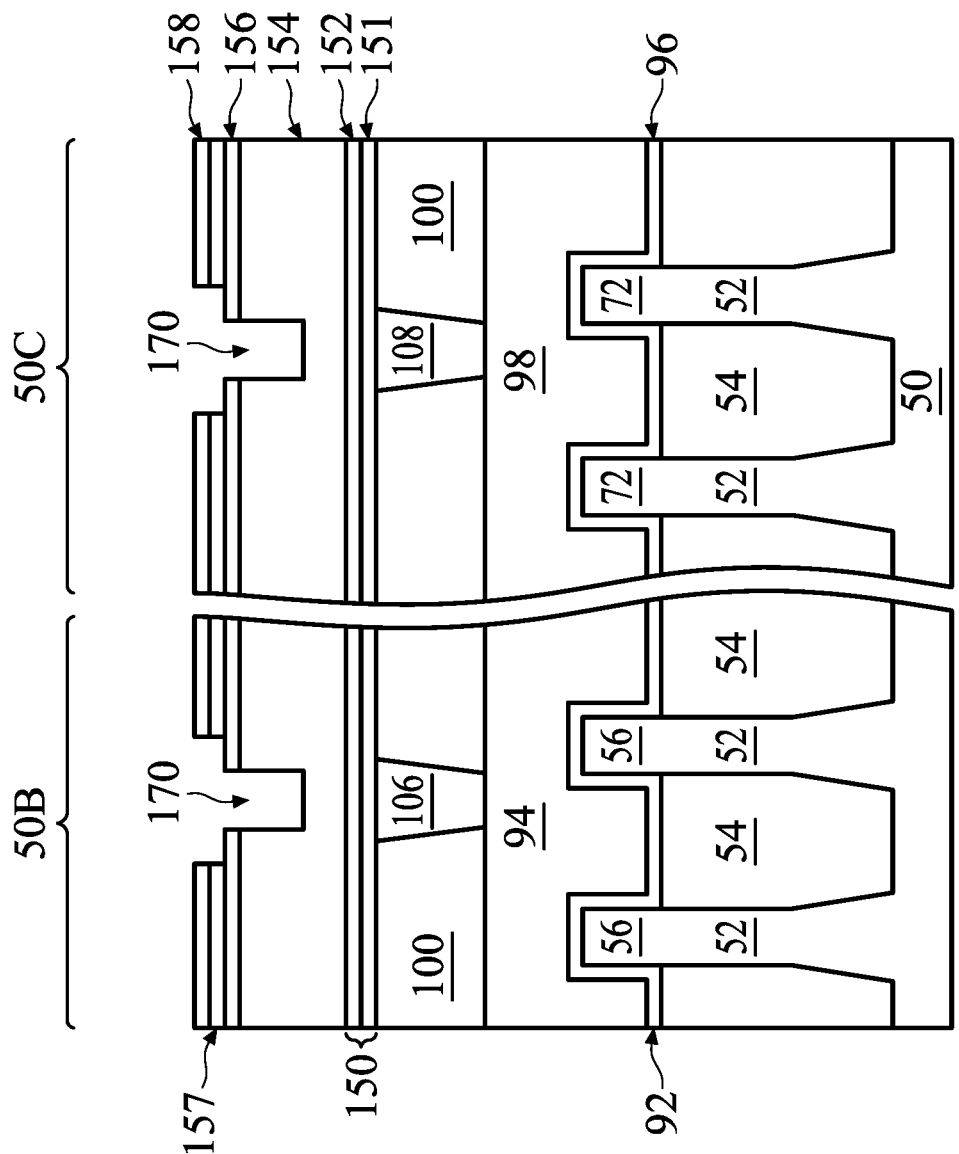
FIGS. 25A, 25B, and 25C, are cross-sectional views of intermediate stages in the manufacture of a finFET device in accordance with some embodiments.
Figure 25C:
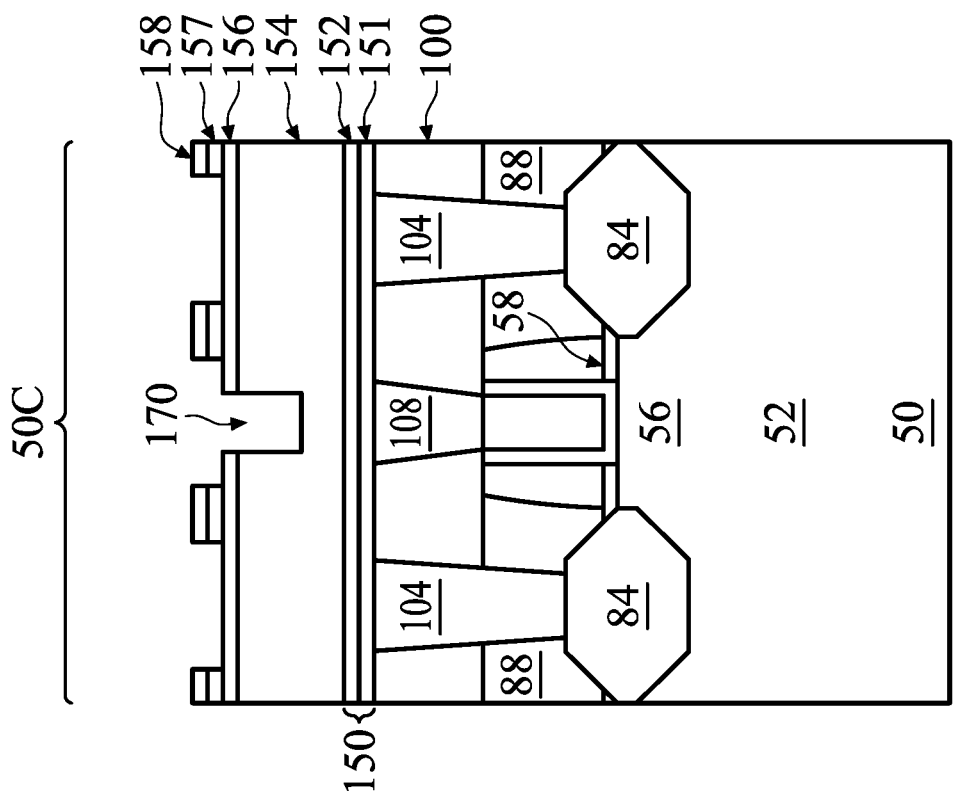
Figure 25B:
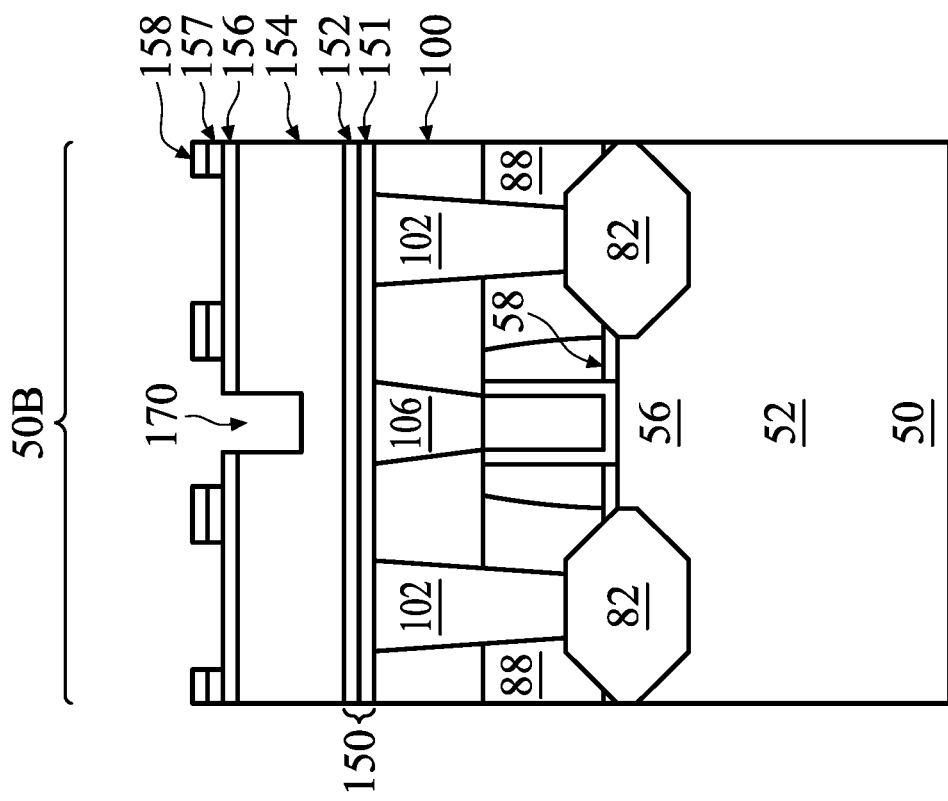

FIGS. 23A-C through 28A-C illustrate a 2P2E process for forming via patterns. FIGS. 23A-C through 25A-C illustrate the formation of a first via pattern. Referring to FIG. 23A-C, a tri-layer including bottom layer 210, middle layer 212, and upper layer 214 is formed. Upper layer 214 is patterned to include openings 170, which have the patterns of subsequently formed vias. Next, middle layer 212, bottom layer 210, ARL 156, and dielectric layer 154 are etched, and openings 170 extend into dielectric layer 154. The resulting structure is shown in FIGS. 24A-C. The bottoms of openings 170 are at an intermediate level (such as at the middle) between a top surface and a bottom surface of dielectric layer 154. For example, in some embodiments a timing parameter of the etching process may be controlled so that the etching process terminates when the bottoms of openings 170 are at the desired intermediate level. Upper layer 214 and middle layer 212 (shown in FIGS. 23A-C) may be consumed when the formation of openings 170 is finished. The remaining bottom layer 210 is removed, for example, in an ashing process, and the resulting structure is shown in FIGS. 25A-C.

Figure 26A:
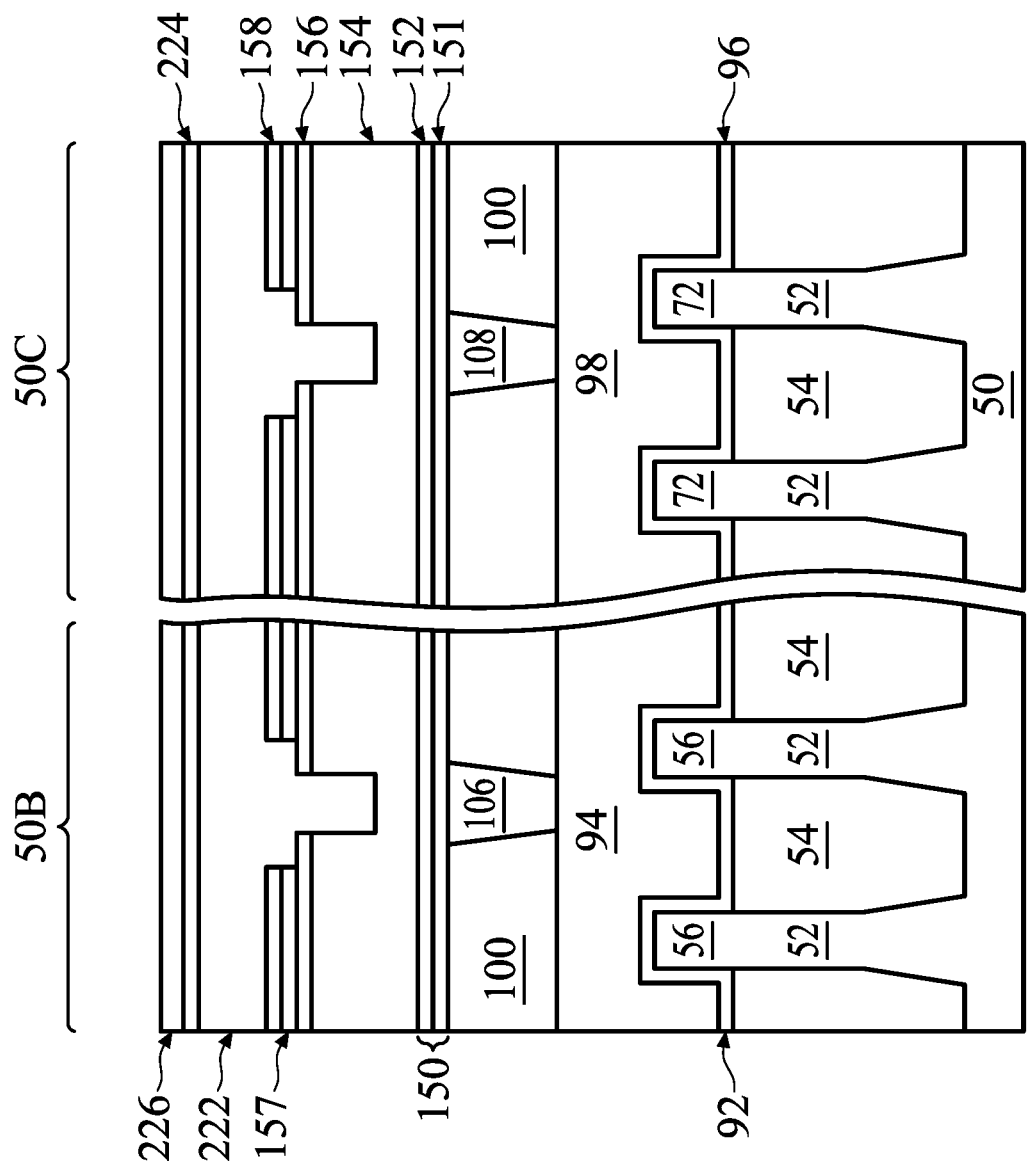
FIGS. 26A, 26B, and 26C are cross-sectional views of intermediate stages in the manufacture of a finFET device in accordance with some embodiments.
Figure 26C:
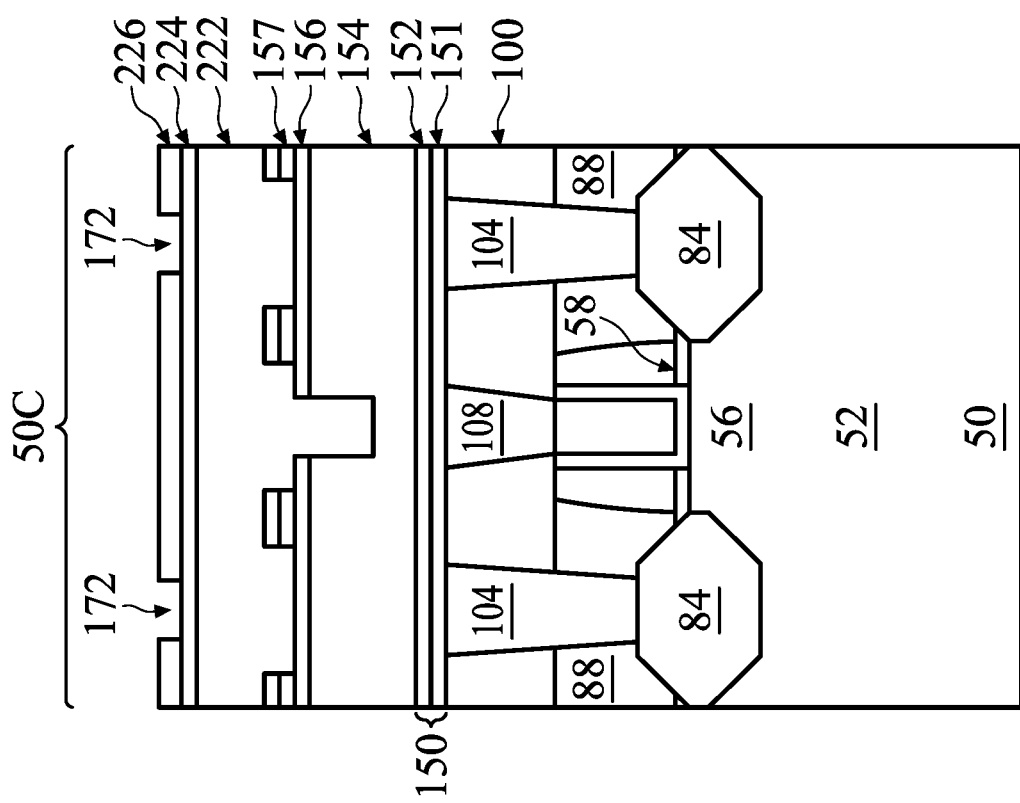
Figure 26B:
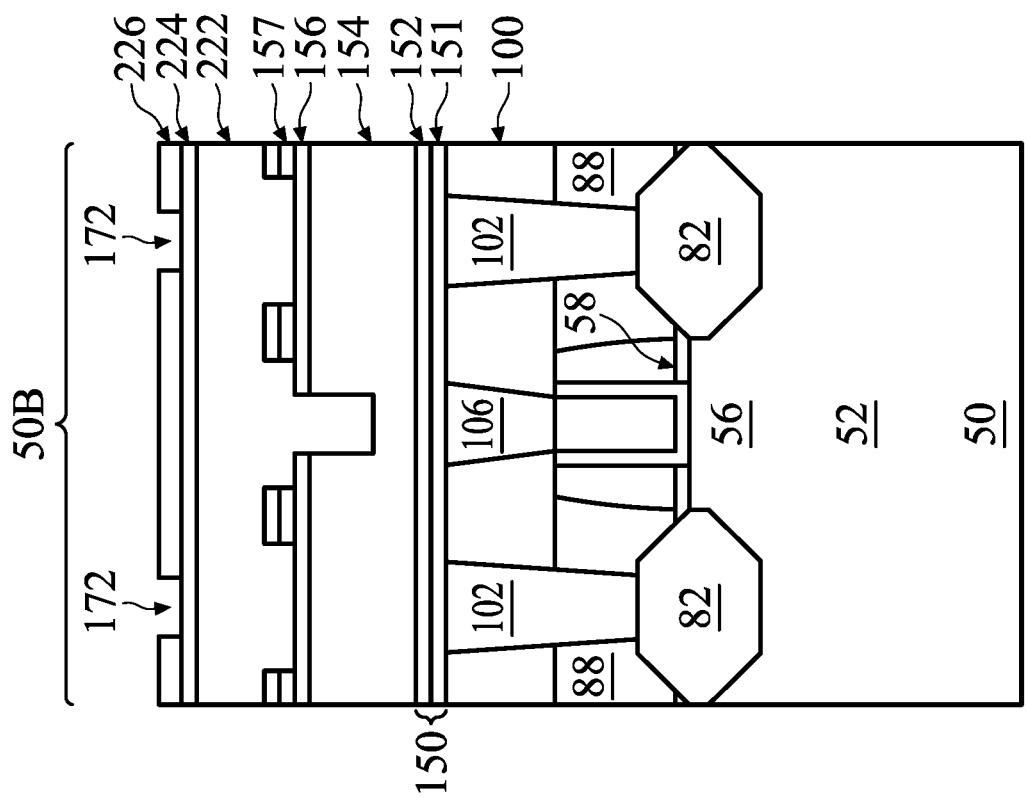
Figure 27A:
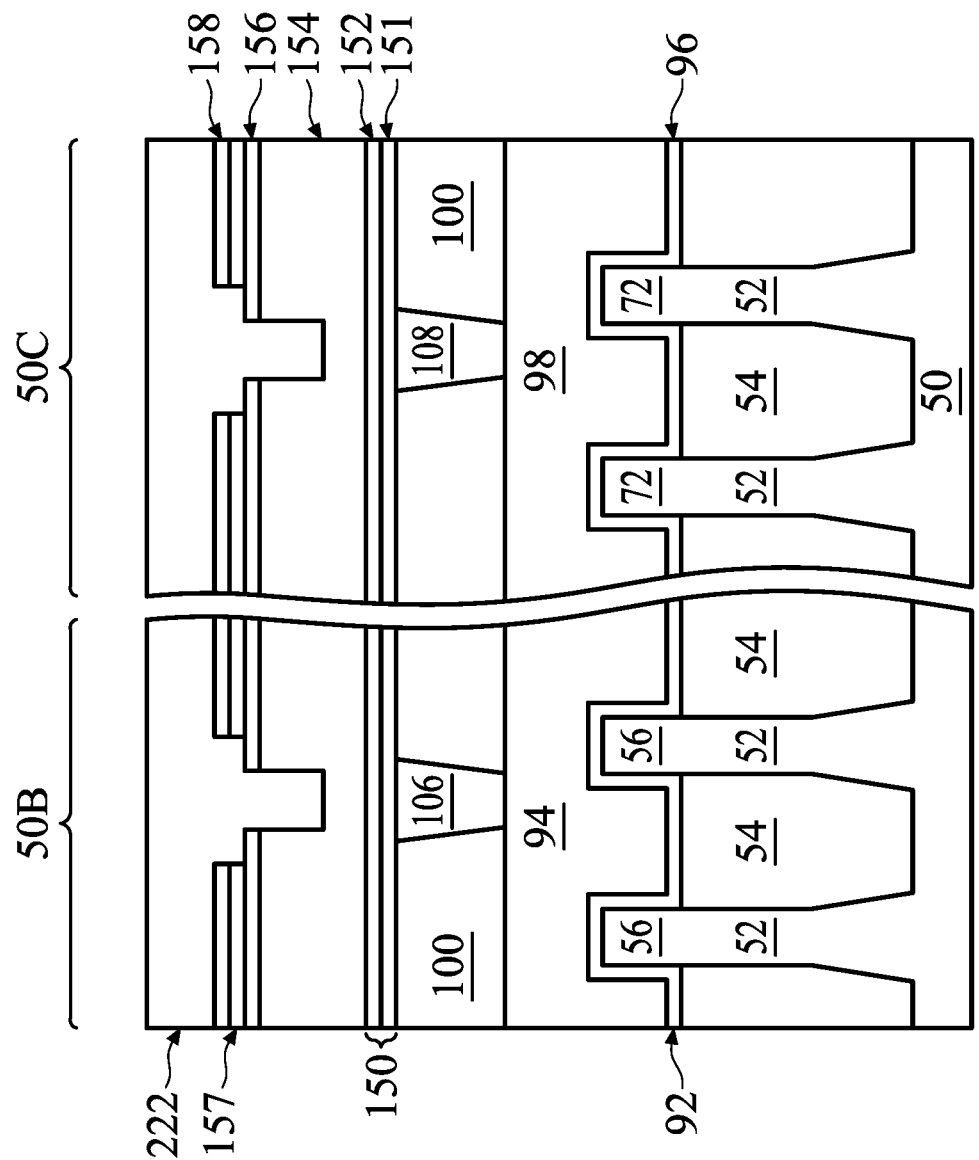
FIGS. 27A, 27B, and 27C are cross-sectional views of intermediate stages in the manufacture of a finFET device in accordance with some embodiments.
Figure 27C:
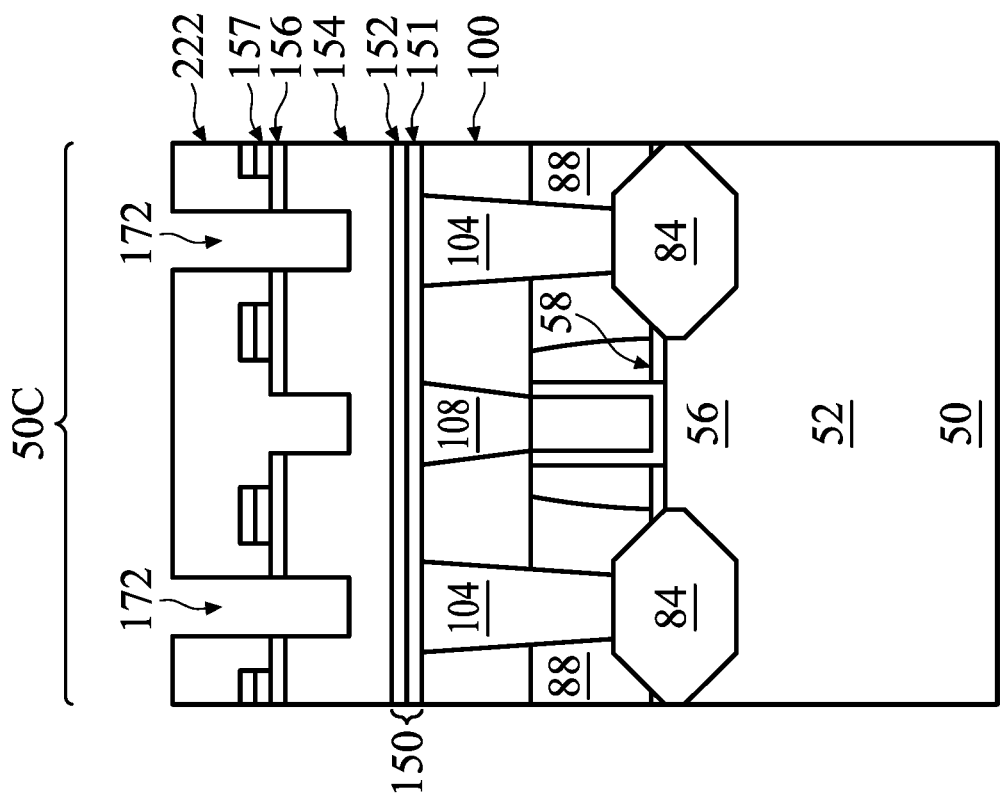
Figure 27B:
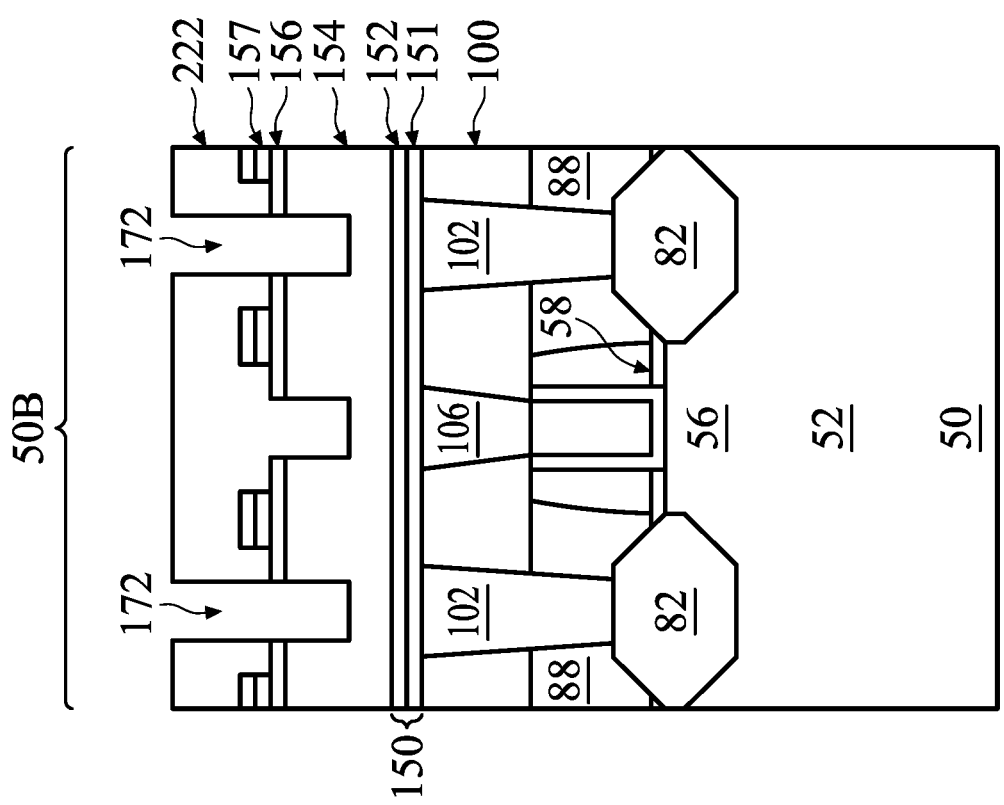
Figure 28A:
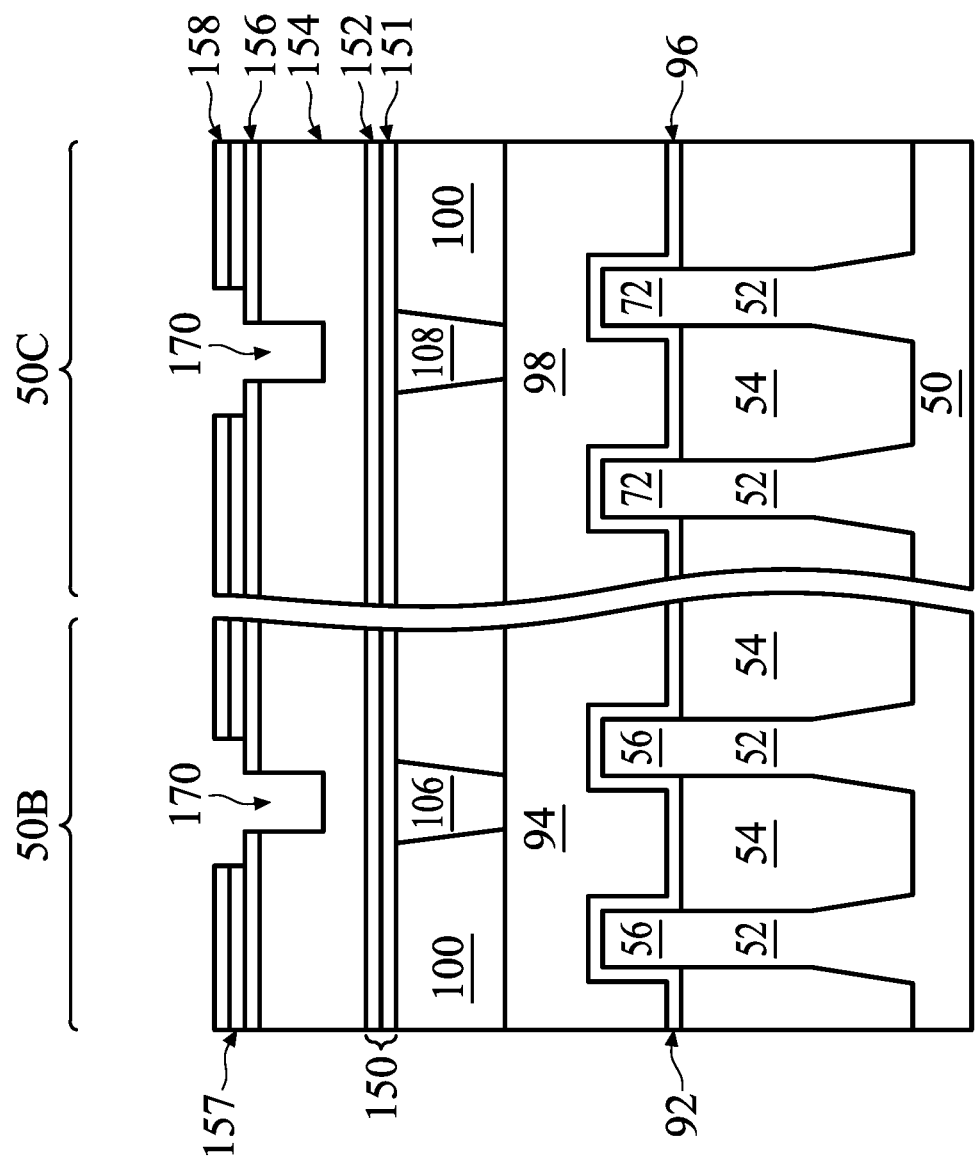
FIGS. 28A, 28B, and 28C are cross-sectional views of intermediate stages in the manufacture of a finFET device in accordance with some embodiments.
Figure 28C:
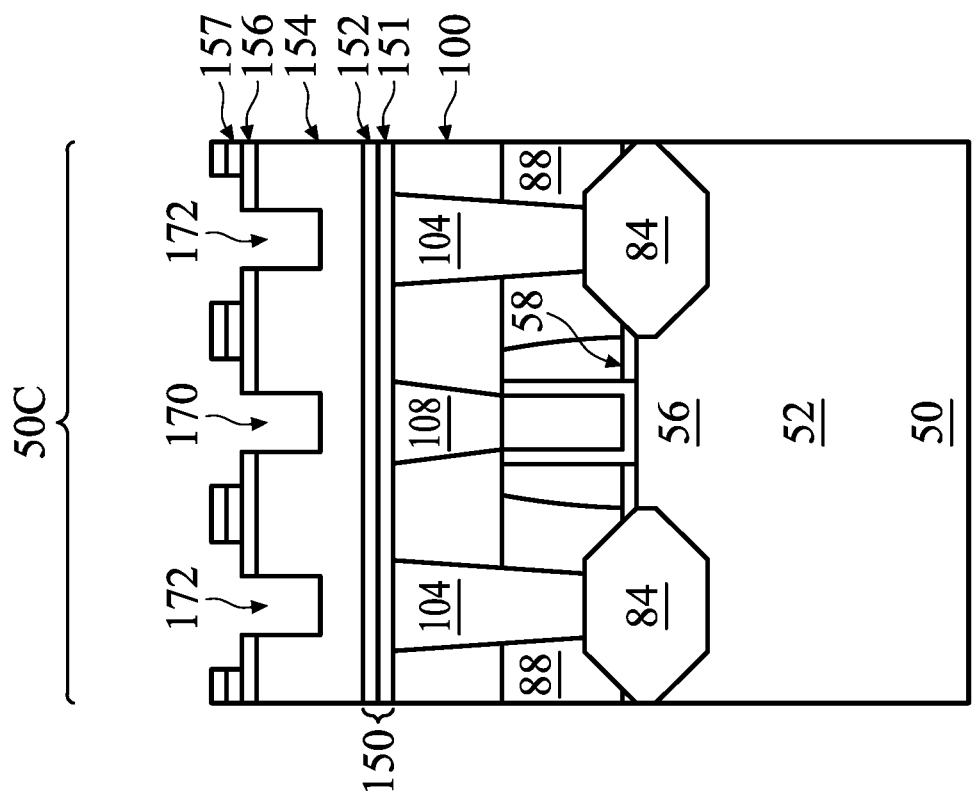
Figure 28B:
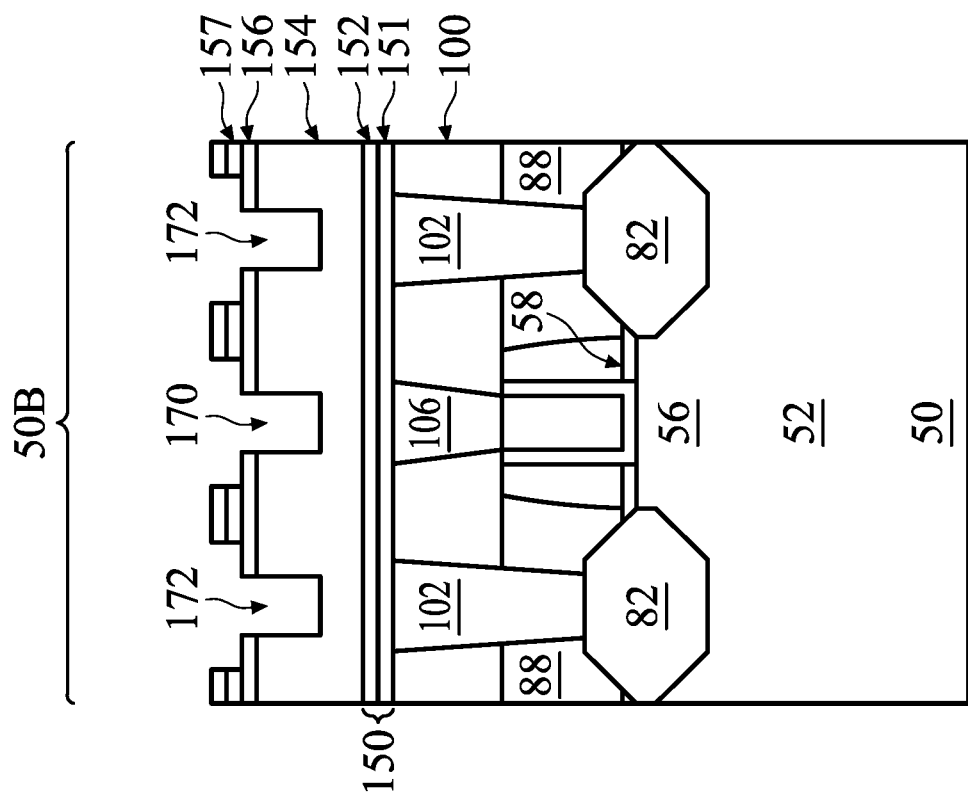

FIGS. 26A-C through 28A-C illustrate the formation of a second via pattern. Referring to FIGS. 26A-C, a tri-layer including bottom layer 222, middle layer 224, and upper layer 226 is formed. Bottom layer 222 extends into openings 170 (FIGS. 25A-C) in dielectric layer 154. Upper layer 226 is patterned and includes openings 172, which have the pattern of subsequently formed vias. Next, middle layer 224, bottom layer 222, ARL 156, and dielectric layer 154 are etched, and openings 172 extend into dielectric layer 154. The resulting structure is shown in FIGS. 27A-C. The bottoms of openings 172 are also at an intermediate level (such as at the middle) between a top surface and a bottom surface of dielectric layer 154. In some embodiments, a timing parameter of the etching process may be controlled so that the etching process terminates when the bottoms of openings 172 are at the desired intermediate level. The upper layer 226 and middle layer 224 (shown in FIGS. 26A-C) may be consumed when the formation of openings 172 is finished. The remaining bottom layer 222 is removed, for example, in an ashing process. The resulting structure is depicted in FIGS. 28A-C.

Figure 29A:
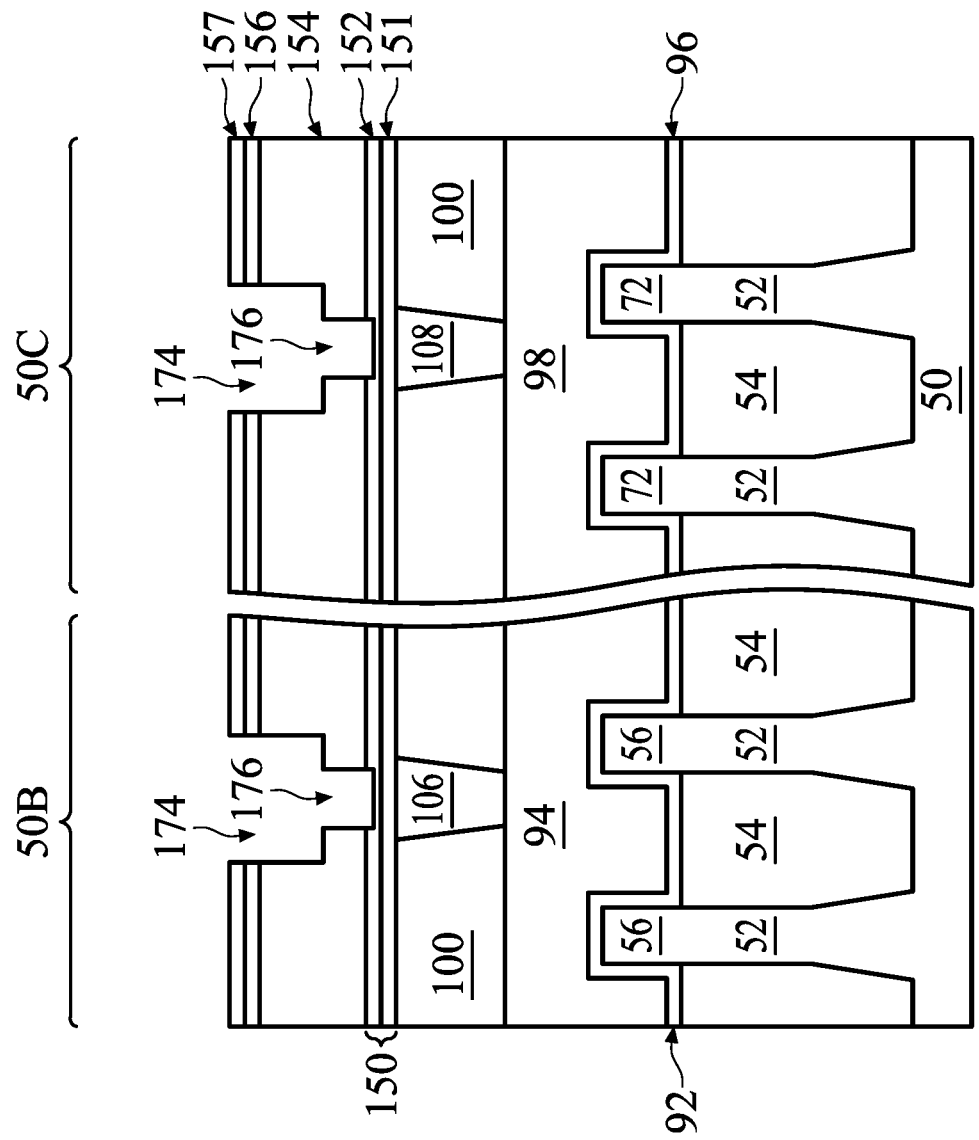
FIGS. 29A, 29B, and 29C, are cross-sectional views of intermediate stages in the manufacture of a finFET device in accordance with some embodiments.
Figure 29C:
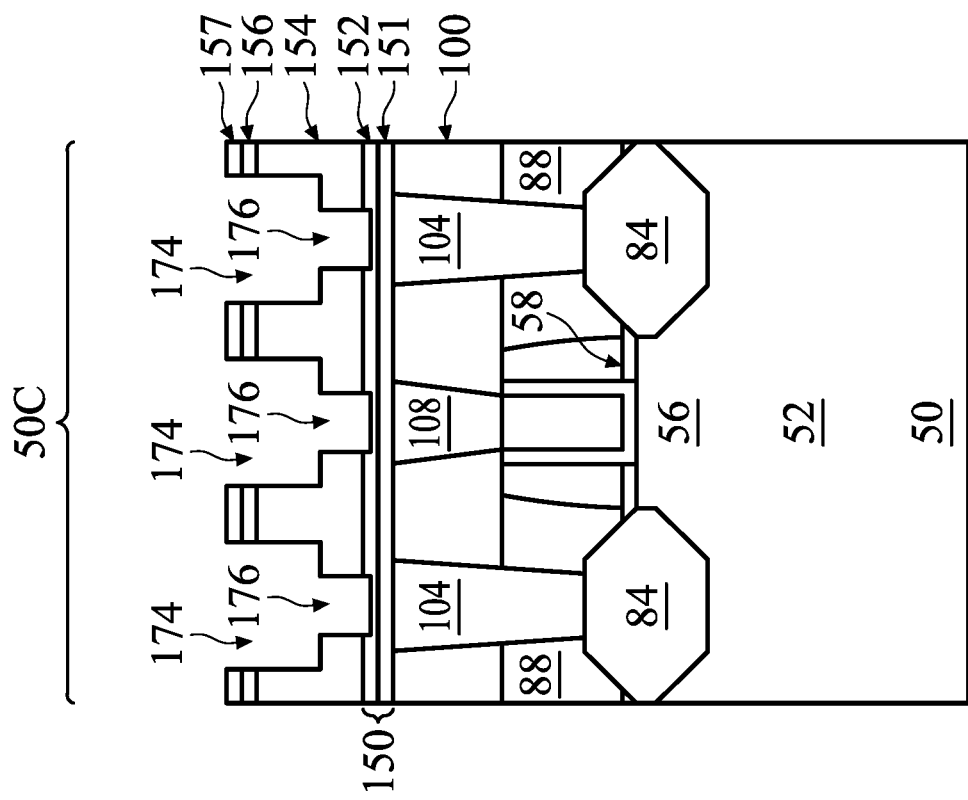
Figure 29B:
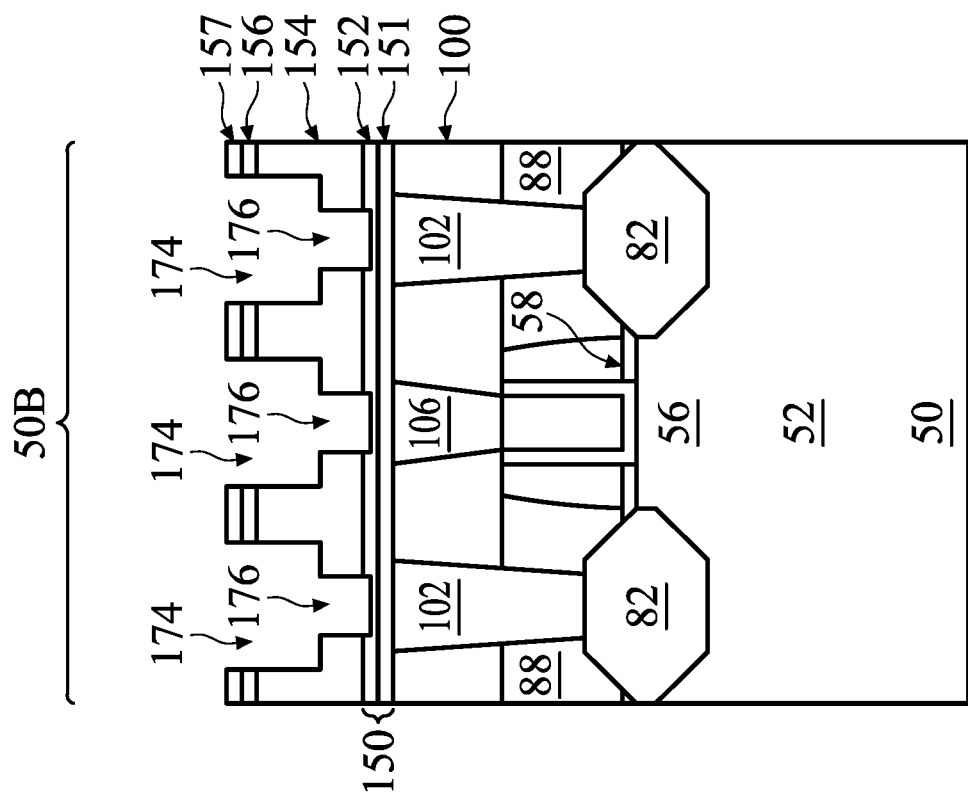

Next, as shown in FIGS. 29A-C, an etching process, such as an anisotropic etching process, is performed to etch dielectric layer 154. Mask layer 157 is used as the etching mask. Trenches 174 are formed by the etching process. The etching may be performed using a fluorine-containing gas comprising fluorine and carbon, wherein fluorine is used for etching, with carbon having the effect of protecting the sidewalls of the resulting via openings 176 and trenches 174. For example, the process gases for the etching may include $C_4F_8$ and/or $CF_4$. During the etching, openings 170 and 172 are extended down to the bottom of dielectric layer 154, forming via openings, which are also denoted in FIGS. 29A-C using reference numeral 176. Etch stop layer 152 is exposed to via openings 176. After the etching process, trenches 174 have bottoms at an intermediate level between the top surface and the bottom surface of dielectric layer 154.

Next, etch stop layer 152 is etched. After the etching process, via openings 176 extend into etch stop layer 152. In accordance with some embodiments, etch stop layer 152 is etched partially. The remaining portions of etch stop layer 152 and etch stop layer 151 may protect the underlying contacts 102, 104, 106 and 108 from damage during subsequent processing, such as the removal of mask layer 157 (see FIGS. 30A-C). The resulting structure is shown in FIGS. 29A-C.

Figure 30A:
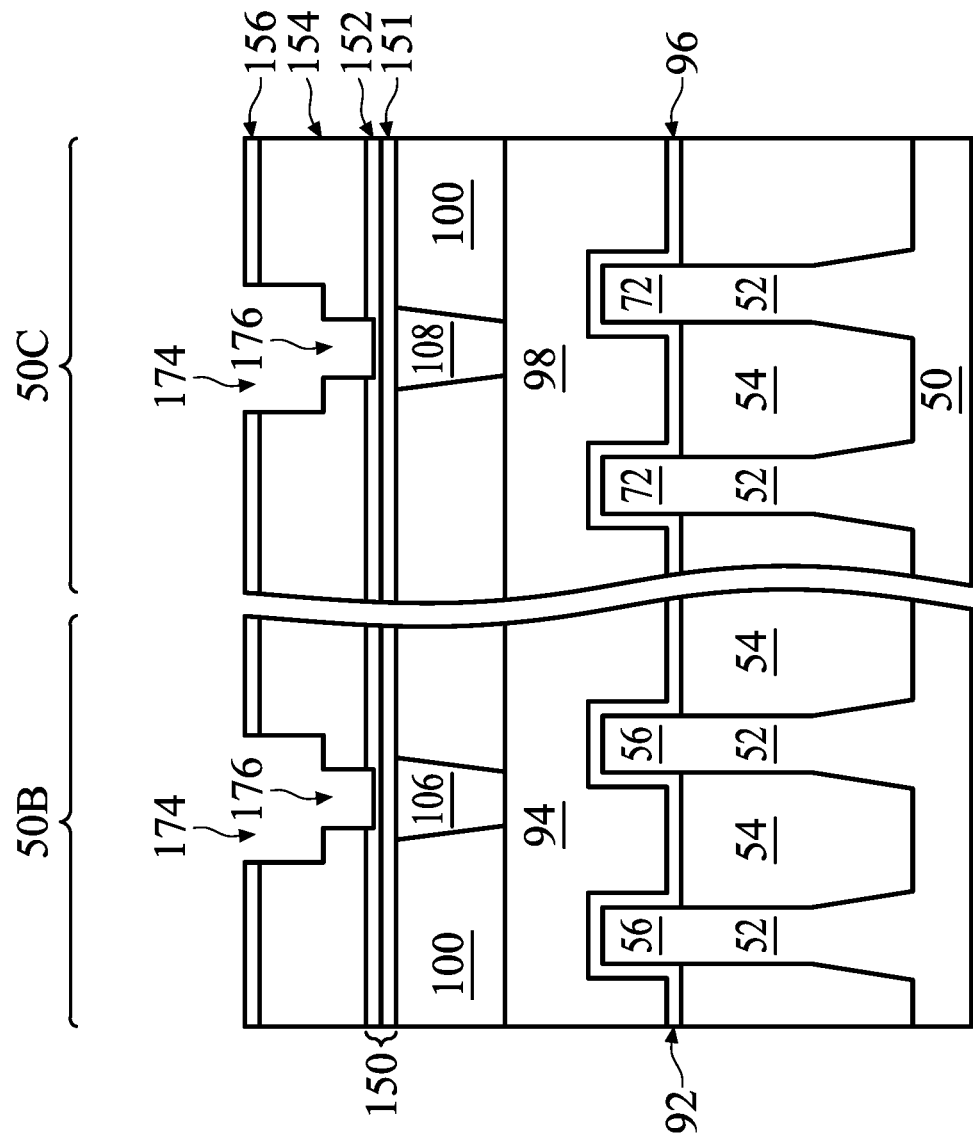
FIGS. 30A, 30B, and 30C are cross-sectional views of intermediate stages in the manufacture of a finFET device in accordance with some embodiments.
Figure 30C:
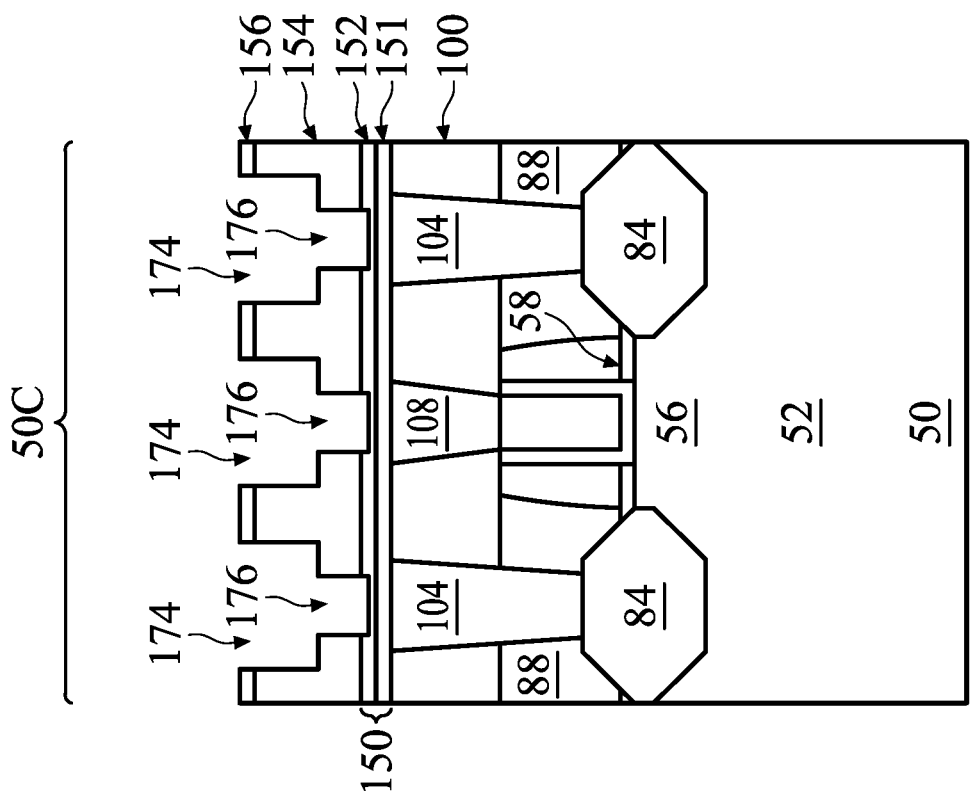
Figure 30B:
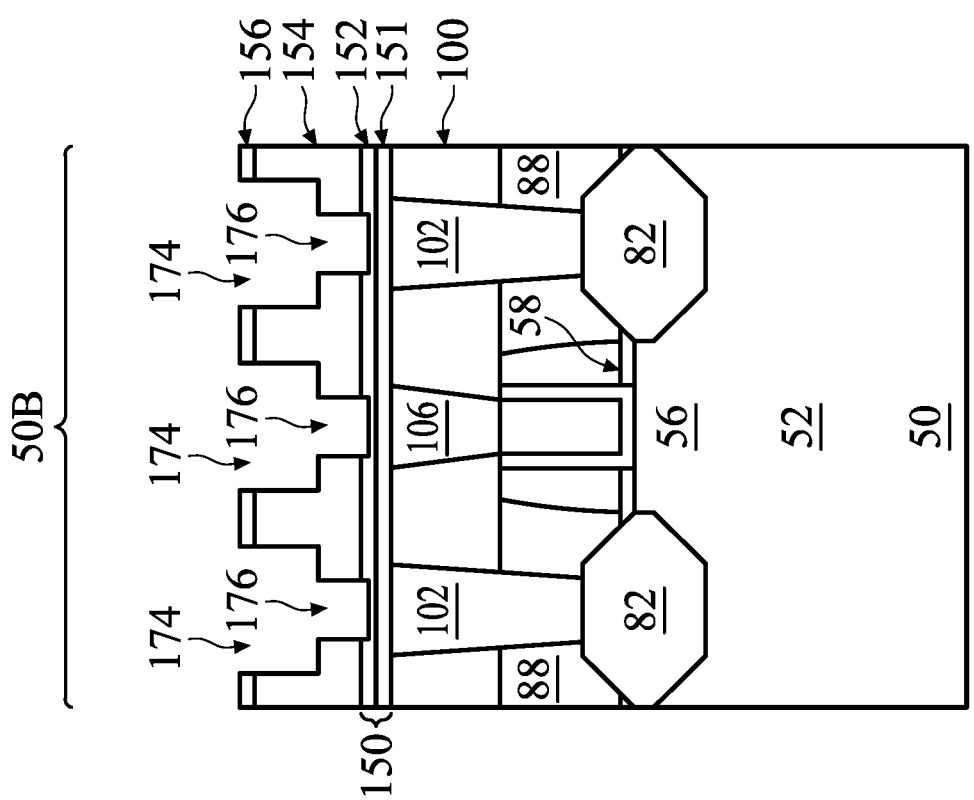

Next, as shown in FIGS. 30A-C, mask layer 157 is removed. Mask layer 157 may be removed using any suitable process. In some embodiments, mask layer 157 may be removed by a wet etching process. The remaining portions of etch stop layer 152 and etch stop layer 151 may protect the underlying contacts 102, 104, 106 and 108 from damage during the wet etching. The resulting structure is shown in FIGS. 30A-C.

Figure 31A:
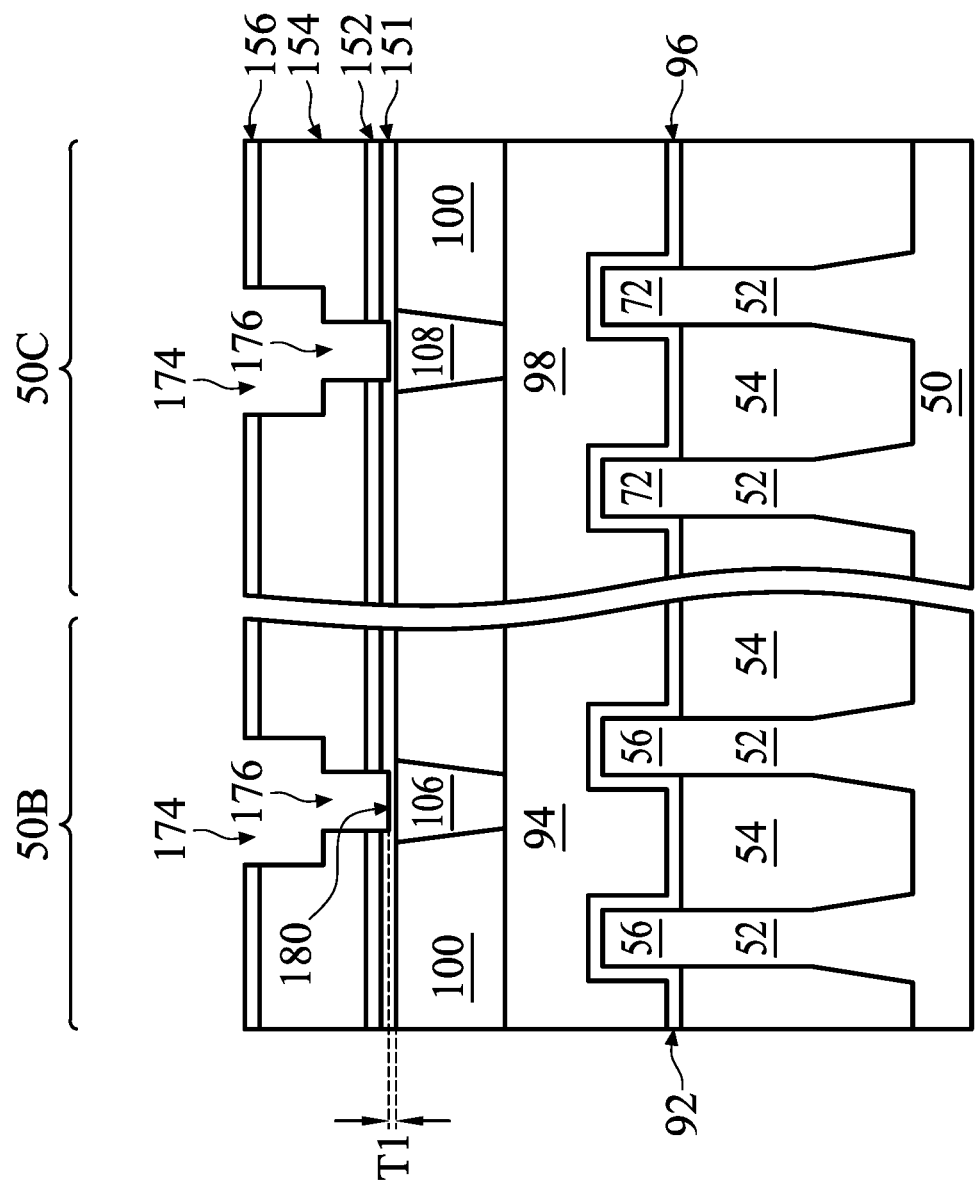
FIGS. 31A, 31B, and 31C are cross-sectional views of intermediate stages in the manufacture of a finFET device in accordance with some embodiments.
Figure 31C:
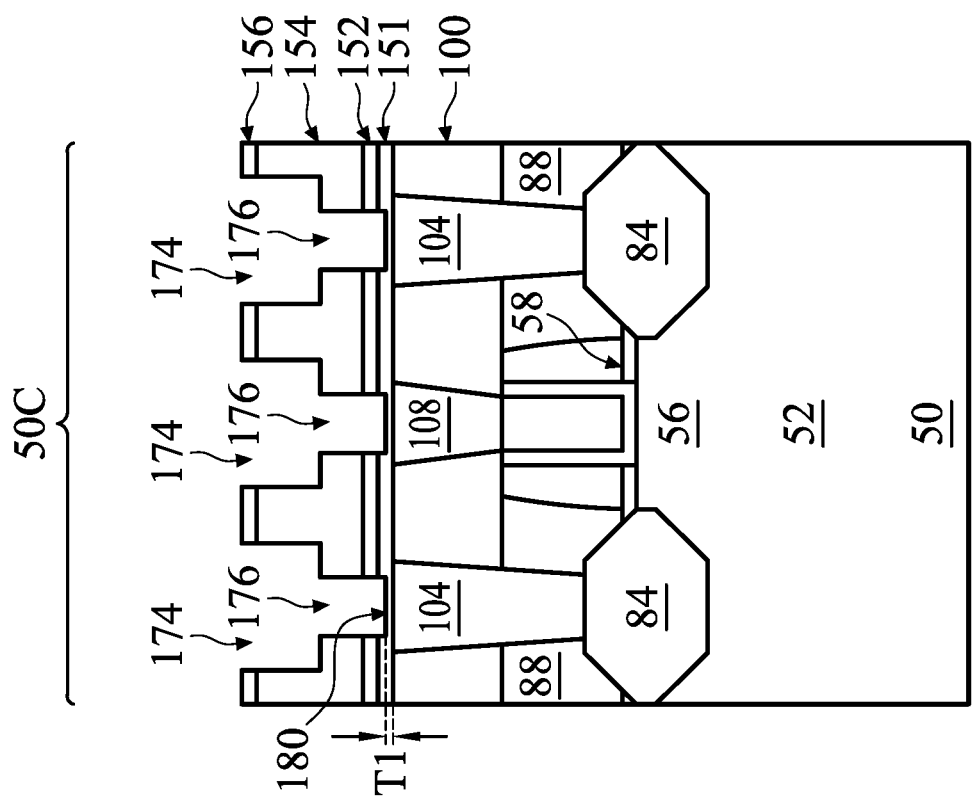
Figure 31B:
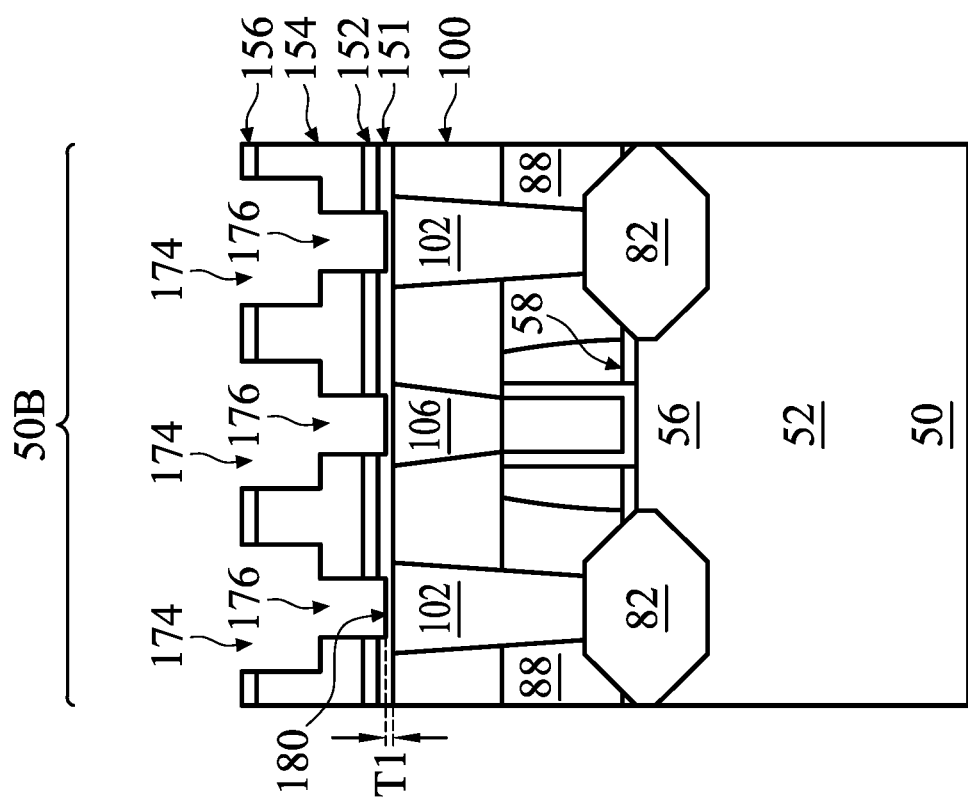

Next, referring to FIGS. 31A-C, one or more additional etch processes are performed to further expand via openings 176. The additional etch processes may etch through etch stop layer 152 and partially etch through etch stop layer 151. Any suitable etching processes may be used. In some embodiments, the additional etch process may comprise a dry etching process followed by a wet cleaning process.

As shown in FIGS. 31A-C, etch stop layer 151, being only partially etched, prevents contacts 102, 104, 106, and 108 from being exposed to air by via openings 176. If via openings 176 are expanded and etch stop layer 151 is etched through, contacts 102, 104, 106, and 108 may be exposed to open air. When contacts 102, 104, 106, and 108 are exposed to air, oxidation of the contacts 102, 104, 106, and 108 may occur. For example, contacts 102, 104, 106, and/or 108 may comprise copper, and, when the copper is exposed to air, oxidation may occur, creating copper oxide. In this manner, damage may be caused to the contacts, which may reduce reliability of the contacts and/or decrease manufacturing yields.

Conventionally, a furnace baking may performed to remove oxidation from metal interconnect lines that are exposed to air. The elevated temperature of the furnace baking causes the copper oxide on the metal to be reduced to copper, while the oxygen in the copper oxide reacts with hydrogen to form water. Typically, the furnace baking may last two hours or even longer. Next, in conventional processing the wafer containing the finFET device is transferred to a vacuum environment to form a barrier layer and a copper seed layer. However, during the transferring, the wafer is exposed to open air, and hence a thin copper oxide layer is formed again on any exposed portions of contacts 102, 104, 106, and/or 108. Therefore, in the vacuum environment, an additional removal process is performed to remove the thin copper oxide layer. The removal of the thin copper oxide layer may include a degas process (at an elevated temperature with no hydrogen introduced) to remove moisture. However, with a long furnace baking time and the additional copper oxide removal process in the vacuum environment, the throughput of the manufacturing process is adversely affected. The copper oxide removal processes also result in increased in manufacturing costs.

In some embodiments, a portion 180 of etch stop layer 151 is left over 102, 104, 106, and/or 108 until the wafer on which the finFET device is being formed is transferred to the vacuum environment. As such, portion 180 may prevent oxidation of the contacts 102, 104, 106, and/or 108 by protecting the contacts from being exposed to air until the wafer on which the finFET device is being formed is transferred to the vacuum chamber. As shown in FIGS. 31A-C, the etching process may be terminated before etch stop layer 151 is etched through, and after the etching process, portion 180 of etch stop layer 151 remains. Portion 180 remains over contacts 102, 104, 106, and/or 108 until the wafer on which the finFET device is being formed is transferred to the vacuum chamber in which a conductive element will be formed in via openings 176. As will be discussed below in connection with FIGS. 32 and 33A-C, after the wafer is transferred to the vacuum chamber, portions 180 will be removed so that subsequently formed conductive features in via openings 176 can electrically connect to contacts 102, 104, 106, and/or 108. However, by not etching through portion 180 until the wafer is transferred to the vacuum chamber, oxidation of contacts 102/104/106/108 may be reduced or prevented, and in some embodiments the furnace baking steps and/or degas process may be shortened or skipped. As such, manufacturing times and manufacturing costs may be reduced, and greater manufacturing yields may be possible.

As shown in FIGS. 31A-C, portion 180 may have a thickness T1 of about 0.1 Å to about 5 Å. When portion 180 has a thickness Ti of about 0.1 Å or more, portion 180 may prevent or reduce oxidation of contacts 102, 104, 106, 108 by preventing the contacts 102, 104, 106, 108 from being exposed to air. For example, when portion 180 has a thickness T1 of about 0.1 Å or more, portion 180 may prevent contacts 102, 104, 106, 108 from being oxidized due to exposure to open air during the transfer of the wafer into the vacuum chamber. When portion 180 has a thickness of about 5 Å or less, portion 180 may be effectively removed in the vacuum chamber, as will be discussed below in connection with FIGS. 32 and 33A-C.

Next, referring to FIG. 32, the wafer on which finFET device 30 is being formed is transferred to process chamber 202. FinFET device 30 may be supported by wafer chuck 204 during processing in chamber 202. Chamber 202 may include process equipment 206, which may comprise equipment for creating a vacuum environment in process chamber 202, equipment for etching portion 180, and equipment for forming a barrier layer 182 (see FIGS. 34A-C) and a seed layer 183 (see FIGS. 35A-C) in trenches 174 and via openings 176.

Figure 33A:
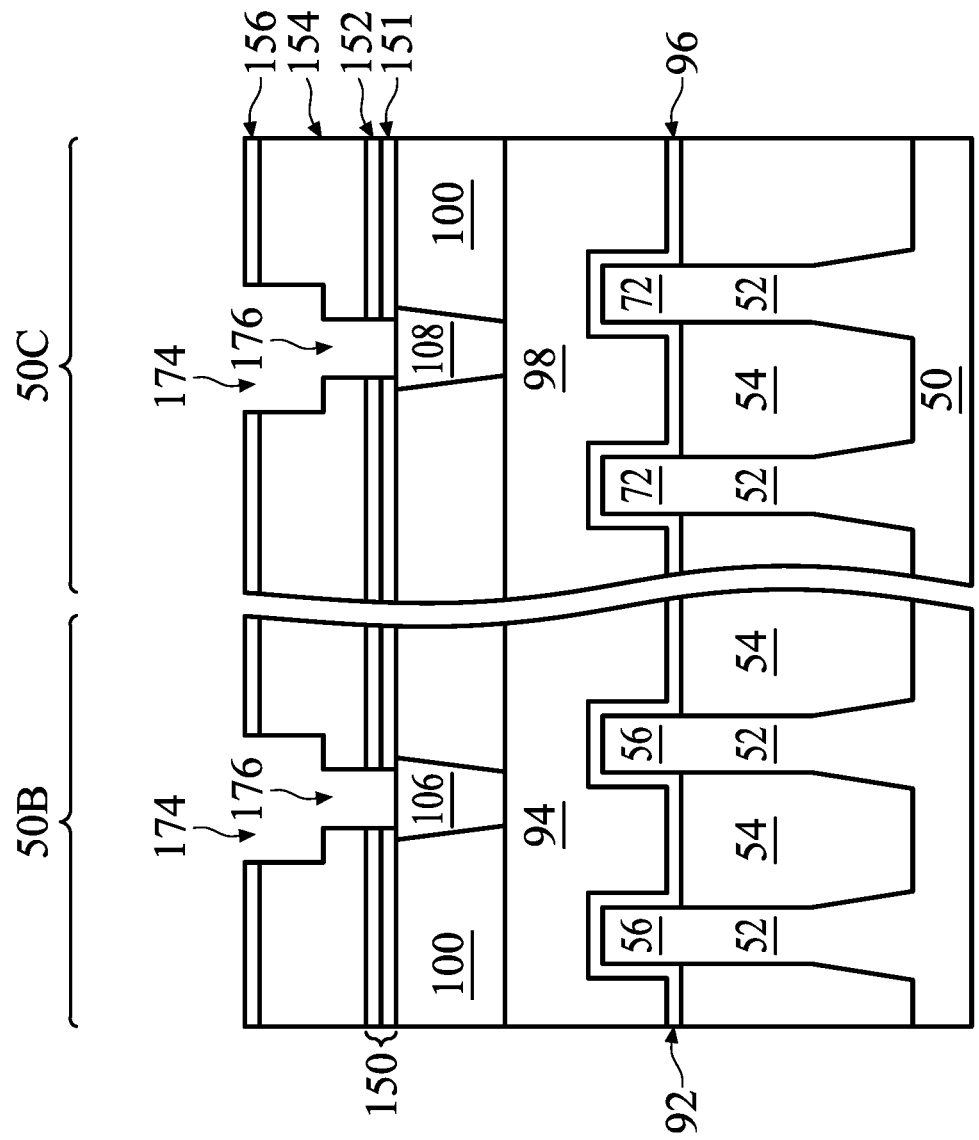
FIGS. 33A, 33B, and 33C are cross-sectional views of intermediate stages in the manufacture of a finFET device in accordance with some embodiments.
Figure 33C:
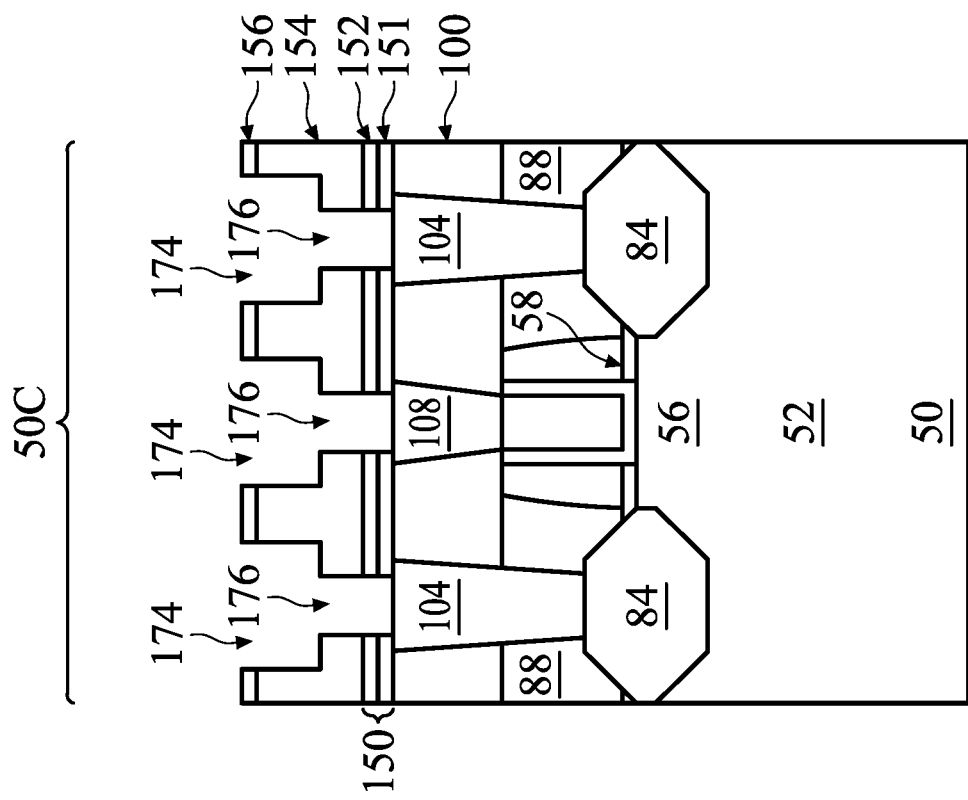
Figure 33B:
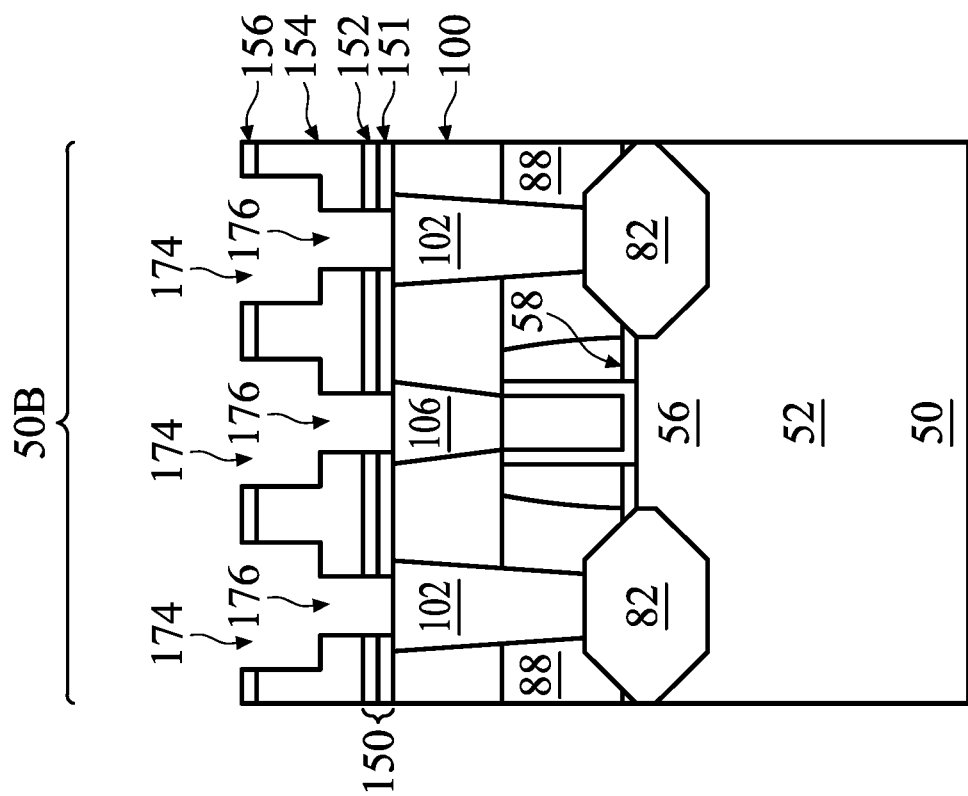
Figure 34A:
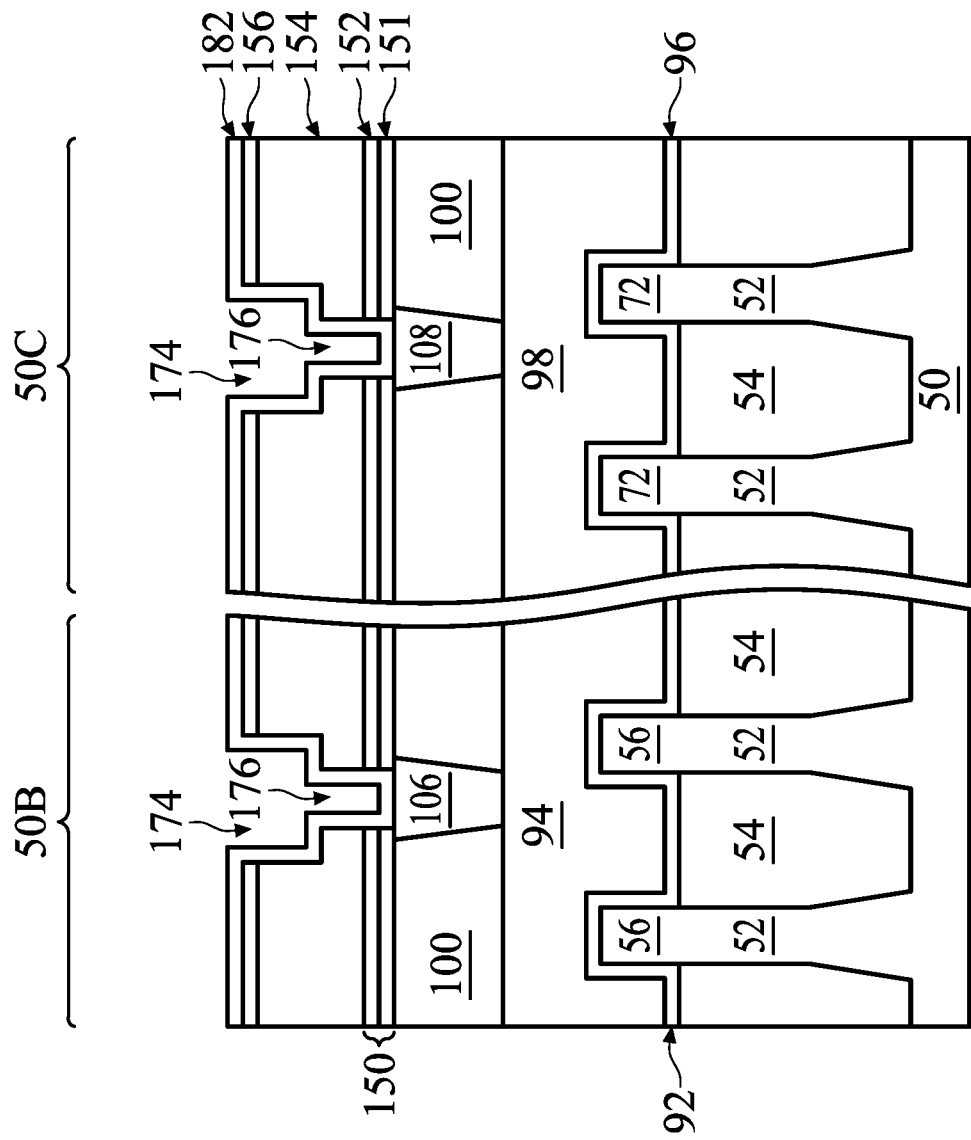
FIGS. 34A, 34B, and 34C are cross-sectional views of intermediate stages in the manufacture of a finFET device in accordance with some embodiments.
Figure 34C:
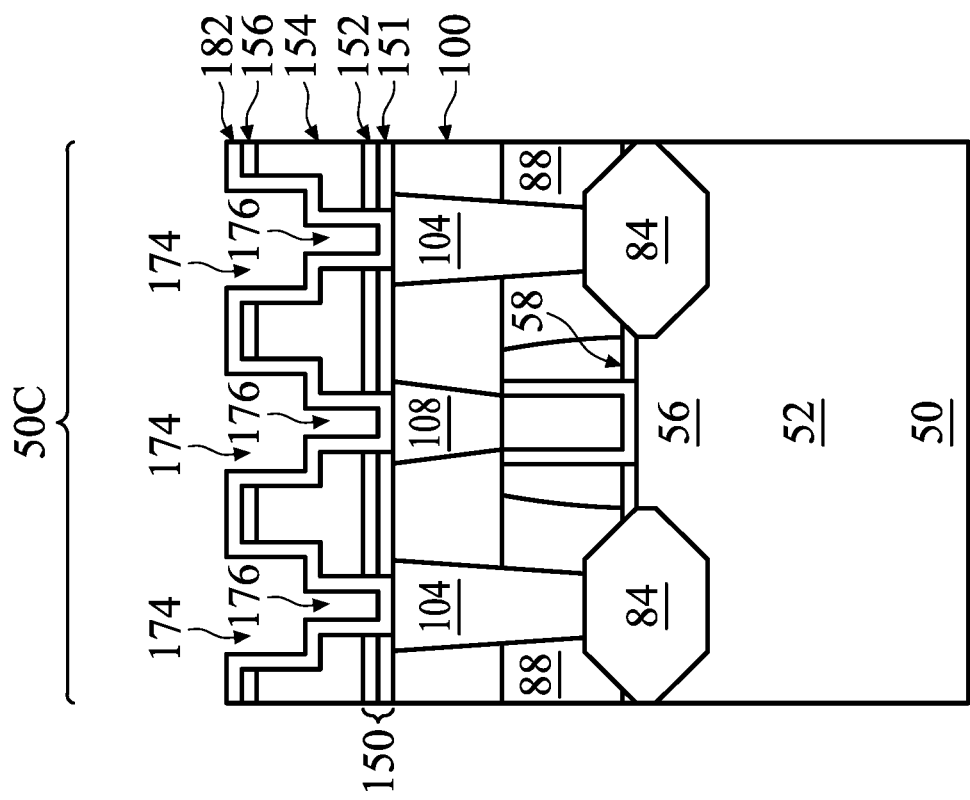
Figure 34B:
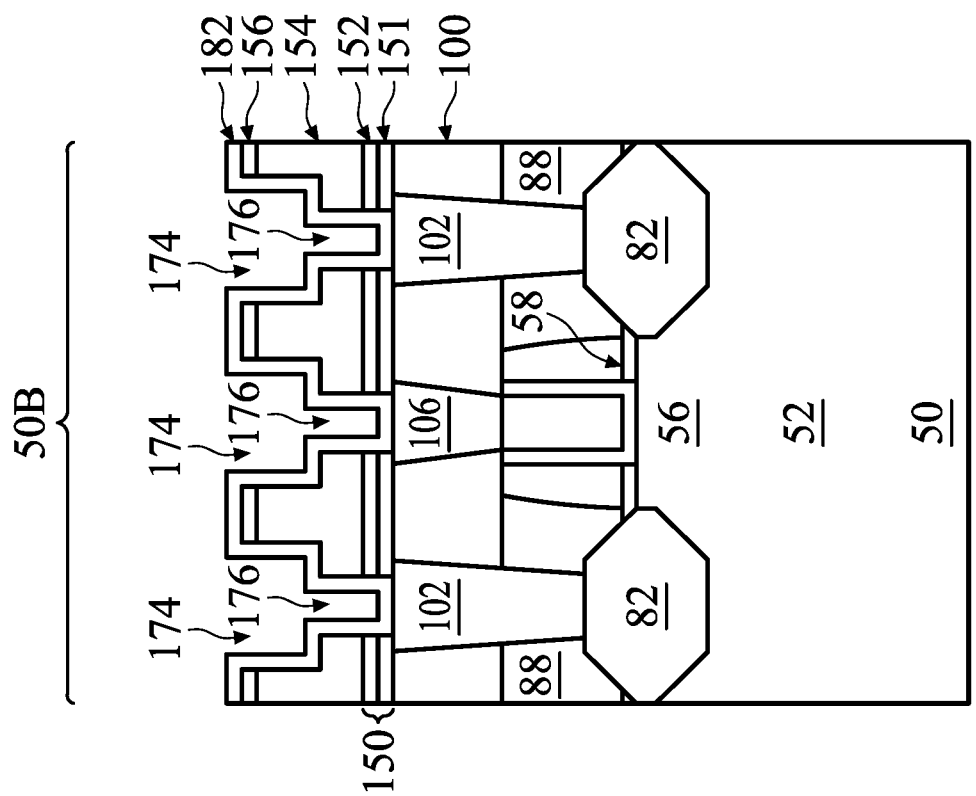
Figure 35A:
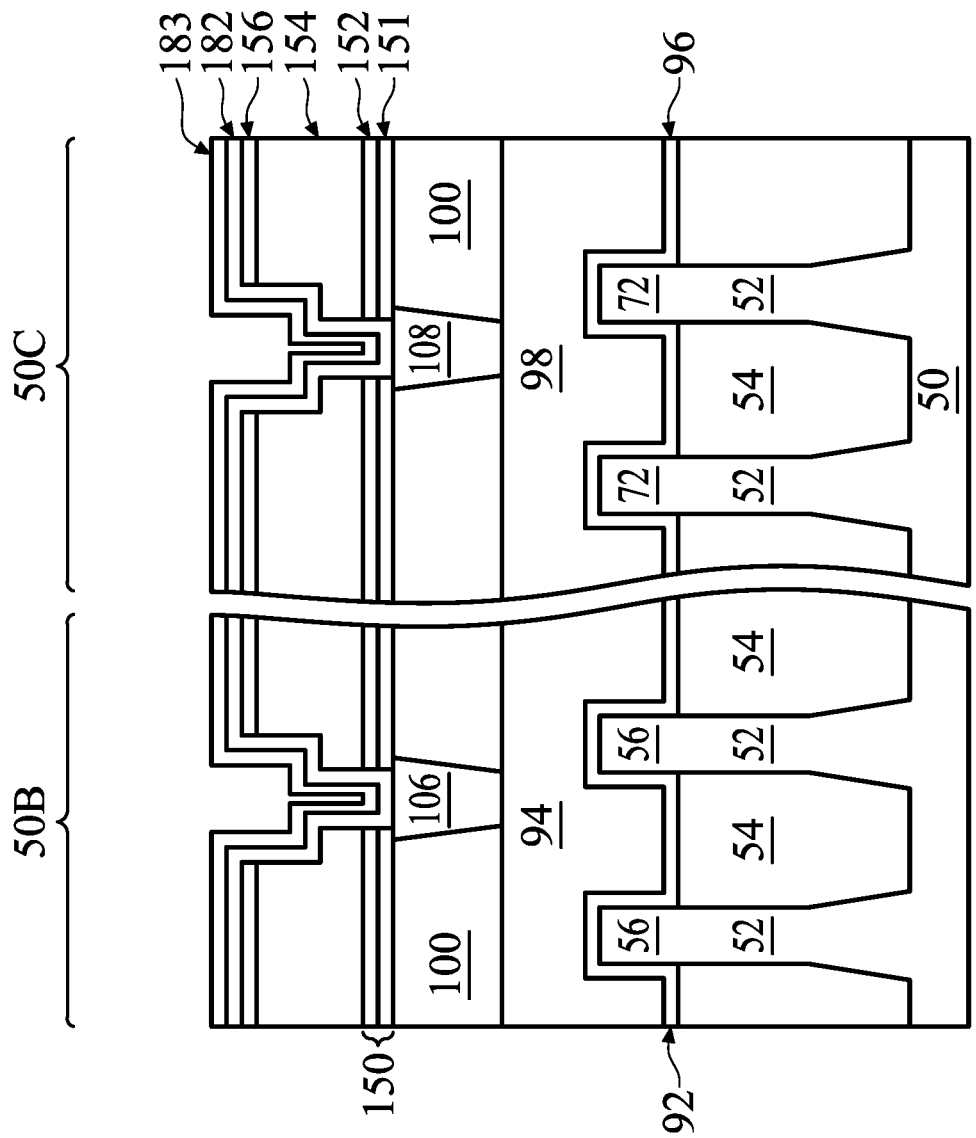
FIGS. 35A, 35B, and 35C are cross-sectional views of intermediate stages in the manufacture of a finFET device in accordance with some embodiments.
Figure 35C:
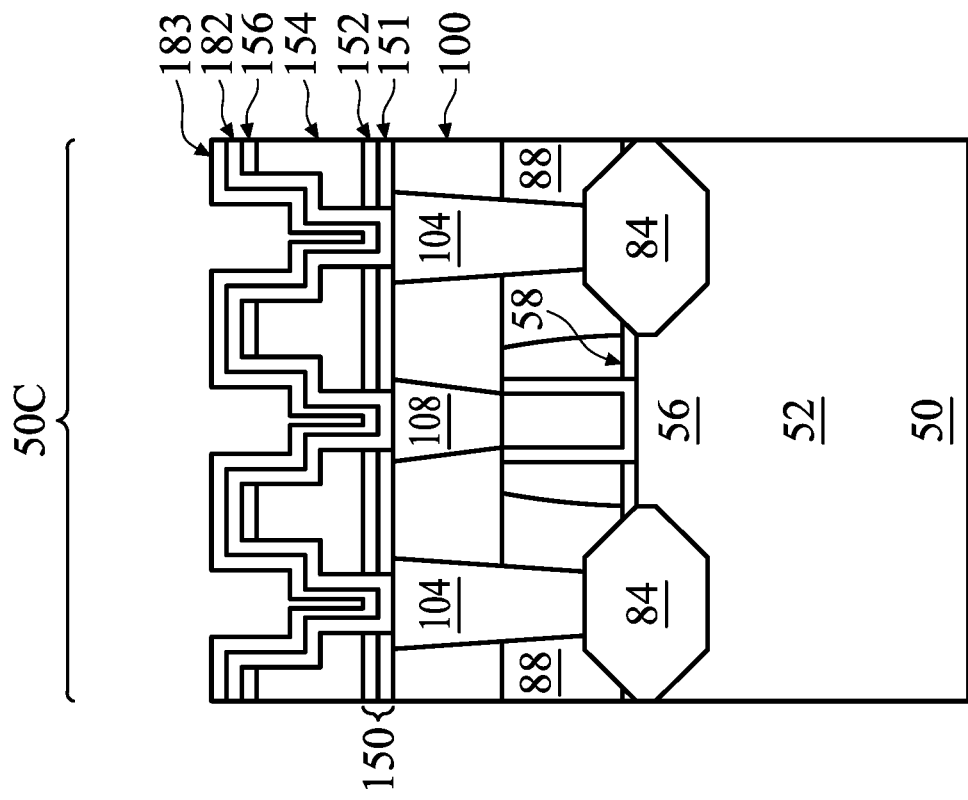
Figure 35B:
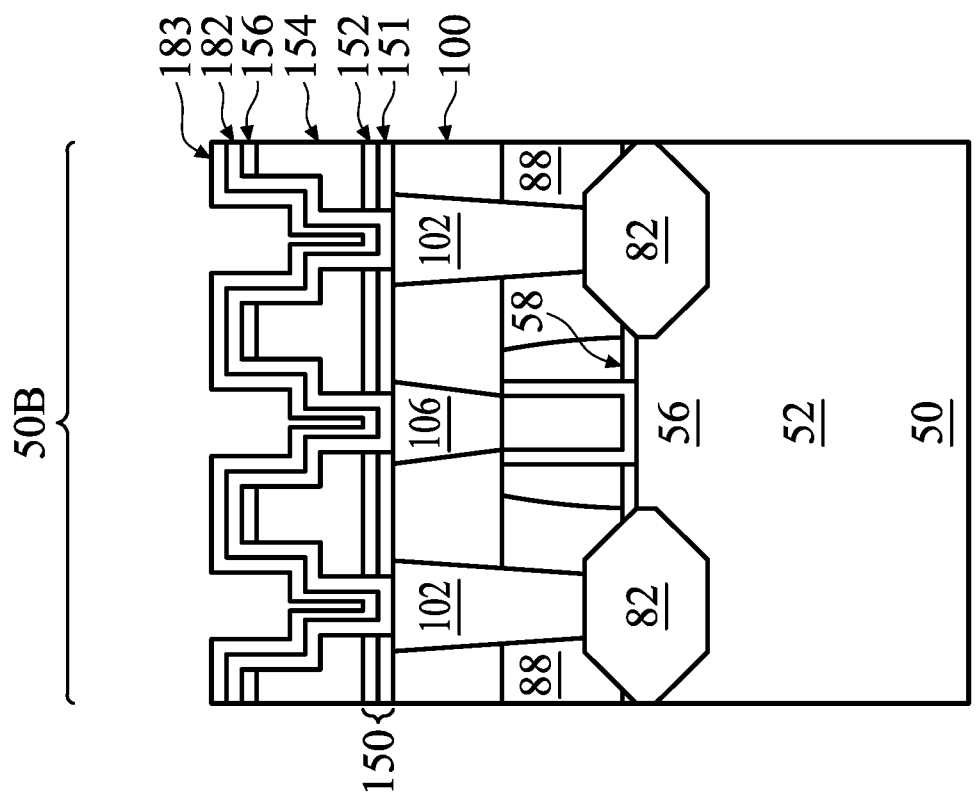

FIGS. 33A-C through 35A-C depict processes that are performed on finFET device 30 in process chamber 202 (depicted in FIG. 32) after a vacuum environment is created in process chamber 202. In FIGS. 33A-C a pre-clean process is performed, in which portions 180 are removed. Next, in FIGS. 34A-C, a barrier layer 182 is formed. In FIGS. 35A-C, a seed layer 183 is formed.

In FIGS. 33A-C, a pre-clean process is performed to remove portions 180. A process gas is introduced into the chamber 202, which is used to etch portions 180 and expose contacts 102/104/106/108. In some embodiments, the process gas is a precursor gas that is subsequently used to deposit barrier layer 182 (See FIGS. 34A-C). The process gas may include $C_xF_y$, such as $CF_4$ gas, $C_4F_8$ gas, or the like. The chamber 202 may have a low pressure during the preclean process. For example, the pressure in the chamber 202 may be less than about 40 mTorr. Because portion 180 is etched by the pre-clean process in a vacuum environment in process chamber 202 (see FIG. 32), contacts 102/104/106/108 are not exposed to open air, and oxidation of the contacts 102/104/106/108 may be reduced or prevented.

In FIGS. 34A-C, barrier layer 182 is formed. Barrier layer 182 is formed in process chamber 202 in the vacuum environment. Barrier layer 182 may comprise a conductive material such as titanium nitride, although other materials, such as tantalum nitride, titanium, a dielectric, or the like may alternatively be utilized. Barrier layer 182 may be formed using a CVD process, such as PVD or PECVD. As described above, in some embodiments barrier layer 182 is formed using PVD with Ta and $N_2$ as precursors, which deposits TaN. In some embodiments, the etching process gas that is used to etch portions 180 from vias 176, and expose contacts 102, 104, 106, and/or 108, may be introduced to the process chamber 202 before the precursors used to form the barrier layer 182 is introduced. In some embodiments, the etching process gas is introduced to the process chamber 202 concurrently with the precursors used to form barrier layer 182. In some embodiments, barrier layer 182 is formed to have a thickness in a range from about 10 Å to about 1000 Å. However, other processes, such as sputtering or metal organic chemical vapor deposition (MOCVD), may be used. Barrier layer 182 is formed so as to contour to the underlying shape of trenches 174 and vias 176.

In FIGS. 35A-C, seed layer 183 is formed. Seed layer 183 is formed in process chamber 202 in the vacuum environment. In some embodiments, seed layer 183 may comprise copper, although other suitable materials may be used. Seed layer 183 may be formed by a deposition process, such as ALD, PVD, PECVD, or the like. A plasma argon treatment may be performed on the seed layer 183. In some embodiments, performing a plasma argon treatment on the seed layer 183 may prevent the seed layer 183 from oxidizing upon being exposed to ambient air. For example, in some embodiments a plasma argon treatment being performed on the seed layer 183 may enable the seed layer 183 to be exposed to ambient air for up to about six hours without the seed layer 183 experiencing significant oxidation.

Figure 36A:
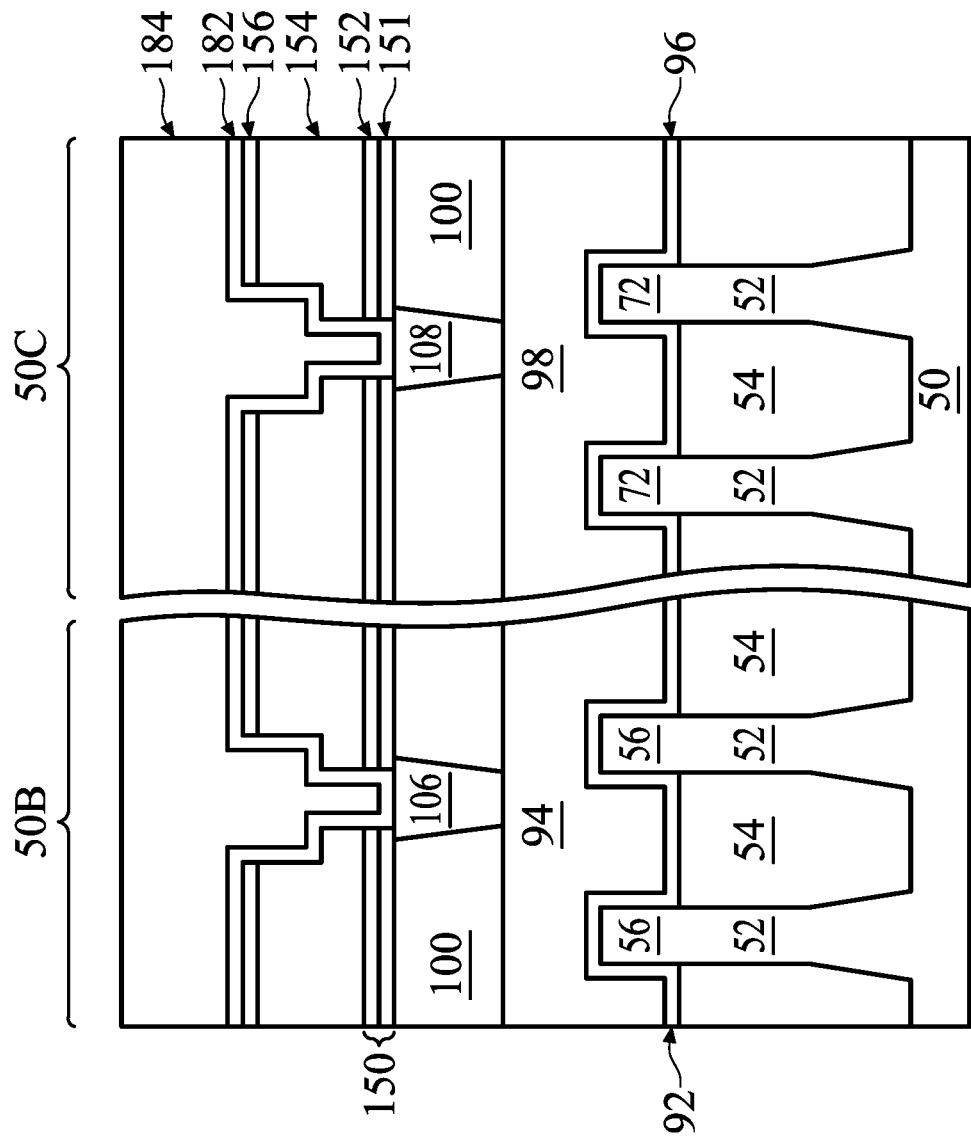
FIGS. 36A, 36B, and 36C are cross-sectional views of intermediate stages in the manufacture of a finFET device in accordance with some embodiments.
Figure 36C:
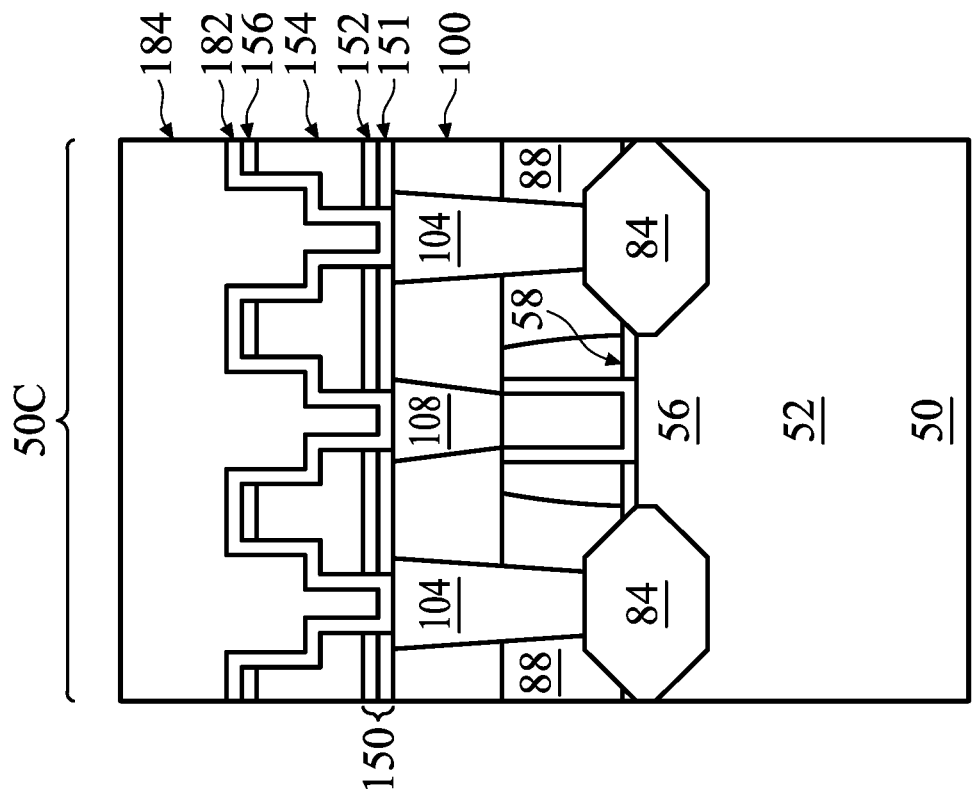
Figure 36B:
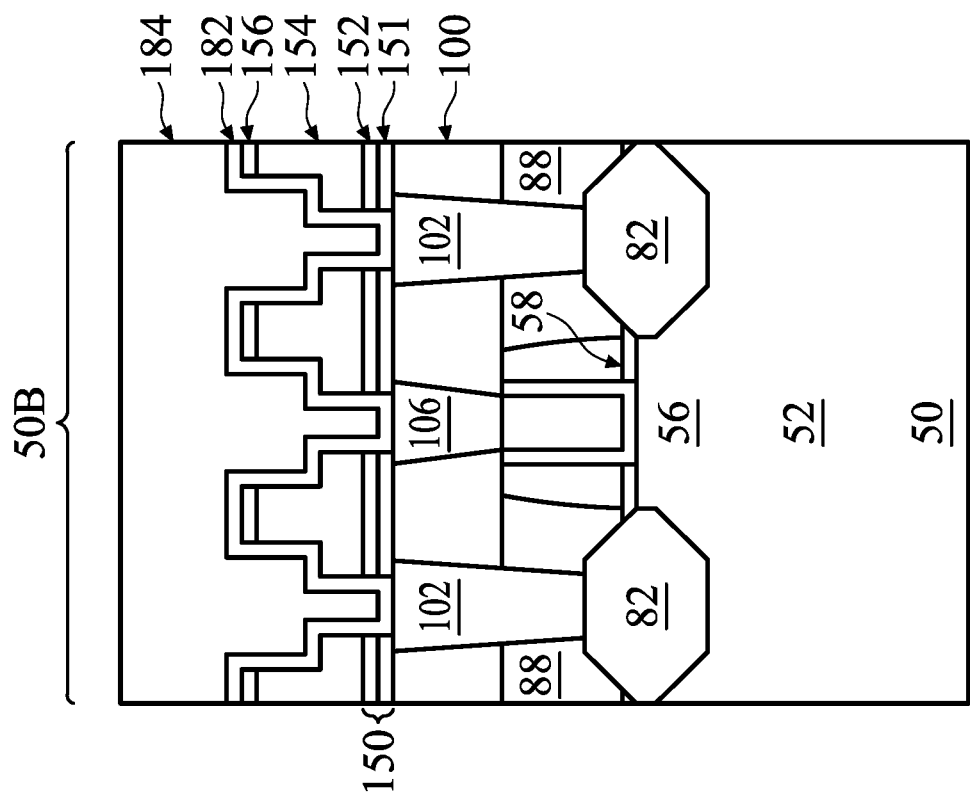

Next, referring to FIGS. 36A-C, the wafer on which the finFET device 30 is being formed is removed from process chamber 202, and the remaining portions of trenches 174 and vias 176 are filled with conductive material 184. Conductive material 184 may comprise copper, although other suitable materials such as aluminum, alloys, doped polysilicon, combinations thereof, and the like, may alternatively be utilized. Conductive material 184 may be formed by electroplating copper onto seed layer 183, filling and overfilling the openings trenches 174. As shown in FIGS. 36A-C, in some embodiments there is no distinguishable interface between seed layer 183 (shown in FIGS. 35A-C) and conductive material 184. In other embodiments, a distinguishable interface exists.

Figure 37A:
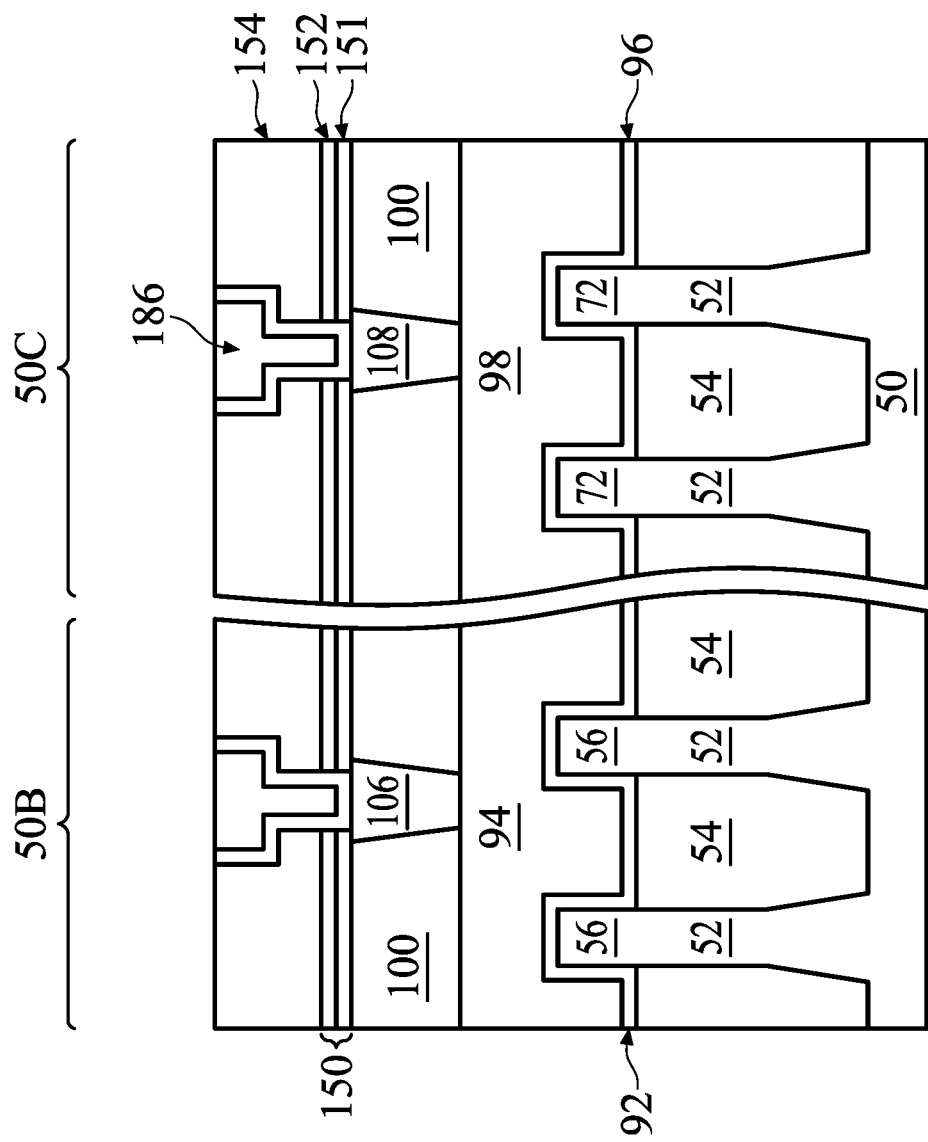
FIGS. 37A, 37B, and 37C are cross-sectional views of intermediate stages in the manufacture of a finFET device in accordance with some embodiments.
Figure 37C:
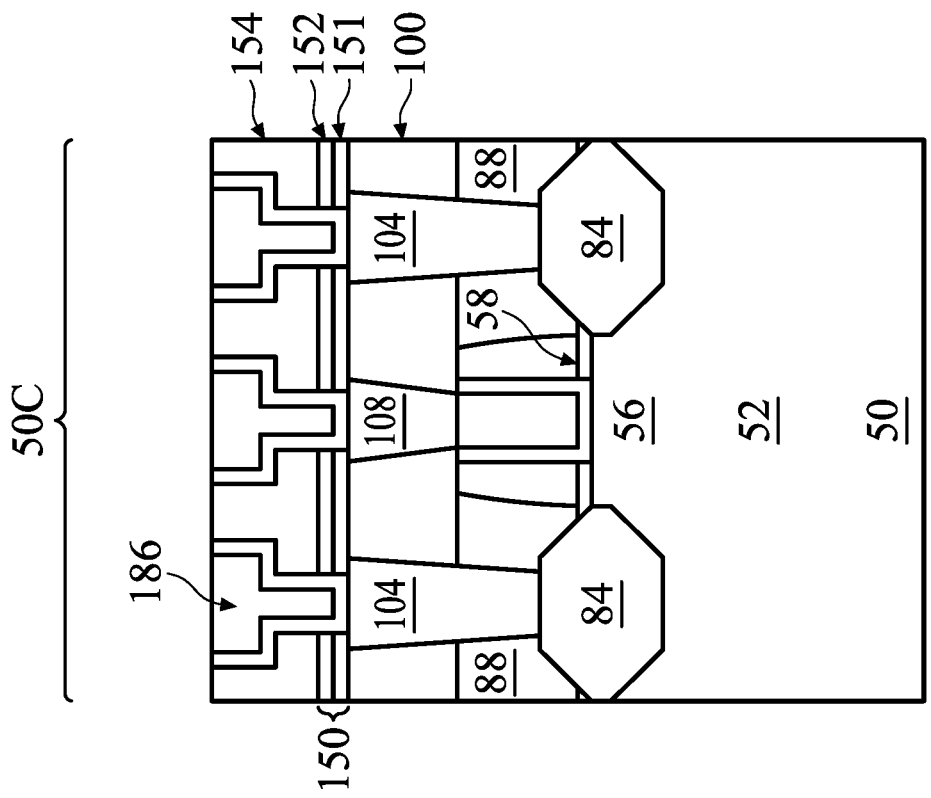
Figure 37B:
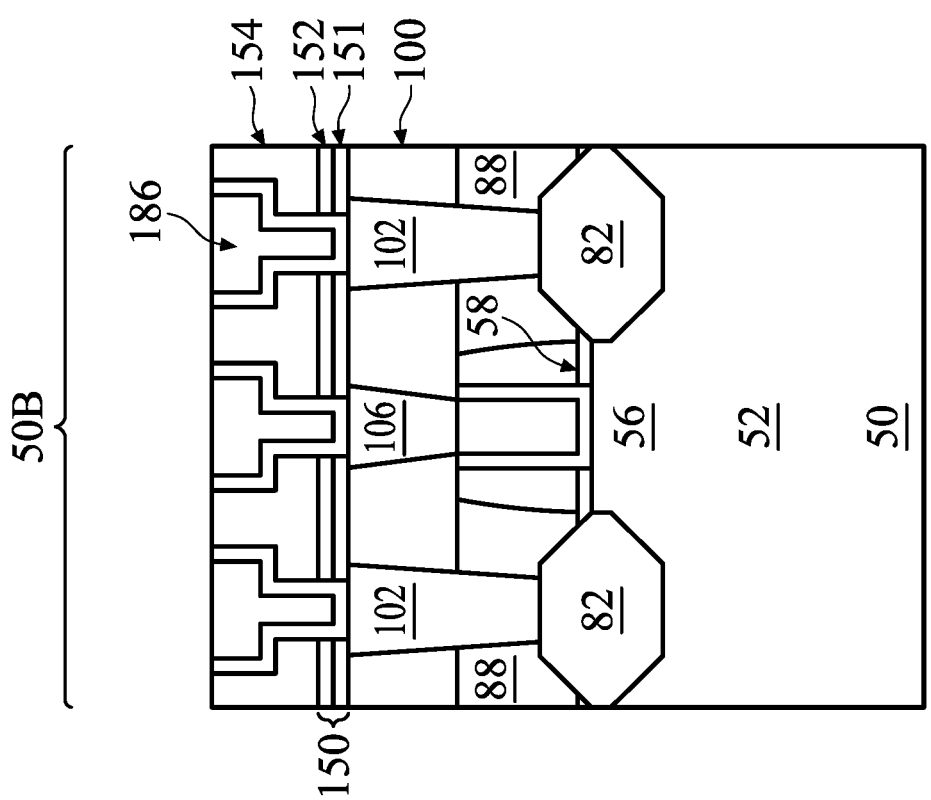

Once the trenches 174 have been filled, excess barrier layer 182 and excess conductive material 184 outside of the trenches 174 is removed, forming conductive features 186. Any remaining portions of ARL 156 may be removed as well. In some embodiments, the removal of excess barrier layer 182, excess conductive material 184, and remaining portions of ARL 156 is by a grinding process such as chemical mechanical polishing (CMP), although any suitable removal process may be used. The resulting structure is depicted in FIGS. 37A-C.

In subsequent processing, additional dielectric layers and conductive features may be formed over dielectric layer 154 and conductive features 186, thereby forming an interconnect region for the finFET device. Conductive features 186, and subsequently formed conductive features (not shown), may extend in any direction according to a particular design. Accordingly, the interconnect region may enable a pin out for the completed package that is different than the pattern of contacts 102, 104, 106, and 108, thereby allowing for more flexibility in the placement of external connectors (not shown) that may be formed over the interconnect region to connect the finFET device to other packages or components.

FIGS. 15A-C through 37A-C depict embodiments in which conductive features 186 are formed directly over and contacting contacts 102/104/106/108. In other embodiments, conductive features 186 are formed at higher levels in the interconnect. For example, conductive features 186 may be formed at metal levels 5, 6, etc.

FIGS. 1 through 36A-C depict embodiments in which conductive features 186 are formed over finFET 30. In other embodiments, conductive features 186 are formed over other types of transistors, such as planar FETs.

As described herein, a conductive feature is formed in a vacuum environment in a process chamber. A via opening is etched partially through an etch stop layer overlying a contact to which the conductive feature will be electrically connected. A portion of the etch stop layer is left un-etched until the wafer on which the device is being formed is transferred into the process chamber and the vacuum environment is created in the chamber. After the vacuum environment is created, a process gas is used to etch through the portion of the etch stop layer and expose the underlying contact. A conductive element is subsequently formed in the opening. Because the underlying contact is not exposed to open air during the formation of the conductive element, oxidation of the underlying contact may be prevented or reduced. A baking process step and a degas step may be skipped, and manufacturing costs and process times may be reduced. Manufacturing yields may increase.

A method of forming a device is provided in accordance with some embodiments. The method includes forming an opening in a dielectric layer and an etch stop layer, where the opening extends only partially through the etch stop layer. The method also includes creating a vacuum environment around the device. The method also includes, after creating the vacuum environment around the device, etching through the etch stop layer to extend the opening and expose a first conductive feature. The method also includes forming a second conductive feature in the opening. In an embodiment a portion of the etch stop layer remains over the first conductive feature after the opening is formed, the portion having a thickness in a range of about 0.1 Å to about 5 Å. In an embodiments, forming the second conductive feature comprises: forming a barrier layer in the opening; forming a seed layer over the barrier layer; and electroplating a conductive material over the seed layer. In an embodiment the opening in the dielectric layer is formed in an open air environment, and the vacuum environment is maintained during the forming of the barrier layer and the seed layer. In an embodiment a process gas is used to etch through the etch stop layer to extend the opening and expose the first conductive feature, the process gas comprising carbon and fluorine. In an embodiment forming the second conductive feature in the opening comprises forming a barrier layer, and the process gas is applied to the opening concurrently with another gas that is used as a precursor in the forming of the barrier layer. In an embodiment forming the opening comprises forming a bottom portion and an upper portion, and wherein the upper portion is larger than the bottom portion in a plan view. In an embodiment the etch stop layer comprises a first etch stop layer and a second etch stop layer, and the opening extends through the first etch stop layer before the vacuum environment is created. In an embodiment forming the opening in the dielectric layer and the etch stop layer comprises: forming a first opening in the dielectric layer in a first photo resist patterning process; forming a second opening in the dielectric layer using a second photo resist patterning process; and extending the first opening and the second opening in an etching process.

A method of forming a device is provided in accordance with some embodiments. The method includes forming an etch stop layer over a first conductive feature, and forming a dielectric layer over the etch stop layer. The method also includes forming an opening in the dielectric layer and the etch stop layer, a bottom surface of the opening being disposed between a top surface and a bottom surface of the etch stop layer. The method also includes etching through the etch stop layer to extend the opening and expose the first conductive feature, the first conductive feature being exposed in a vacuum environment. The method also includes forming a second conductive feature in the opening. In an embodiment the etch stop layer comprises a bottom layer and an upper layer, the bottom surface of the opening being disposed in the bottom layer of the etch stop layer after the opening is formed. In an embodiment the bottom layer comprises aluminum nitride. In an embodiment forming the second conductive feature comprises: forming a barrier layer in the vacuum environment; forming a seed layer over the barrier layer in the vacuum environment; forming conductive material over the seed layer; and planarizing a top surface of the conductive material. In an embodiment, after the forming of the opening in the dielectric layer, a distance from the bottom surface of the opening and the bottom surface of the etch stop layer is in a range of about 0.1 Å to about 5 Å. In an embodiment the opening comprises a thicker portion and a thinner portion in a plan view, and the thinner portion extends in the etch stop layer. In an embodiment the first conductive feature comprises copper.

A method of forming a device is provided in accordance with some embodiments. The method includes forming a first etch stop layer over a first conductive feature. The method also includes forming a second etch stop layer over the first etch stop layer. The method also includes forming a dielectric layer over the second etch stop layer. The method also includes forming an opening in the dielectric layer and the second etch stop layer, and partially etching the first etch stop layer to extend the opening, where after the partial etching of the first etch stop layer a portion of the first etch stop layer covers the first conductive feature underlying the opening. The method also includes creating a vacuum environment in the opening, and etching through the portion of the first etch stop layer to extend the opening an expose the first conductive feature through the opening. In an embodiment the method further includes forming a barrier layer in the opening, wherein a process gas that is used to etch through the portion of the first etch stop layer is introduced to the opening concurrently with a precursor that is used to form the barrier layer. In an embodiment the method further includes forming a seed layer over the barrier layer; performing a plasma argon treatment on the seed layer; removing the vacuum environment from the opening; and performing an electroplating process to form conductive material over the seed layer. In an embodiment the portion of the first etch stop layer has a thickness in a range of about 0.1 Å to about 5 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first dielectric layer over a transistor, the transistor comprising a source/drain region and a gate;
   forming a gate contact extending through the first dielectric layer to contact the gate;
   forming a source/drain contact extending through the first dielectric layer to contact the source/drain region;
   depositing an etch stop layer over the first dielectric layer;
   forming a second dielectric layer over the etch stop layer;
   performing a first etch to form a first opening in the second dielectric layer and the etch stop layer over the source/drain contact, and to form a second opening in the second dielectric layer and the etch stop layer over the gate contact, wherein the first opening and the second opening extend only partially through the etch stop layer when the first etch terminates;
   creating a vacuum environment in the first opening and the second opening;
   after creating the vacuum environment, performing a second etch to extend the first opening to expose the source/drain contact, and to extend the second opening to expose the gate contact; and
   forming a first contact in the first opening and a second contact in the second opening.

2. The method according to claim 1, wherein the etch stop layer comprises a top layer and a bottom layer, and wherein the first opening and the second opening extend through the top layer and only partially through the bottom layer when the first etch terminates.

3. The method according to claim 1, wherein after the first etch terminates, a first remaining portion of the etch stop layer covers the source/drain contact and a second remaining portion of the etch stop layer covers the gate contact.

4. The method according to claim 3, wherein after the first etch terminates a thickness of the first remaining portion of the etch stop layer is greater than or equal to 0.1 Å, and less than or equal to 5 Å.

5. The method according to claim 1, wherein forming the first contact in the first opening and the second contact in the second opening comprises:
   depositing a barrier layer over the source/drain contact and the gate contact in the vacuum environment; and
   electroplating a conductive material over the barrier layer in an open air environment.

6. The method according to claim 5, wherein forming the first contact in the first opening and the second contact in the second opening further comprises:
   depositing a seed layer over the barrier layer in the vacuum environment.

7. The method according to claim 6, wherein forming the first contact in the first opening and the second contact in the second opening further comprises:
   performing a plasma argon treatment on the seed layer before the seed layer is removed from the vacuum environment.

8. The method according to claim 1, wherein the second etch is performed using a process gas, and the process gas comprises carbon and fluorine.

9. The method according to claim 1, wherein a pressure of the vacuum environment is less than 40 mTorr.

10. A method, comprising:
    depositing a dielectric layer over an etch stop layer;
    patterning the dielectric layer and the etch stop layer to form a trench and a via opening, wherein after the via opening is formed the via opening extends only partly through the etch stop layer;
    creating a vacuum environment in the via opening;
    etching the etch stop layer in the vacuum environment to extend the via opening and expose a contact; and
    filling the trench and the via opening with a conductive material, to form a conductive feature.

11. The method according to claim 10, wherein filling the trench and the via opening with the conductive material comprises:
    depositing a seed layer in the trench and the via opening; and
    electroplating a metal material over the seed layer.

12. The method according to claim 11, wherein filling the trench and the via opening with the conductive material further comprises:
    performing a plasma argon treatment on the seed layer before exposing the seed layer to an ambient air environment.

13. The method according to claim 10, wherein filling the trench and the via opening with the conductive material comprises overfilling the trench with the conductive material, and the method further comprises:
    planarizing the conductive material to expose the dielectric layer.

14. The method according to claim 10, wherein the etch stop layer comprises a plurality of etch stop layers, and after the via opening is formed the via opening extends completely through at least one of the plurality of etch stop layers.

15. A method, comprising:
    depositing a first dielectric layer over a transistor;
    forming a first contact extending through the first dielectric layer to contact the transistor;
    depositing a plurality of etch stop layers over the first dielectric layer;
    depositing a second dielectric layer over the plurality of etch stop layers;
    patterning the second dielectric layer and the plurality of etch stop layers to form an opening, the opening extending through the second dielectric layer and partially extending through the plurality of etch stop layers;
    expanding the opening to expose the first contact to a vacuum environment; and
    forming a conductive feature in the opening.

16. The method according to claim 15, wherein after the opening is formed and before the opening is expanded, a remaining portion of the plurality of etch stop layers covers the first contact, and a thickness of the remaining portion of the plurality of etch stop layers that covers the contact is in a range of 0.1 Å, to 5 Å.

17. The method according to claim 15, wherein patterning the second dielectric layer and the plurality of etch stop layers to form the opening comprises:
    patterning the second dielectric layer and the plurality of etch stop layers to form a trench and a via opening.

18. The method according to claim 15, wherein expanding the opening to expose the first contact in the vacuum environment comprises:
  performing an etch using a process gas to expose the first contact to the vacuum environment, the process gas comprising carbon and fluorine.

19. The method according to claim 15, wherein forming the conductive feature comprises:
  depositing a barrier layer lining the opening; and
  depositing a seed layer lining the barrier layer.

20. The method according to claim 19, wherein forming the conductive feature further comprises:
  exposing the seed layer to an ambient air environment; and
  filling a remaining portion of the opening with a metal-containing material.

\* \* \* \* \*